United States Patent [19]

Niino et al.

[11] Patent Number: 5,514,217
[45] Date of Patent: May 7, 1996

[54] MICROWAVE PLASMA CVD APPARATUS WITH A DEPOSITION CHAMBER HAVING A CIRCUMFERENTIAL WALL COMPRISING A CURVED MOVING SUBSTRATE WEB AND A MICROWAVE APPLICATOR MEANS HAVING A SPECIFIC DIELECTRIC MEMBER ON THE EXTERIOR THEREOF

[75] Inventors: Hiroaki Niino; Tetsuya Takei, both of Nagahama; Masahiro Kanai, Hikone; Ryuji Okamura, Shiga, all of Japan

[73] Assignee: Canon Kabushiki Kaisha, Tokyo, Japan

[21] Appl. No.: 261,655

[22] Filed: Jun. 7, 1994

Related U.S. Application Data

[63] Continuation of Ser. No. 115,268, Sep. 2, 1993, abandoned, which is a continuation of Ser. No. 999,543, Dec. 31, 1992, abandoned, which is a continuation of Ser. No. 792,925, Nov. 15, 1991, abandoned.

[30] Foreign Application Priority Data

Nov. 16, 1990 [JP] Japan ................................ 2-308797

[51] Int. Cl.$^6$ ............................................. C23C 16/00
[52] U.S. Cl. .................... 118/723 NW; 118/718; 118/719; 118/723 MA; 118/723 ME
[58] Field of Search ..................................... 118/718, 719, 118/723 MW, 723 ME, 723 MR, 723 MA, 723 AN, 725, 729

[56] References Cited

U.S. PATENT DOCUMENTS 3,814,983  6/1974  Weissfloch et al. ........................ 315/39

(List continued on next page.)

FOREIGN PATENT DOCUMENTS 55-141729  11/1980  Japan .
57-133636  8/1982  Japan .
61-288074  12/1986  Japan .
64-270  1/1989  Japan .......................... 118/723 MW
2-175878  7/1990  Japan .

OTHER PUBLICATIONS

"The performance of a microwave ion source immersed in a multicusp static magnetic field" by M. Dahimene et al.; Journal of Vaccum Science & Technology Second Series, vol. 4, No. 1 Jan./Feb. 1986 pp. 126–130.

"Low temperature oxidation of silicon using a microwave plasma disk source" by T. Roppel et al.; Journal of Vacuum Science & Technology; Second Series, vol. 4, No. 1 Jan./Feb. 1986 pp. 295–298.

*Primary Examiner*—R. Bruce Breneman
*Assistant Examiner*—Joni Y. Chang
*Attorney, Agent, or Firm*—Fitzpatrick, Cella, Harper & Scinto

[57] ABSTRACT

An apparatus for continuously forming a functional deposited film on a continuously moving web member by microwave plasma CVD process, said apparatus comprises: a substantially enclosed columnar film-forming chamber having a curved circumferential wall formed by curving and projecting said web member as said web member is moving in the longitudinal direction by curved portion-forming means, said film-forming chamber having a film-forming space defined by a curved moving web member constituting said circumferential in which plasma is generated; at least a microwave applicator means capable of radiating a microwave energy in the direction of microwave to propagate, said microwave applicator means being mounted to said film forming chamber through one of the two side faces thereof such that part of said microwave applicator means is plunged into said film-forming space, at least said part of microwave applicator means having a dielectric exterior constituted by a dielectric material having a value of $2 \times 10^{-2}$ or less in the product of the dielectric constant ($\epsilon$) and the dielectric dissipation factor (tan $\delta$) with respect to the frequency of microwave used; means for evacuating said film-forming chamber; means for introducing a film-forming raw material gas into said film-forming chamber; and a temperature controlling means.

30 Claims, 14 Drawing Sheets

U.S. PATENT DOCUMENTS

| | | | |
|---|---|---|---|
| 4,265,932 | 5/1981 | Peters | 118/718 |
| 4,400,409 | 8/1983 | Izu et al. | 427/39 |
| 4,438,723 | 3/1984 | Cannella et al. | 118/718 |
| 4,504,518 | 3/1985 | Ovshinsky et al. | 427/38 |
| 4,517,223 | 5/1985 | Ovshinsky et al. | 427/39 |
| 4,521,717 | 6/1985 | Kieser | 315/39 |
| 4,619,729 | 10/1986 | Johncock et al. | 156/606 |
| 4,729,341 | 3/1988 | Fournier et al. | 118/723 |
| 4,785,763 | 11/1988 | Saitoh | 118/715 |
| 4,909,184 | 3/1990 | Fujiyama | 118/723 |
| 4,913,928 | 4/1990 | Sugita et al. | 118/723 MW X |
| 4,931,756 | 6/1990 | Doehler et al. | 118/723 MW X |
| 4,995,341 | 2/1991 | Matsuyama | 118/723 |
| 5,074,985 | 12/1991 | Tamura et al. | 118/723 MW X |
| 5,114,770 | 5/1992 | Echizen et al. | 427/45.1 X |

MICROWAVE PLASMA CVD APPARATUS WITH A DEPOSITION CHAMBER HAVING A CIRCUMFERENTIAL WALL COMPRISING A CURVED MOVING SUBSTRATE WEB AND A MICROWAVE APPLICATOR MEANS HAVING A SPECIFIC DIELECTRIC MEMBER ON THE EXTERIOR THEREOF

This application is a continuation of application Ser. No. 08/115,268, filed Sep. 2, 1993, now abandoned, which is a continuation of application Ser. No. 07/999,543, filed Dec. 31, 1992, abandoned which is a continuation of 07/792,925 filed Nov. 15, 1991, abandoned.

BACKGROUND OF THE INVENTION

1. Field of the Invention

The present invention relates to an improved microwave plasma CVD apparatus for continuously forming a functional deposited film on a large area and lengthy substrate web by sustaining a substantially uniform plasma in a film-forming space circumscribed by said substrate web to cause plasma reactions by which a film-forming raw material gas is excited and decomposed. More particularly, the present invention relates to a microwave plasma CVD apparatus provided with a substantially enclosed film-forming chamber having a film-forming space in which plasma is generated to cause film formation, the circumferential wall of said film-forming chamber comprising a curved moving substrate web on the inner face of which a film is to be formed, said film-forming chamber being provided with a microwave applicator means capable of radiating a microwave energy in the direction parallel to the direction of microwave to propagate such that part of said microwave applicator means is situated in said film-forming space, at least said part of the microwave applicator means being constituted by a specific two layered member comprising a metal member and a dielectric member being laminated in this order from the side of the inside of the microwave applicator means in which said dielectric member comprises a specific material member having a value of 2×10 or less in the product of the dielectric constant ($\epsilon$) and the dielectric dissipation factor ($\tan \delta$) with respect to the frequency of microwave to be used.

2. Related Background Art

Along with marked power generation in order to meet an increased demand for sufficient power supply in the recent years, problems of environmental pollution have become serious in the world.

In fact, for the atomic power generation system which has been anticipated as a power generation system capable of replacing the steam-power generation system and which has been operated in some places of the world, there were happenings that the systems were broken down to cause radioactive contamination on living things including human. Because of this, there is a fear for further development of the atomic power generation system. And there are some countries that already prohibited to newly establish an atomic power plant.

Now, in the case of the steam-power generation, the amount of a fossil fuel represented by coal or petroleum to be consumed for power generation in order to comply with a societal demand for increased power supply has been continuously increased and along with this, the amount of exhaust fumes from the steam-power generation plants has been continuously increased accordingly to raise the content of gases to cause a so-called greenhouse effect such as $CO_2$ build-up in the air. This results in providing an earth-warming phenomenon. In fact, the annual average temperature of the earth has been heightened in the recent years. In order to prevent said earth-warming phenomenon from further developing, the International Energy Agency has proposed to reduce the amount of carbon dioxide to be exhausted from the steam-power generation plant as much as 20% of the current level by the year of 2005.

Against this background, there is a situation that the populations of the developing countries will continue increasing and along with this, a demand for power supply will be more increased. In addition to this, it is expected that the manners of living in the developed countries will be further modernized with further developments in electronic instruments and along with this, the amount of power consumption per person will be eventually increased.

In view of the above, the matter of power supply is now the subject to be internationally discussed in terms of the earth.

Under this situation, the public attention has now focused on and various studies have been made on the power generation system using a solar cell since it has various advantages that: it is a clean power generation system which is free of the foregoing problems relating to the radioactive contamination, earth-warming and environmental pollution; the sunlight to be used as its energy source reaches everywhere of the earth and there is not a problem for the energy source to be localized; and the power generation equipment can be simplified and a relatively high power generation efficiency can be attained.

Now, in order for the solar cell power generation system to be made such that can supply a power in a quantity to satisfy the societal demand, it is basically required that the solar cell to be used can provide a sufficiently high photoelectric conversion efficiency; it can stably exhibit the solar cell characteristics; and it can be mass-produced.

In order to provide the average family with the power to be consumed, a solar cell capable of outputting a power of about 3 KW is necessary. In this case, the photoelectric conversion efficiency of the solar cell should be about 10%. The solar cell is required to have an area of about 30 $m^2$ in order to provide said power. And in the case where it is intended to satisfy the demands for power supply by 100,000 families, the solar cell is required to have an area of 3,000,000 $m^2$.

In view of this, the public attention has been focused on an amorphous silicon solar cell which is prepared by depositing a semiconductor film such as an amorphous silicon semiconductor film on a relatively inexpensive substrate such as glass or metal sheet wherein glow discharge is caused in a film-forming raw material gas such as silane gas, in the viewpoint that it can be mass-produced and it can be provided at a lower cost in comparison with a single crystal silicon solar cell. And various proposals have been made on such amorphous silicon solar cell.

In the case of the power generation system using a solar cell, there is usually employed such a system in which a plurality of unit modules are connected in series or in a row to be a unit from which a desired current or voltage can be obtained. For each of said plurality of modules, it is required that neither disconnection nor short circuit are occurred. It is further required that each of said plurality modules stably outputs an even current or voltage. In order to satisfy these requirements, each unit module is necessary to be prepared such that its constituent semiconductor layer as a most important element be ensured so as to stably exhibit uniform characteristics required therefor.

Further, in the viewpoint of making it easy to design the module and also in the view point of simplifying the process for assembling a plurality of unit modules to an integrated unit, it is essential to provide a large area semiconductor film having a uniformity not only in the thickness but also in the quality and capable of exhibiting uniform semiconductor characteristics- These lead to enabling the mass-production of a solar cell and to extreme reduction in the production cost.

Now, with respect to the solar cell, its constituent semiconductor layers, which are basically important constituent elements thereof, are conjugated to form semiconductor junctions such as pn junction or pin junction. These semiconductor junctions can be attained by stacking different semiconductor layers respectively having a different conduction type one from another, or by ion-implanting or thermally diffusing a dopant of a different conduction type into one of the constituent semiconductor layers of the same conduction type.

This situation will be more detailed in the case of the foregoing amorphous silicon solar cell. It is known that glow discharge is cased in a gas mixture composed of a film-forming raw material gas such as silane gas ($SiH_4$) and a raw material gas capable of supplying an element to be a dopant such as phosphine ($PH_3$) or diborane ($B_2H_6$) to form a semiconductor film having a desired conduction type. When a plurality of semiconductor films respectively having a different conduction type are formed successively on a substrate in this manner, these semiconductor films are conjugated to form desired semiconductor junctions. In view of this, there have been made various proposals that respective constituent semiconductor layers are separately formed in the respective independent film-forming chambers to stack them on a substrate to form a desired semiconductor junction between the each pair of the semiconductor layers stacked, whereby obtaining an amorphous silicon solar cell.

For instance, U.S. Pat. No. 4,400,409 discloses a continuous plasma CVD apparatus wherein the so-called roll-to-roll system is employed. The continuous plasma CVD apparatus comprises a plurality of RF glow discharge regions through each of which regions a substrate web on which a film is to be formed is moved. This patent literature describes that said apparatus makes it possible to prepare an element having one or more semiconductor junctions by forming a semiconductor film of a desired conduction type on said substrate web in each of said plurality of RF glow discharge regions while moving said substrate web. This patent literature also describes that a gas gate is provided between the adjacent glow discharge regions in order to prevent a raw material gas to be used in one glow discharge region from entering into other glow discharge region. In more detail in this respect, said plurality of glow discharge regions are isolated one from the other by an isolation passage way provided with means for forming a cleaning gas stream of Ar, $H_2$, etc. It can be said that this roll-to-roll plasma CVD apparatus will be suitable for mass-production of a semiconductor device. However, this roll-to-roll plasma CVD apparatus is problematic in the case of mass-producing a semiconductor device with a plurality of semiconductor junctions that since each of the constituent semiconductor layers is formed by the plasma CVD method using a RF energy, there is a limit for continuously forming those constituent semiconductor layers at a high deposition rate while maintaining the characteristics desired for each of those constituent semiconductor layers. That is, even in the case of forming a thin semiconductor layer of, for example, about 5000 Å in thickness, it is necessary to always sustain a substantially uniform plasma over a large area. However in this roll-to-roll plasma CVD apparatus, there are many corelated film-forming parameters which are difficult to be generalized, and well-skilled technics are required to do so. In addition to this, there are still other unsolved problems for the roll-to-roll plasma CVD apparatus that the decomposition rate and the utilization efficiency of a film-forming raw material gas are not sufficient and thus the product becomes unavoidably costly.

Japanese Unexamined Patent Publication Sho. 61(1986)-288074 discloses a roll-to-roll film-forming apparatus comprising a reaction chamber containing a folding top-like slackened portion of a flexible substrate web which is delivered by a pay-out mechanism and taken up by a take-up mechanism, said reaction chamber having a reaction space circumscribed by said folding top-like slackened portion, and said reaction chamber being provided with at least an activation chamber isolated from the reaction chamber. The film formation by this apparatus is carried out by introducing active species formed in said activation chamber and if necessary, other film-forming raw material gas into said reaction space, wherein they are chemically reacted with the action of heat energy to form a deposited film on the inner surface of said folding top-like slackened portion positioned in said reaction chamber. This roll-to-roll film-forming apparatus is advantageous in the viewpoints that the apparatus can be relatively compact and the deposition rate of a film to be formed may be improved because of using an active species in comparison with the known plasma CVD apparatus.

The film formation by this roll-to-roll film-forming apparatus is to utilize a chemical reaction to cause film formation with the aid of heat energy. Therefore, when the film deposition rate is desired to be heightened, it is necessary to increase not only the flow rate of an active species to be introduced into the reaction space but also the quantity of heat energy to be supplied thereinto. However, it is extremely difficult to do so since there is a limit not only for the manners of generating a large amount of the active species in the activation chamber and sufficiently introducing the active species into the reaction space at a high flow rate without leakage but also for uniformly supplying a large quantity of heat energy into the reaction space.

In the recent years, a plasma CVD method using microwave glow discharge decomposition, namely, a microwave plasma CVD method (which will be hereinafter referred to as "MW-PCVD method") has been noticed on the industrial scale since the MW-PCVD method has various advantages, which are hardly attained by the RF glow discharge decomposition method, that it is possible to heighten the energy density, to effectively generate plasma and to maintain the plasma in a desired state.

For instance, U.S. Pat. Nos. 4,504,518 and 4,517,223 describe processes for forming deposited thin films on small area substrates in a microwave glow discharge plasma under a low pressure condition. These two patent literatures describe that because the processes are conducted under the low pressure condition, any of these processes makes it possible to obtain a high quality deposited film at a remarkably high deposition rate while eliminating not only polymerization of active species which gives negative effects to the characteristics of a film to be formed but also formation of powdery materials such as polysilane in the plasma. However, any of these two patent literatures does not mention anything about uniform deposition of a film over large area.

U.S. Pat. No. 4,729,341 discloses a low pressure microwave plasma CVD method and an apparatus suitable for practicing the same, wherein a photoconductive semiconductor thin film is deposited on a large area cylindrical substrate using a pair of radiative waveguide applicators in a high power process. However, the principles of large area film deposition are limited to cylindrical substrates for electrophotographic photoreceptors, and the teachings described therein are not directly transferable to planar substrates of large area. Further, the film-forming process is to be practiced in a batch system and the amount of film products obtained by one batch is limited. This patent literature does not teach anything about continuous film deposition on a large area planar substrate.

Now, there are still left various problems to be solved for large area film deposition by the MW-PCVD method because non-uniformity of a microwave energy is apt to occur in plasma due to the wavelength of a microwave being short. For instance in this respect, there is an attempt to use a slow microwave structure in order to provide uniformity of the microwave energy. However, there is an inherent problem in the slow microwave structure that is the very rapid fall off of microwave coupling into the plasma as a function of distance transverse to the microwave applicator. In order to solve this problem, there has been made a proposal that the spacing of the slow microwave structure from a substrate to be processed is varied to thereby make the energy density at the surface of the substrate uniform along the direction of movement of the substrate. For instance, such proposal can be found in U.S. Pat. No. 3,814,983 or U.S. Pat. No. 4,521,717.

Particularly, the former patent literature discloses that it is necessary to incline the slow wave structure at a certain angle with respect to the substrate. However, inclination Of the slow wave structure reversely leads to an insufficient coupling of a microwave energy into the plasma.

The latter patent literature discloses the use of two slow wave structures in an anti-parallel arrangement but in parallel to the substrate. More particularly, the latter patent literature discloses: it is desired to set the two slow wave applicators at an angle to each other such that the planes normal to the medians of the applicators intersect at a straight line which extends parallel to the surfaces of the substrate to be processed and at right angles to the travel direction of the substrate; and, in order to avoid structive interference between the two slow wave applicators, it is desired to displace the two slow wave applicators from each other traversly of the travel direction of the substrate by a distance equal to half of the space between the cross-bars of the waveguide.

There have been made several proposals in order to provide plasma uniformity and more particularly, energy uniformity as found, for example, in J. Vac. Sci. Tech. B-4 (January–February 1986) PP. 126–130 and PP. 295–298. These reports describe a microwave reactor called a microwave plasma disc source (MPDS) and that the plasma is in the shape of a disc or tablet, with a diameter that is a function of microwave frequency. These reports also describe that: the plasma disc source can be varied with the frequency of microwave; however, in the case of a microwave plasma disc source which is designed for operation at the normal microwave frequency of 2.45 GHz, the plasma confined diameter is about 10 centimeters at the most and the plasma volume is about 118 $cm^3$ at the most, thus this is far from a large surface area; in the case of a system designed for operation at the lower frequency of 915 MHz, the lower frequency source would provide a plasma diameter of approximately 40 cm with a plasma volume of 2000 $cm^3$; and the microwave plasma disc source can be scaled up to discharge diameters in excess of 1 m by operating at still lower frequencies, for example 400 MHz, however extreme expenses are required to establish such an apparatus which can perform this.

In order to effectively provide high density plasma using microwave, there have been proposed manners to establish the electron cyclotron resonance condition (namely, the ECR condition) by arranging electro-magnets around the cavity resonator as found in Japanese Unexamined Patent Publications Sho. 55(1980)-141729 and Sho. 57(1982)-133636. And at academic meetings, etc., there have been reported methods of forming various semiconductor thin films by utilizing high density plasma and some microwave ECR plasma CVD apparatus capable of performing such methods have been commercialized.

However, it has been generally recognized in the technical field to which the invention pertains that it is technically difficult to form a deposited film uniformly over a large area substrate because of non-uniformity of plasma caused by the wavelength of microwave and also because of non-uniformity of magnetic field distribution due to the use of the magnets for the control of plasma. In the case where the microwave ECR plasma CVD apparatus is intended to scale up so that film deposition over a large area can be done, there are such various problems to be solved beforehand that electro-magnets to be used are necessary to be also scaled up; means for preventing the apparatus from overheating is necessary to be provided; a special DC high power regulated supply is necessary to be provided; and the like.

Further, the deposited film obtained by the known microwave ECR plasma CVD method is usually inferior to the deposited film obtained by the known RF plasma CVD method with respect to the film property. Further in addition, in the case of forming a deposited film on a substrate by the microwave ECR plasma CVD method, there is a distinguishable difference with respect to the film deposition rate and the film property between the film formed in the space where the ECR condition is established and the film formed in the space where the ECR condition is not established, in the dispersed magnetic field space in other words. In view of this, the microwave ECR plasma CVD method is not suitable for the preparation of such a semiconductor device that is required to be excelling in quality and in uniformity with respect to the characteristics to be provided.

The foregoing U.S. Pat. Nos. 4,517,223 and 4,729,341 describe the necessity of maintaining very low pressures in order to provide high density plasmas. That is, they describe that the use of low pressures is necessary in order to obtain high film deposition rate and/or high gas utilization efficiency.

However, any of the foregoing slow wave structure and electron cyclotron resonance method is not sufficient in order to maintain the relationships among high film deposition rate, high gas utilization efficiency, high power density and low pressure.

In view of what above described, there is an increased demand for eliminating the foregoing problems of the know microwave plasma CVD method and providing an improved microwave plasma CVD process which is free of such problems.

There is also other demand for providing a large area or lengthy thin semiconductor film excelling in quality and uniformity of characteristics which is desirably usable not only in solar cells but also in semiconductor devices such as

SUMMARY OF THE INVENTION

The principal object of the present invention is to make an improvement in the microwave plasma CVD apparatus of U.S. patent application Ser. No. 07/481,690, which has been developed by two of the coinventors of the present invention Masahiro KANAI and Tetsuya TAKEI jointly with other persons.

Other object of the present invention is to eliminate the foregoing problems of the known microwave plasma CVD apparatus and to provide an improved microwave plasma CVD apparatus which enables to continuously deposit a semiconductor film uniformly over a large area substrate at a high deposition rate and which satisfies the foregoing demands.

A further object of the present invention is to provide an improved microwave plasma CVD apparatus which enables one to continuously deposit a high quality semiconductor film on a large area substrate web.

A further object of the present invention is to provide an improved microwave plasma CVD apparatus which enables one to mass-produce a thin film semiconductor device with a high gas utilization efficiency and at a reduced cost.

A further object of the present invention is to provide an improved microwave plasma CVD apparatus which enables one to provide uniform microwave plasma over a large area and volume and to continuously form a high quality large area semiconductor film having an uniform thickness, which stably exhibits the characteristics as desired and is usable in various semiconductor devices.

A further object of the present invention is to provide an improved microwave plasma CVD apparatus which enables one to continuously and stably form a photovoltaic element on a lengthy substrate of relatively large width which provides a high photoelectric conversion efficiency with a high yield.

A further object of the present invention is to provide an improved microwave plasma apparatus which enables one to stably and repeatedly maintain the potential of microwave plasma to be formed over a large area and volume in an uniform state.

The typical embodiment of the microwave plasma CVD apparatus according to U.S. patent application Ser. No. 07/481,690 (hereinafter referred to as "the antecedent MW-PCVD apparatus") comprises a substantially enclosed columnar film-forming chamber having a film-forming space in which plasma is generated to cause film formation, said columnar film-forming chamber having a curved circumferential wall to define said film-forming space, said curved circumferential wall being formed by curving and projecting a substrate web which is delivered by a pay-out mechanism and is moving in the longitudinal direction toward a take-up mechanism as said substrate web is moving toward said take-up mechanism by a pair of rollers for curving said substrate web while supporting said substrate web; a microwave applicator means capable of radiating a microwave energy into said film-forming chamber in the direction parallel to the direction of microwave to propagate, said microwave applicator means being mounted to said columnar film-forming chamber through one of the two side faces of the columnar film-forming chamber such that the end face of said microwave applicator means situated to face to said film-forming space and the inner wall face of the side face form an identical face; means for evacuating the inside of said film-forming chamber; and means for supplying a film-forming raw material gas into said film-forming chamber.

In other embodiment of the antecedent MW-PCVD apparatus, the above microwave applicator means is mounted to the columnar film-forming chamber through one of the two side faces thereof such that it is plunged into the film-forming space.

In a further embodiment of the antecedent MW-PCVD apparatus, any of the apparatus in the above two embodiments further comprises a bias voltage applying means capable of controlling the potential of the plasma generated in the film-forming space.

Any of the antecedent MW-PCVD apparatus above embodied makes it possible to eliminate the foregoing problems found in the known microwave plasma CVD and to effectively and stably produce plasma causing film formation while confining said plasma within the columnar film-forming chamber the circumferential wall of which comprising a curved moving substrate web, on the inner face of which a film is to be formed, whereby a functional deposited film is continuously formed on the moving substrate web at a high deposition rate and with a high raw material utilization efficiency.

In order to improve the antecedent MW-CVD apparatus, the present inventors have made extensive studies thereon. As a result, it was found that there are some disadvantages required to be solved. That is, in the case of forming a relatively thick deposited film on the inner face of a curved moving substrate web constituting the circumferential wall of the columnar film-forming chamber continuously for a long period of time, it sometimes becomes difficult to generate plasma in a desirable state in the antecedent MW-PCVD apparatus firstly embodied in the above, and in that case, a desirable deposited film is hardly formed on the inner face of the circumferential wall of the columnar film-forming chamber. Likewise, in the case of the antecedent MW-PCVD apparatus secondly embodied in the above, although generation of plasma is desirably occurred at the beginning stage, the efficiency of generating plasma gradually reduces as the film-forming process proceeds. In addition to this, there is also another disadvantage in this case that the exterior of the microwave applicator means, which is situated in the film-forming space, is markedly deposited with a film, and the stress of said film has a tendency of being gradually increased along the time elapsing to occur heat distribution in said film, resulting in causing removal of said film from the microwave applicator means, wherein such film removed scatters to contaminate into a film deposited on the substrate web.

Thus, the present invention is aimed at improving the antecedent MW-PCVD apparatus to be free of those disadvantages as above mentioned.

The main feature of the present invention lies in an improvement in the microwave applicator means of the antecedent MW-PCVD apparatus which makes the apparatus to be free of the above disadvatages.

The present invention is to provide an improved microwave plasma CVD apparatus (this microwave plasma CVD apparatus will be hereinafter referred to as "MW-PCVD apparatus") which attains the foregoing objects.

A typical embodiment of the MW-PCVD apparatus according to the present invention comprises:

a substantially enclosed columnar film-forming chamber having a film-forming space, said columnar film-forming chamber having a curved circumferential wall to define said film-forming space, said curved circumferential wall being formed by curving and projecting a substrate web which is delivered by a pay-out mechanism and is moving in the longitudinal direction toward a take-up mechanism as said substrate web is moving toward said take-up mechanism by a pair of means for curving said substrate web while supporting said substrate web;

a microwave applicator means capable of radiating a microwave energy into said film-forming chamber in the direction parallel to the direction of microwave to propagate, said microwave applicator means being disposed such that part of said microwave applicator means is situated in said film-forming space, at least said part being constituted by a two layered member comprising a metal member and a dielectric member being laminated in this order from the side of said film-forming space in which said dielectric member comprises a specific member having a value of $2 \times 10^{-2}$ or less in the product of the dielectric constant ($\epsilon$) and the dielectric dissipation factor (tan $\delta$) with respect to the frequency of microwave to be used;

means for evacuating the inside of said film-forming chamber, and means for supplying a film-forming raw material gas into said film-forming chamber.

Other embodiment of the MW-PCVD apparatus according to the present invention comprises:

a substantially enclosed columnar film-forming chamber having a film-forming space, said columnar film-forming chamber having a curved circumferential wall to define said film-forming space, said curved circumferential wall being formed by curving and projecting a substrate web which is delivered by a pay-out mechanism and is moving in the longitudinal direction toward a take-up mechanism as said substrate web is moving toward said take-up mechanism by a pair of means for curving said substrate web while supporting said substrate web;

a microwave applicator means capable of radiating a microwave energy into said film-forming chamber in the direction parallel to the direction of microwave to propagate, said microwave applicator means being disposed such that part of said microwave applicator means is situated in said film-forming space, at least said part being constituted by a two layered member comprising a metal member and a dielectric member being laminated in this order from the side of said film-forming space in which said dielectric member comprises a specific member having a value of $2 \times 10$ or less in the product of the dielectric constant ($\epsilon$) and the dielectric dissipation factor (tan $\delta$) with respect to the frequency of microwave to be used;

a bias voltage applying means capable of controlling the potential of said plasma;

means for evacuating the inside of said film-forming chamber, and means for supplying a film-forming raw material gas into said film-forming chamber.

The MW-PCVD apparatus of the present invention makes it possible to continuously form a large area functional deposited film of uniform thickness with a markedly improved gas utilization efficiency of a film-forming raw material gas and at a high deposition rate while ensuring stable introduction of a microwave energy into the film-forming space and sustaining substantially uniform plasma in the film-forming space and without causing removal of a film deposited on the microwave applicator means which results in contaminating the film to be formed on the inner face of the circumferential wall of the film forming chamber comprising the curved moving substrate web with foreign matters.

The MW-PCVD apparatus of the present invention thus makes it possible to mass-produce high quality large area thin film semiconductor devices such as photovoltaic devices at a reduced cost.

In the present invention, the substrate on which a film is to be formed comprises a large area and lengthy substrate web, which is delivered by the pay-out mechanism, continuously moving in the longitudinal direction toward the take-up mechanism, and taken up by the take-up mechanism. The substrate web constitutes the circumferential wall of the film-forming chamber.

In the film-forming space of the film-forming chamber, a film-forming raw material gas is supplied therein and a microwave energy is applied therein in the width direction of the circumferential wall comprising the curved moving substrate web and in the direction parallel to the direction of microwave to propagate through the microwave applicator means provided with the foregoing specific dielectric member at the exterior thereof, to thereby constantly generate desirable and uniform plasma, which is sustained and confined within the film-forming space in a desirable state. Thus, a desirable high quality semiconductor film is uniformly and continuously formed on the large area and lengthy substrate web without being contaminated with foreign matters.

Further, in the MW-PCVD apparatus of the present invention, plasma is stably and constantly generated in a uniform state, and the plasma generated is confined and sustained in a stable state within the film-forming space. Because of this, the gas utilization efficiency is markedly heightened.

According to the present invention, it is possible to uniformly and continuously form a high quality functional deposited film, which is free of contamination of foreign matters and has a thickness as desired over a large area, by varying the shape of the curved columnar portion comprising the moving substrate web to be the circumferential wall of the film-forming chamber or the length of the curved columnar portion or the moving speed of the substrate web.

According to the present invention, it is also possible to continuously form a desirable high quality functional deposited film, which is free of contamination of foreign matters, has an uniform thickness and stably exhibits the characteristics desired therefor, on a large area and lengthy substrate web. Thus, it is possible to mass-produce a high quality large area solar cell at a reduced cost.

In addition, according to the present invention, as a high quality functional deposited film can be continuously formed without suspending discharge, it is possible to mass-produce a high quality multi-layered semiconductor device excelling in interface characteristics.

Further in addition, according to the present invention, film formation can be achieved under a low pressure condition while not only eliminating powder and polymeric formations in the plasma but also preventing a film deposited on the microwave applicator means from being removed therefrom. Thus, both remarkable reduction in defects and extreme improvements in the film property and in the stability thereof can be attained for a functional deposited film to be obtained.

Further, the rate of operation and the yield are hightened and as a result, it is possible to mass-produce an inexpensive high quality solar cell having a high photoelectric conversion efficiency.

DETAILED DESCRIPTION OF THE INVENTION

Figure 1:
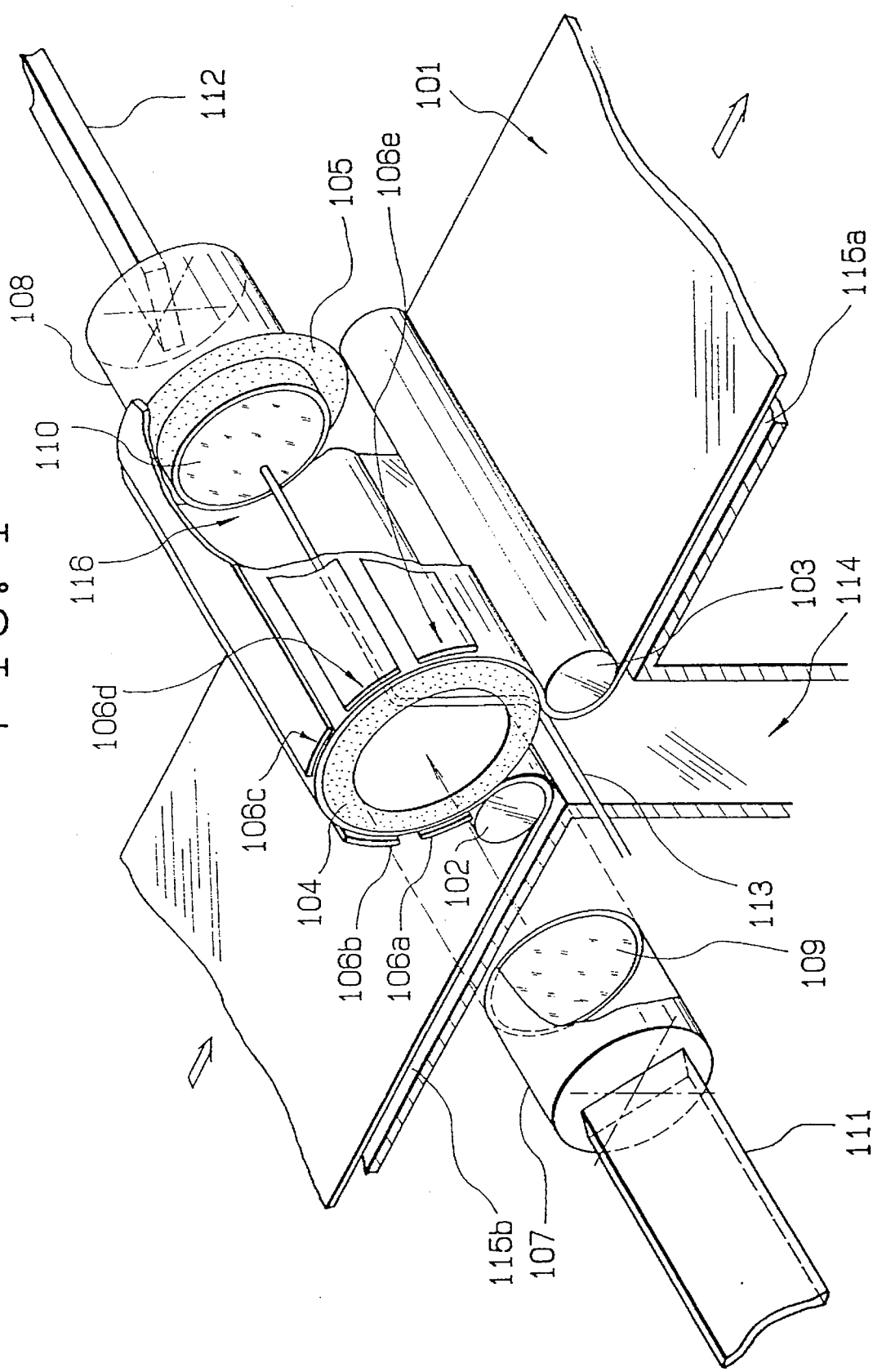
FIG. 1 is a schematic diagram illustrating the constitution of a typical embodiment of the MW-PCVD apparatus according to the present invention.

The present inventors have made earnest studies through experiments aiming at improving the antecedent MW-PCVD apparatus to be a more desirable one which is free not only of the foregoing various problems found in the known MW-PCVD apparatus but also of the foregoing disdvantages found in the antecedent MW-PCVD apparatus and which effectively attains the objects of the present invention.

Firstly, the present inventors made studies of the case of continuously forming a stacked type photovoltaic element such as a tandem type photovoltaic element or a triple cell type photovoltaic element capable of effectively absorbing sunlight having spectra in wide range to perform photoelectric conversion. As a result, it was found that the photovoltaic characteristics of the stacked type photovoltaic element depend upon its constituent semiconductor layer which is the most poor in the film property among the constituent semiconductor layers of the upper and lower cells. Particularly, in the case of a large area and lengthy stacked type photovoltaic element formed on a lengthy substrate web, when the constituent semiconductor layers of the upper and lower cells are made to be uneven and vary in the characteristics and/or thickness in the width direction or the lengthwise direction of the substrate web, the stacked type photovoltaic element becomes such that is poor in the uniformity of the photovoltaic characteristics, especially of the spectral sensitivity, in the inplane direction and is accompanied by one or more portions which are poor in the photovoltaic characteristics. And as for such stacked type photovoltaic element accompanied by such portion as above mentioned, its photovoltaic characteristics, especially, its photoelectric conversion efficiency ($\eta$) depend upon such portion, and because of this, the stacked type photovoltaic element unavoidably becomes such that is poor in the photovoltaic characteristics. Likewise, in the case of a solar cell module comprising a plurality of stacked type photovoltaic elements being integrated in which one or more of the stacked type photovoltaic elements are such as above mentioned, the characteristics of the solar cell module depend upon said one or more stacked type photovoltaic elements which are poor in the photovoltaic characteristics and because of this, the solar cell module becomes insufficient in the characteristics required therefor.

On the basis of these findings, it was recognized that in order to continuously form a functional deposited film on a lengthy substrate web, it is important to maintain the uniformity of the film to be continuously formed in terms of film quality and film thickness both in the width direction and in the lengthwise direction of the lengthy substrate web during the film formation for a long period of time in view of ensuring a desired productivity. Particularly, in the case of preparing the foregoing stacked type photovoltaic element, it is necessary to optimize the film-forming parameters with respect to, for example, the thickness, the optical forbidden band gap Egopt, etc. of each of the constituent semiconductor layers of the lower cell, upper cell and the like so as to make the resulting stacked element to be such that provides a maximum value in each of the properties required therefor such as open circuit voltage (Voc), short-circuit current (Isc), fill factor (FF), photoelectric conversion efficiency ($\eta$), etc. It was also recognized that it is important that each of the constituent semiconductor layers of the constituent cells including the upper and lower cells is uniform in the characteristics in both the width direction and the lengthwise direction of the substrate web.

The present inventors then made investigations of the case of continuously forming a stacked type photovoltaic element using the antecedent MW-PCVD apparatus while taking the above findings into account. As a result, the following facts were found. That is, in the film formation in the antecedent MW-PCVD apparatus firstly embodied in the above in which the microwave applicator means is mounted to the columnar film-forming chamber through one of the two side faces thereof such that the end face (that is, the external face of the microwave transmissive window member) of the microwave applicator means situated to face to the film-forming space and the inner wall face of said side face form an identical face, there are disadvantages that (i) a change in the frequency oscillated from the microwave power source is apt to easily affect to the plasma generated in the film-forming space whereby causing unevenness in the plasma and such unevenness eventually affects to a film formed to make the resulting film to be uneven not only in the thickness distribution but also in the film property; (ii) the thickness of a film deposited on the inner face of the circumferential wall comprising the curved moving substrate web situated near the microwave transmissive window member of the microwave applicator means is apt to become relatively thicker than that of a film deposited on said inner face situated apart from said microwave transmissive window member; (iii) a film is apt to deposit locally on the portion of the side face of the columnar film-forming chamber around the microwave transmissive window member of the microwave applicator means and this is likely to hinder dispersion of the plasma or/and uniformity of the plasma, whereby making the resulting film on the inner face of the circumferential wall comprising the curved moving substrate web to be uneven not only in the thickness distribution but also in the film property; and when the above (i) and (iii) concurrently happen, plasma is hardly to generate.

Likewise, there is a disadvantage also in the film formation in the antecedent MW-PCVD apparatus secondly embodied in the above in which the microwave applicator means is mounted to the columnar film-forming chamber through one of the two side faces thereof such that it is plunged into the film-forming space, the substrate web on which a film is to be formed is kept moving but the plunged portion including the microwave transmissive window member of the microwave applicator means is situated and standing still in the film-forming space, wherein plasma is efficiently generated in a desirable state in the film-forming space at the beginning stage. But the state of the plasma to be generated in the film-forming space becomes uneven gradually as the film-forming process proceeds while continuously causing microwave discharge and it is therefore difficult to keep generating the plasma in a desirable state for a long period of time. Thus, the film formed at the beginning stage is satisfactory in the quality and the thickness distribution, but the film formed thereafter gradually becomes unsatisfactory not only with respect to the film thickness distribution but also with respect to the film property. In addition to this advantage, there is another disadvantage that a film is unavoidably deposited on the exterior of the microwave applicator means situated in the film-forming space; the film thus deposited on the exterior of the microwave applicator means gradually becomes thicken as the film-forming process proceeds; this effects to cause unevenness for the plasma generated in the film-forming space, which follows to influence to the film deposited on the exterior of the microwave applicator to change the stress thereof or to cause heat distribution thereon, wherein said film suffers excessive stress to remove from the microwave applicator means and scatter in fine particles in the film-forming space, wherein those fine particles get into a film deposited on the inner face of the circumferential wall comprising the curved moving substrate web since the microwave applicator means is arranged in proximity to said inner face. The resulting film eventually becomes such that is accompanied by defects which cause pinholes or the like.

The present inventors found that this situation is problematic particularly in the case of preparing the foregoing stacked type photovoltaic element. That is, when the plasma generated in the film-forming space becomes uneven or/and the film deposited on the microwave applicator means is removed to scatter in the film-forming space as above described during the formation of a semiconductor layer of the constituent cells, it is almost impossible to properly control the film-forming parameters as desired for the formation of said semiconductor layer. Because of this, the resulting semiconductor layer unavoidably becomes such that is poor in the film property or/and the uniformity of thickness and thus accompanied with defects, and as a result, the resulting stacked type photovoltaic element becomes to have such defective portion as above described.

The present inventors made repeated studies in order to eliminate the above disadvantages of the antecedent MW-PCVD apparatus. As a result, it was found that the antecedent MW-PCVD apparatus of the constitution secondly embodied in the above, in which the microwave applicator means is mounted to the columnar film-forming chamber through one of the two side faces such that it is plunged into the film-forming space, is the most desirable in view of effectively introducing a microwave energy into the film-forming space to efficiently generate plasma therein in the case where the foregoing disadvantages should be eliminated. Thus, the present inventors investigated the cause of bringing about the foregoing disadvantages in the antecedent MW-PCVD apparatus secondly embodied in the above. As a result, it was found that the cause lies in the constituent material of the exterior surface of the microwave applicator means, since the exterior of the microwave applicator means is comprised of a metal such as stainless steel. In the antecedent MW-PCVD apparatus, any specific care is not made for the exterior of the microwave applicator means to be used but there is used a microwave applicator means having a outer wall to hermetically enclose the microwave applicator body, which is constituted by a known material comprising a metal such as stainless steel in view of protecting the microwave applicator body and securing its mechanical strength.

In order to eliminate the foregoing advantages, there is considered a measure that the state of the plasma generated in the film-forming space or/and the state of the film deposited on the microwave applicator means is periodically examined, and when the above situation occurs, the film-forming process is suspended and the film deposited on the microwave applicator means is removed to thereby clean the microwave applicator means or the microwave applicator means is replaced by a new one. However, this means is disadvantageous since it is required to dispose an additional mechanism for examining the state of the plasma generated in the film-forming space or/and the state of the film deposited on the microwave applicator means in the columnar film-forming chamber having the circumferential wall comprising the curved moving substrate; and in order to dispose such mechanism in the columnar film-forming chamber, the structure of the columnar film-forming chamber should be designed such that the plasma generated in the film-forming space is not hindered by that mechanism. Even if installation of such mechanism is successful, there is a disadvantage that the film-forming process must be be suspended until the cleaning of the microwave applicator means deposited with the film or the replacement of said microwave applicator means by a new one has been completed.

In view of the above, the present inventors made extensive studies through experiments in order to find other appropriate means capable of effectively improving the antecedent MW-PCVD apparatus. In the studies, the present inventors made attention to the behavior of plasma in the vicinity of the microwave applicator means in connection with the exterior material of said microwave applicator means which comes to expose to plasma and is deposited with such film as above described during film formation in the antecedent MW-PCVD apparatus while considering the possibility of eliminating the foregoing disadvantages of the antecedent MW-PCVD apparatus. As a result, there was found a fact that the material by which the exterior of the microwave applicator means is constituted is a factor not only to govern the situation of effectively generating plasma and maintaining the plasma in a stable and uniform state to thereby continuously form a desirable deposited film on the inner face of the circumferential wall comprising the curved moving substrate web but also to govern the state of a film deposited on the exterior of the microwave applicator means. And as a result of repeated experimental studies based on this finding, the present inventors found a fact that when the exterior of the microwave applicator means which is to be exposed to the plasma generated in the film-forming space is constituted by a specific stacked member comprising a dielectric member and a metal member being laminated in this order from the side of the film-forming space in which the dielectric member is comprised of a specific dielectric material member having a value of $2\times10^{-2}$ or less in the product of the dielectric constant ($\epsilon$) and the dielectric dissipation factor (tan $\delta$) with respect to the frequency of microwave to be used, the foregoing disadvantages of the antecedent MW-PCVD apparatus can be effectively eliminated to improve the antecedent MW-PCVD apparatus as desired.

The present invention has been accomplished based on this finding.

Thus, the present invention provides an improved MW-PCVD apparatus. A typical embodiment (hereinafter referred to as "first embodiment") of the MW-PCVD apparatus of the present invention comprises: a substantially enclosed columnar film-forming chamber having a film-forming space in which plasma is generated, said columnar film-forming chamber having a curved circumferential wall to define said film-forming space, said curved circumferential wall being formed by curving and projecting a substrate web which is delivered by a pay-out mechanism and is moving in the longitudinal direction toward a take-up mechanism by a pair of means for curving said substrate web while supporting said substrate web; a microwave applicator means capable of radiating a microwave energy into said film-forming space in the direction parallel to the direction of microwave to propagate, said microwave applicator means being disposed such that part of said microwave applicator means is situated in said film-forming space, at least said part being constituted by a two layered member comprising a dielectric member and a metal member being laminated in this order from the side of said film-forming space, said dielectric member comprising a specific dielectric material member having a value of $2\times10^{-2}$ or less in the product of the dielectric constant ($\epsilon$) and the dielectric dissipation factor (tan $\delta$) with respect to the frequency of microwave to be used; means for evacuating the inside of said film-forming chamber; and means for supplying a film-forming raw material gas into said film-forming space.

The present inventors found a further fact that the effects of the above MW-PCVD apparatus are improved in the case of disposing a bias voltage applying means capable of controlling the potential of the plasma generated in the film forming space therein.

Thus, the MW-PCVD apparatus of the present invention includes another embodiment (hereinafter referred to as "second embodiment") which comprises: a substantially enclosed columnar film-forming chamber having a film-forming space in which plasma is generated, said columnar film-forming chamber having a curved circumferential wall to define said film-forming space, said curved circumferential wall being formed by curving and projecting a substrate web which is delivered by a pay-out mechanism and is moving in the longitudinal direction toward a take-up mechanism by a pair of means for curving said substrate web while supporting said substrate web; a microwave applicator means capable of radiating a microwave energy into said film-forming space in the direction parallel to the direction of microwave to propagate, said microwave applicator means being disposed such that part of said microwave applicator means is situated in said film-forming space, at least said part being constituted by a two layered member comprising a dielectric member and a metal member being laminated in this order from the side of said film-forming space, said dielectric member comprising a specific dielectric material having a value of $2\times10^{-2}$ or less in the product of the dielectric constant ($\epsilon$) and the dielectric dissipation factor (tan $\delta$) with respect to the frequency of microwave to be used; a bias voltage applying means capable of controlling the potential of said plasma generated in said film-forming space; means for evacuating the inside of said film-forming chamber; and means for supplying a film-forming raw material gas into said film-forming space.

In any of the first and second embodiments of the present invention, the foregoing specific dielectric member typically comprises ceramics containing alumina as the main constituent.

Figure 2:
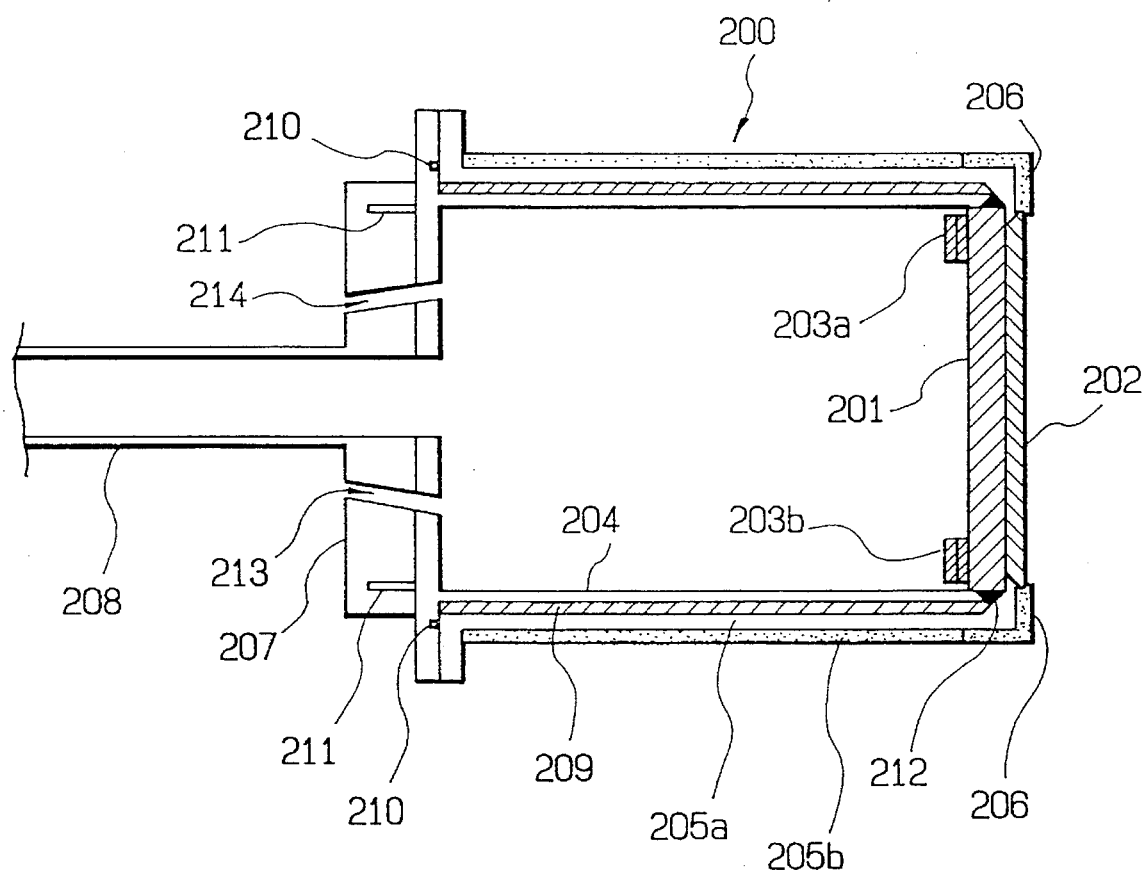
FIG. 2 is a schematic cross-section view illustrating the constitution of a representative embodiment of the microwave applicator to be used in the present invention.

A typical embodiment of the microwave applicator means to be employed in the present invention is of the constitution shown in FIG. 2. In the figure, reference numeral 200 stands for a microwave applicator in which microwave from a microwave power source situated on the right side (not shown in the figure) is transmitted in the direction shown by an arrow in the figure through a rectangular waveguide 208. Reference numeral 204 stands for a circumferential cylindrical wall of the microwave applicator 200. Reference numeral 205a stands for an outer cylindrical wall of the microwave applicator 200 which comprises a metal member. Reference numeral 205b stands for the foregoing specific dielectric member being disposed on the exterior of the outer cylindrical wall 205a. Reference numeral 209 stands for a space provided between the circumferential cylindrical wall 204 and the outer cylindrical wall 205a. The space 209 serves to circulating a cooling medium such as water, freon, oil or cooled air for uniformly cooling the entire of the microwave applicator. Reference numeral 210 stands for an O-ring which serves to hermetically seal one end of the the space 209. On the side through which said microwave is introduced into the film-forming space of the film-forming chamber having the circumferential wall comprising the curved moving substrate web (not shown in the figure), a two layered microwave transmissive window comprising a microwave transmissive member 202 and another microwave transmissive member 201 being laminated in this order from the side of the film-forming space (not shown in the figure) is hermetically disposed. That is, the two layered microwave transmissive window is fixed to the circumferential cylindrical wall 204 and the outer cylindrical wall using a metal sealing member 212 and a fixing ring 206 such that the inside of the microwave applicator is hermetically enclosed and the other end of the space 209 is hermetically sealed. The microwave transmissive member 201 is provided with a pair of microwave matching circular plates 203a and 203b on the surface thereof. Reference numeral 207 stands for a choke-flange having a channel 211, which is connected to the outer cylindrical wall 205a. Reference numerals 213 and 214 are holes respectively capable of serving to introduce and/or release cooled air, which is used for cooling the inside of the microwave applicator.

In this embodiment, the internal shape of the circumferential wall 204 is of a cylindrical form. The inside diameter and the inside length thereof in the direction of microwave to propagate are properly designed such that it can function as a waveguide. Particularly, said inside diameter is desired to be designed such that the cut-off frequency becomes smaller than the frequency of microwave but large as much as possible, as long as a plurality of modes cannot be established therein. Said inside length is desired to be designed such that a standing wave cannot be provided therein. As for the inside shape of the circumferential wall 204, it is not limited only to the cylindrical shape but it may be of a prismatic shape.

In the following, more detailed explanation will be made of the MW-PCVD apparatus of the present invention.

The first embodiment of the MW-PCVD apparatus of the present invention comprises a substantially enclosed columnar film-forming chamber having a curved circumferential wall formed by curving and projecting a substrate web as said substrate web is moving in the longitudinal direction from a pay-out mechanism toward a take-up mechanism by a pair of rollers capable of curving said substrate web while supporting said substrate web on them, said film-forming chamber having a film-forming space in which plasma is generated to cause film formation and which is circumscribed by the curved moving substrate web, said pair of rollers being arranged in paralled to each other while leaving a predetermined spacing between them in the longitudinal direction; at least a microwave applicator means of, for example, the constitution shown in FIG. 2 being mounted to said film-forming chamber through one of the two side faces such that part of said microwave applicator means is plunged into said film-forming space, said microwave applicator means being capable of radiating a microwave energy into said film-forming space in the direction parallel to the direction of microwave to propagate; means for evacuating the inside of said film-forming chamber; a gas feed means for introducing a film-forming raw material gas into said film-forming space; and means for heating or cooling said substrate web.

The film formation in this MW-PCVD apparatus is carried out by introducing a film-forming raw material gas through the gas feed means into the film-forming space while simultaneously radiating a microwave energy into the film-forming space and directing said microwave energy in a direction that is substantially parallel to an inner face of the circumferential wall of the film-forming chamber by the microwave applicator means to generate and confine plasma in the film-forming space, thereby continuously forming a functional deposited film on the inner face of the continuously moving circumferential wall which is exposed to said plasma.

The second embodiment of the MW-PCVD apparatus of the present invention is that the first embodiment further comprises a bias voltage applying means capable of controlling the potential of the plasma generated in the film-forming space. In the MW-PCVD apparatus of the second embodiment, the film formation is carried out in the same manner as in the above, except for applying a bias voltage into the film-forming space by the bias voltage applying means to control the potential of the plasma generated in the film-forming space.

In the MW-PCVD apparatus of the present invention, the foregoing pair of rollers comprise a first supporting and curving roller and a second supporting and curving roller. The substrate web which is delivered by the pay-out mechanism and is moving in the longitudinal direction toward the take-up mechanism by the rotation of the take-up mechanism, wherein as the substrate web is moving, it is curved and projected by the first supporting and curving roller while being moved upward in the side of the pay-out mechanism and is again curved by the second supporting and curving roller while being moved toward the take-up mechanism, to thereby establish a projected columnar portion be to the circumferential wall of the film-forming chamber while leaving a predetermined spacing between the first curved portion formed by the first supporting and curving roller and the second curved portion formed by the second supporting and curving roller. Each of the two open side faces of the curved and projected columnar portion is provided with a rotary ring such that the respective side ends of the columnar portion are supported on the respective rotary rings to establish and maintain a desired shape of the columnar portion to be the columnar film-forming chamber having a film-forming space.

The foregoing microwave applicator means is mounted to the columnar film-forming chamber through one of the two side faces thereof such that a predetermined part of the microwave applicator means is plunged into the film-forming space to effectively radiate a microwave energy into the film-forming space in parallel to the circumferential wall of the columnar film-forming chamber. The microwave applicator means may be of such constitution as shown in FIG. 2 which has an outer wall having a specific dielectric member comprising a specific dielectric material having a value of $2\times10^{-2}$ or less in the product of the dielectric constant ($\epsilon$) and the dielectric dissipation factor (tan $\delta$) with respect to the frequency of microwave to be used being disposed on at least part of the exterior thereof which is situated in the columnar film-forming chamber and which includes a microwave transmissive window member made of a dielectric material and a rectangular or elliptical waveguide connected to said microwave transmissive window member, said waveguide is extending from a microwave power source.

In the MW-PCVD apparatus of the present invention, it is possible to mount the foregoing microwave applicator means to the columnar film-forming chamber through each of the two side faces thereof such that a predetermined part of each of the microwave applicator means is plunged into the film-forming space to be situated in a state that they are opposite each other in the film-forming space. In this case, it is important that the two microwave applicator means be arranged such that the microwave energy radiated from one of the microwave applicator means is not received by the other microwave applicator means. For this purpose, it is necessary for the two microwave applicator means to be oppositely arranged in the film-forming space of the columnar film-forming chamber such that the setting angle of the waveguide of one of the microwave applicator means does not conform to the setting angle of the waveguide of the other microwave applicator means. Particularly, it is necessary to design such that the face containing the major edge, the face containing the major axis, or the face containing said major edge and axis respectively of one of the waveguides is not in parallel to the face containing the major edge, the face containing the major axis, or the face containing said major edge and major axis respectively of the other waveguide. A further due care is necessary to be made is this case. That is, the two waveguides are to be arranged such that the angle which is formed by the face containing the foregoing major edge and/or major axis and the face containing the two central axes of the foregoing pair of supporting and curving rollers does not result in becoming perpendicular.

In any case, the columnar film-forming chamber is so structured that a microwave energy radiated into the film-forming space by the microwave applicator means is not leaked out of the columnar film-forming chamber.

In the MW-PCVD apparatus of the present invention, the evacuation of the film-forming space is carried out through the foregoing spacing by an appropriate evacuating means. The evacuating means is provided to the columnar film-forming chamber such that the film-forming space thereof is evacuated through the spacing provided between the foregoing pair of supporting and curving rollers.

As the substrate web on which a film is to be formed to be used in the present invention, it is desired to use an electroconductive substrate web or other substrate web applied with electroconductive treatment to the surface thereof on which a film is formed.

In the second apparatus embodiment of the present invention, the bias voltage applying means is provided to the columnar film-forming chamber such that at least a part thereof is in contact with the plasma generated in the film-forming space. Said part of the bias voltage applying means to be in contact with the plasma is desired to be such that has been applied with electroconductive treatment. The bias voltage applying means may be one that can apply a bias voltage of direct current (DC), alternate current (AC) or pulsating current (PC). The bias voltage applying means can be designed such that it serves also as a means for introducing a film-forming raw material gas into the film-forming space. The bias voltage applying means may be a single bar or a plurality of bias bars.

Alternatively, it is possible to design the columnar film-forming chamber such that the potential of the plasma generated in the film-forming space can be controlled by a bias voltage applied through the substrate web constituting the circumferential wall of the columnar film-forming chamber. In this case, the gas feed means comprising, for instance, a gas feed pipe is installed in the film-forming space while being electrically grounded such that at least a part thereof is in contact with the plasma generated in the film-forming chamber.

In the following, explanation will be made of the experiments which were carried out by the present inventors in order to attain the objects of the present invention.

The following experiments were made aiming at finding out desirable conditions for the microwave applicator means which came to the result of having accomplished the present invention.

EXPERIMENT 1

In this experiment, studies were made about the efficiency of generating plasma in terms of the power at which discharge starts when the location of the top portion of the microwave applicator means situated in the film-forming space was changed, using the MW-PCVD apparatus of Apparatus Embodiment 2 which will be later described. Generation of plasma in the film-forming space of the MW-PCVD apparatus was performed in the same manner as in Production Example 1, which will be later described, under the conditions shown in Table 1. As each of the two microwave applicator means, there was used a microwave applicator having a rectangular waveguide and of the same constitution as that shown in FIG. 2, having an outer cylindrical wall 205a comprising a stainless steel (commercially available under the trade mark name: SUS 304) but not having any coating member on said outer cylindrical wall. The size of the microwave applicator used was made as shown in Table 1.

The angle at which each of the two waveguides is to be set was made 45°. As the substrate web, there was used a 0.2 mm thick SUS 430 BA web member. In the experiment, this web member was moved at a transportation speed of 50 cm/min. The surface temperature of the web member was maintained at about 210° C. The distance of the top portion (microwave transmissive window) of each of the two microwave applicators from the side face end of the film-forming space was changed as shown in Table 2 in each case.

Figure 6:
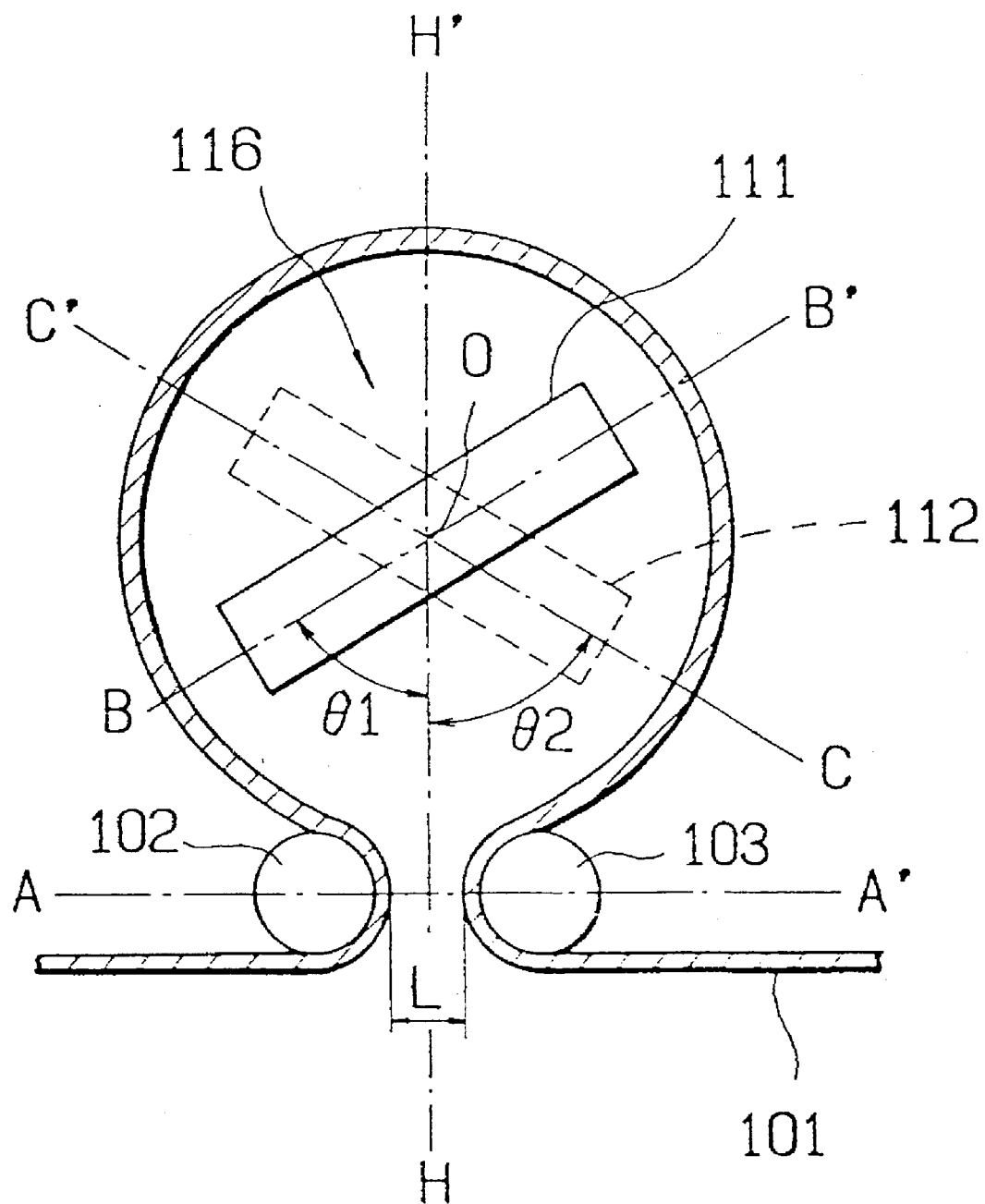
FIG. 6 is a schematic view for explaining the setting angle of the rectangular waveguide in the present invention.

FIG. 6 is a schematic explanatory view about the angle at which a pair of rectangular waveguides are set. In the figure, each of the rectangular waveguide 111 shown by a true line and the other rectangular waveguide 112 shown by a dotted line is connected to the corresponding microwave applicator (not shown) plunged into a film-forming space 116 of a columnar film-forming chamber, wherein the two microwave applicators are so arranged as to be opposed each other while leaving a predetermined spacing between them in the film-forming space. For instance, as shown in FIG. 6, the rectangular waveguide 111 is situated in the front and the rectangular waveguide 112 is situated in the back. The mark "0" stands for the center of the curved shape (which is the circumferential wall comprising a curved moving substrate web 101 of the film-forming chamber). The line A—A' stands for a face containing a central axis between a pair of supporting and curving rollers 102 and 103. The line H—H' stands for a face which is perpendicular to said A—A' face. The angle which is provided by a face B—B' in parallel to the face containing a major edge of the rectangular waveguide and the face H—H' is made to be $\Theta_1$. This angle $\Theta_1$ is considered as the setting angle of the rectangular waveguide 111. The angle which is formed by a face C—C' in parallel to the face containing a major edge of the rectangular waveguide 112 and the face H—H' is made to be $\Theta_2$. This angle $\Theta_2$ is considered as the setting angle of the rectangular waveguide 112. In the case where each of the angles $\Theta_1$ and $\Theta_2$ goes beyond 180°, the rectangular waveguides 111 and 112 become symmetric to the face H—H' in the case of less than 180°. Therefore, their arrangement relation is the same as in the case of less than 180°.

Likewise, when the angles $\Theta_1$ and $\Theta_2$ are replaced each other, their arrangement relation is not changed.

Here, the distance between the portion of a substrate web curved by the supporting and curving roller 102 and the other portion of said substrate web curved by the supporting and curving roller 103 is made to be a spacing L.

The experimental results obtained were as shown in Table 2.

From the results shown in Table 2, the following were found. That is, the efficiency of generating plasma is varied depending upon the distance of the top (microwave transmissive window) of the microwave applicator from the side face end of the columnar film-forming chamber in the film-forming space; and when said distance is made to be at least 1 cm, the power at which discharge starts can be reduced.

EXPERIMENT 2

In this experiment, studies were made about the stability of discharge caused in the film-forming space and the uniformity in electric property of a film to be formed using the MW-PCVD apparatus of Apparatus Embodiment 2 in which each of the two microwave applicators having the constitution shown in FIG. 2 and by varying the constituent material of the dielectric member 205b disposed on the outer cylindrical wall in termes of the value of x tan as shown in Table 4.

Discharge was performed in the same manner as in Production Example 1 under the conditions shown in Table 3 in each case.

The size of the microwave applicator used was made as shown in Table 3.

The angle at which each of the two waveguides is to be set was made 45°. As the substrate web, there were used a 0.25 mm thick SUS 430 BA web member and a 0.25 mm thick PET web member. In the experiment, this web member was moved at a transportation speed of 50 cm/min and the surface temperature of the web member was maintained at about 210° C. The distance of the top portion (microwave transmissive window) of each of the two microwave applicators from the side face end of the film-forming space was made to be 3 cm.

In each case, the film formation was performed for 30 minutes.

The particulars of the cylindrical outer wall of the microwave applicator used were made as follows. That is, as for each of the two microwave applicators used, the outer cylindrical wall 205a was constituted by a metal comprising stainless steel (SUS 304: trademark name), and on the exterior surface thereof to be in contact with the plasma in the film-forming space was disposed a 1 mm thick dielectric member 205b to cover the entire of said surface. In each case, the dielectric material to constitute the dielectric member 205b was changed in terms of the value in the product of the dielectric constant ($\epsilon$) and the dielectric dissipation factor (tan$\delta$) with respect to the the frequency (2.45 GHz) of the microwave used. As such dielectric material, there were used ceramics containing $Al_2O_3$, MgO and $SiO_2$ as the main constituents such as alumina, steatite, mullite, etc. The dielectric material having a given value in the product of the dielectric constant ($\epsilon$) and the dielectric dissipation factor (tan$\delta$) was prepared by properly changing the content of each of the main constituents $Al_2O_3$, MgO and $SiO_2$ and the content of an impurity.

Evaluation of the stability of discharge

In the evaluation of the stability of discharge caused in the film-forming space, there was used a web member comprising SUS 430BA. The stability of discharge was evaluated based on an intensity of photoemission upon discharge. The intensity of photoemission was measured by a spectrophotometer extending a glass fiber placed in the film-forming space (not shown). In the evaluation, a mean value was obtained based on the values obtained with respect the intensity of photoluminescence, and the difference between the minimum measured value and the maximum measured value was divided by said mean value to obtain a value indicating a variation in the intensity of emission. The results thus obtained were collectively shown in Table 4, wherein the mark ⊙ indicates the case where the variation is at most 0.2, the mark ○ indicates the case where the variation exceeds 0.2 but is at most 0.5, the mark $\Delta$ indicates the case where the variation exceeds 0.5 but is at most 1, and the mark X indicates the case where the variation exceeds 1.

Evaluation of the electric property of a film formed

In the evaluation of the electric property of a film deposited on the inner face of the circumferential wall of the columnar film-forming chamber, there was used a web member comprising polyethylene terepthalate (PET).

(1) In each case, the film deposited on the PET web member was randomly cut to obtain 20 specimens. Each of the 20 specimens was applied with an aluminum comb-shaped gap electrode of 250 μm in width and 5 mm in length by a conventional heat resistance evaporation method. For the resultant, a value of dark current in dark and a value of photocurrent under irradiation of He-Ne laser beam of 7 mW were measured using a pA (pico-ampere) Meter/DC Voltage Source (HP 4140B: trademark name, product by Hewlett Packard Company) to obtain a dark conductivity $\sigma d$ (S/cm) and a photoconductivity $\sigma p$ (S/cm).

(1-i) There were calculated a mean dark current value and a mean photo current value with respect to the 20 specimens. And there was obtained a mean value of the photoconductivity ($\sigma p$)/the dark conductivity ($\sigma d$).

(1-ii) The difference between the minimum value and the maximum value among the 20 mean values of the photoconductivity ($\sigma p$)/the dark conductivity ($\sigma d$) was divided by said mean value obtained in the above (1-i) to obtain a value indicating a variation in the electric property of a film obtained.

(2) With respect to a film deposited on a PET web member under the same conditions as in the above except for using a microwave applicator of the constitution shown in FIG. 2 not having any dielectric member on the SUS 304 outer cylindrical wall.Likewise, in the same manner as in the above (1), (2-i) there was obtained a reference mean value of the light conductivity ($\sigma p$)/the dark conductivity ($\sigma d$), and (2-ii) there was obtained a reference value indicating a variation in the electric property of a standard reference film obtained.

Resuls

In each case, the mean value of the light conductivity ($\sigma p$)/the dark conductivity ($\sigma d$) of the specimen film obtained in the above (1-i) was calculated as a relative value to the reference mean value obtained in the above (2-i) wherein the reference mean value was considered to be 100. The results obtained were collectively shown in Table 4.

Likewise, in each case, the value of the above (1-ii) with respect to variation in the electric property of the film calculated as a relative value to the reference value obtained in the above (2-ii) wherein the reference value was considered to be 100. The results obtained were collectively shown in Table 4 wherein A indicates the case where the relative value is at most 50, B indicates the case where the relative value exceeds 50 but at most 60, C indicates the case where the relative value exceeds 60 but at most 80, and D indicates the case where the relative value exceeds 80.

From the results shown in Table 4, the following were found. That is, (i) the stability of the plasma generated in the film-forming space and the property of a film formed on the inner face of the circumferential wall comprising the curved moving web member of the columnar film-forming chamber and the uniformity of said film are improved when the exterior of the microwave applicator means situated in the film-forming space is provided with a specific dielectric member to cover the surface of said exterior which is exposed to plasma generated in said film-forming space, (ii) when the dielectric member is comprised of a dielectric material having a value of $5\times10^{-2}$ or less in the product of the dielectric constant ($\epsilon$) and the dielectric dissipation factor (tan $\delta$), the stability of discharge is improved, (iii) when the dielectric member is comprised of a dielectric material having a value of $2.5\times10^{-2}$ or less in the product of the dielectric constant ($\epsilon$) and the dielectric dissipation factor (tan $\delta$), the resulting film becomes such that excels in the uniformity of the electric property, and (iv) when the dielectric member is comprised of a dielectric material having a value of $2\times10^{-2}$ or less in the product of the dielectric constant ($\epsilon$) and the dielectric dissipation factor (tan$\delta$), the electric property of the resulting film is markedly improved.

EXPERIMENT 3

In this experiment, studies were made of defects in a film to be formed and the content of hydrogen atoms (H) in said film, using the MW-PCVD apparatus of Apparatus Embodiment 2 in which each of the two microwave applicators being of the constitution shown in FIG. 2 and by varying the thickness of the dielectric member 205b disposed on the outer cylindrical wall 205a which is situated in the film-forming space to be in contact with plasma generated therein (the dielectric member to be in contact with the plasma in the film-forming space will be hereinafter referred to as the second region). The second region was constituted by a dielectric material comprising ceramic containing alumina as the main constituent and having a value of 0.5×10 in the product of the dielectric constant ($\epsilon$) and the dielectric dissipation factor (tan$\delta$) with respect to the frequency (2.45 GHz) of the microwave used.

Each of the two microwave applicators was arranged such that the distance of the top (microwave transmissive window) of the microwave applicator from the side face end of the film-forming space is 3 cm. The angle at which each of the two waveguides is to be set was made to be 45°. The size of the microwave applicator used was made as shown in Table 3.

The thickness of the second region was varied as shown in Table 5.

Discharge was performed in the same manner as in Production Example 1 under the conditions shown in Table 3 in each case.

As the substrate web, there were used a 0.2 mm thick SUS 430 BA web member. The web member was moved at a transportation speed of 30 cm/min and the surface temperature of the web member was maintained at about 250° C.

In each case, the film formation was performed for 3 hours.

As for the film obtained in each case, there were observed defects present therein and the amount of hydrogen atoms contained therein.

Observation of defects present in the film

The resultant film was cut at predetermined positions thereof to obtain a plurality of specimens respectively of 5 cm$^2$ in size. Each of the specimens was set to a conventional light microscope to observe the number of defects at 10 positions in the width direction. From the results obtained, a mean value was calculated.

The observed results were collectively shown in Table 5.
Observation of the content of hydrogen atoms in the film Each of the plurality of specimens obtained in the above was set to a commercially available hydrogen content analyzer (EMGA-1100: trademark name, product by Horiba Seisakusho Kabushikikaisha) to examine the content of hydrogen atoms contained therein. From the measured results, the ratio of a change in the content of hydrogen atoms between the film formed at the initial stage and the film formed at the last stage.

The results obtained were collectively shown in Table 5.

From the results shown in Table 5, it was found that in order to continuously form a desirable film excelling in the characteristics on the inner wall of the circumferential wall comprising the curved moving web member of the columnar film-forming chamber, it is desired for the thickness of the second region comprising the foregoing specific dielectric material to be preferably 0.005 mm to 25 mm, or more preferably 0.1 to 10 mm.

EXPERIMENT 4

(1) Studies were made of the stability of plasma generated in the film-forming space and the quality of a film to be formed, using the MW-PCVD apparatus of Apparatus Embodiment 2 in which each of the two microwave applicators being of the constitution shown in FIG. 2. The dielectric member 205b disposed on the outer cylindrical wall 205a which is situated in the film-forming space to be in contact with plasma generated therein was constituted by a dielectric material comprising ceramic containing alumina as the main constituent and having a value of 0.8×10$^{-2}$ in the product of the dielectric constant ($\epsilon$) and the dielectric dissipation factor (tan $\delta$) with respect to the frequency (2.45 GHz) of the microwave used. The thickness of the dielectric member 205b was made to be 0.5 mm.

Each of the two microwave applicators was arranged such that the distance of the top (microwave transmissive window) of the microwave applicator from the side face end of the film-forming space is 3 cm. The angle at which each of the two waveguides is to be set was made to be 45°. The size of the microwave applicator used was made as shown in Table 3.

Discharge was performed in the same manner as in Production Example 1 while varying the film-forming parameters including the spacing L, the inside diameter of the columnar portion, the flow rate of a film-forming raw material gas, the gas pressure of the film-forming space, and the microwave power in each case.

As the substrate web, there were used a 0.2 mm thick SUS 430 BA web member. The web member was moved at a transportation speed of 30 cm/min and the surface temperature of the web member was maintained at about 250° C.

In each case, the film formation was performed for 30 minutes.

(2) Separately, the same procedures as in the above case (1) were repeated except that any coating member was not disposed on the exterior of the outer cylindrical wall 205a which is situated in the film-forming space to be in contact with plasma generated therein.

And the stability of the plasma generated in the film-forming space and the quality of the resultant film were evaluated.

As a result, the following were found. That is, (i) the evaluated results in the case (1) are surpassing those in the case (2), and (ii) the tolerances of the related film-forming parameters capable of continuously forming a high quality film while maintaining the plasma generated in the film-forming space in a stable state in the case (1) are distiguishably larger than those in the case (2).

As a result of further studies by the present inventors based on the results obtained in the foregoing experiments, the following knowledges were obtained.

Firstly, the reason why the foregoing disadvantages of the antecedent MW-PCVD apparatus can be effectively eliminated by mounting at least a microwave applicator means to the columnar film-forming chamber having the circumferential wall comprising a curved moving web member capable of serving as a substrate for the formation of a film thereon through one of the two side faces of the columnar film-forming chamber such that the microwave applicator means is plunged into the film-forming space wherein the microwave applicator means is provided with the foregoing specific dielectric member on at least part of the exterior thereof to be in contact with plasma generated in the film-forming space is not clear enough at the present time. But the present inventors consider this reason as follows.

That is, as above described, in the case of the antecedent MW-PCVD apparatus, when the microwave applicator means is plunged in the film-forming space in the same way as in the present invention, the situation becomes liable to cause discharge thereby efficiently generating plasma in the film-forming space at the beginning stage, but it is very difficult to maintain said discharge in a stable state for a long period of time and in addition to this, a film is deposited on the exterior comprising a metal of the microwave applicator means in contact with the plasma in the film-forming space upon continuation of discharge for a long period of time and the film deposited on the exterior of the microwave applicator means is eventually removed to get in a film deposited on the inner face of the circumferential wall of the film-forming chamber. Particularly in this respect, microwave introduced into the film-forming space through the microwave applicator means is reflected by the plasma which is an electric conductor and the microwave thus reflected arrives at the exterior of the microwave applicator where it is again reflected. Because of this, unevenness is occurred on the density distribution of a microwave energy in the film-forming space to cause local concentration of a microwave energy and this makes it difficult to continuously generate and sustain uniform plasma for a long period of time. This situation is significant in the case of forming an amorphous silicon film such as a-Si:H film having a low dielectric constant. That is, when such amorphous silicon film is deposited on the metallic exterior of the microwave applicator means situated in the film-forming space, said amorphous silicon film often functions as an absorbent or a reflector for microwave, and because of this, as the amorphous silicon film deposited on the exterior of the microwave applicator means thickenes upon continuing the film-forming process, not only the stress of the amorphous silicon film increases and but also heat distribution is occurred in the amorphous silicon film, thereby causing a variation not only in the quantity of microwave reflected at but also in the quantity of microwave absorbed by the amorphous silicon film. As a result, a change is caused in the effective microwave power introduced into the film-forming space to thereby hinder discharge in the film-forming space wherein discharge hardly occurs and in addition to this, the amorphous silicon film eventually becomes removed from the exterior of the microwave applicator means to contaminate into an amorphous silicon film deposited on the inner face of the circumferential wall of the film-forming chamber.

On the other hand, in the case of the MW-PCVD apparatus of the present invention, since the exterior of the microwave applicator means to be in contact with plasma in the film-forming space has the foregoing specific dielectric member being disposed thereon, the exterior comprising the foregoing specific dielectric member forms a sort of propagation path for microwave. Because of this, when microwave reflected by the plasma arrives at the exterior of the microwave applicator means, the microwave propagates along said exterior wherein an improvement is provided in the distribution state of a microwave energy in the space between the microwave applicator means and the plasma region in the film-forming space. This makes a microwave energy to be efficiently introduced into the film-forming space to cause discharge in a stable state even upon continuing the film-forming process for a long period of time wherein desirable and uniform plasma is efficiently generated and sustained continuously in the film-forming space without causing local concentration of a microwave energy as in the case of the antecedent MW-PCVD apparatus. In addition, in the MW-PCVD apparatus, there is not occurred such change in the effective microwave power introduced into the film-forming space as found in the case of the antecedent MW-PCVD apparatus and because of this, the plasma is maintained in a stable and uniform state as desired in the MW-PCVD apparatus of the present invention. Further in addition, the MW-PCVD apparatus of the present invention is free of removal of a film deposited on the exterior of the microwave applicator means since the exterior is constituted by the foregoing specific dielectric member. Hence, the MW-PCVD apparatus of the present invention makes it to eliminate the foregoing disadvantages of the antecedent MW-PCVD apparatus and to continuously form a functional deposited film excelling in the thickness distribution and in the uniformity of the film property on a large area and lengthy substrate web.

In the following, detailed explanation will be made of the MW-PCVD apparatus of the present invention.

As previously described, the basic constitution of the MW-PCVD apparatus of the present invention comprises: a substantially enclosed columnar film-forming chamber having a curved circumferential wall formed by curving and projecting a substrate web as said substrate web is moving in the longitudinal direction from a pay-out mechanism toward a take-up mechanism by a pair of supporting and curving rollers capable of curving said substrate web while supporting it on them, said pair of supporting and curving rollers being arranged in parallel with each other while leaving a predetermined spacing between them in the longitudinal direction, said film-forming chamber having a film-forming space in which plasma is generated to cause film formation; at least a microwave applicator means being mounted to said film-forming chamber through one of the two side faces thereof such that part of said microwave applicator means is plunged into said film-forming space, said microwave applicator means having a specific dielectric member having a value of $2 \times 10^{-2}$ or less in the product of the dielectric constant ($\epsilon$) and the dissipation factor ($\tan\delta$) with respect to the frequency of microwave used being disposed on at least the exterior of said part of the microwave applicator means to be in contact with plasma generated in said film-forming space so as to cover the entire of the exterior of said part of the microwave applicator means, said microwave applicator means being capable of radiating a microwave energy into said film-forming space in the direction parallel to said circumferential wall; means for evacuating said film-forming space; a gas feed means for introducing a film-forming raw material gas into said film-forming space; and means for heating or cooling said substrate web. The MW-PCVD apparatus of the present invention may further include means for applying a bias voltage into the film-forming space.

The point by which the MW-PCVD apparatus of the present invention is apparently distinguished from the known MW-PCVD apparatus is that the circumferential wall of the film-forming chamber is constituted by a curved moving substrate web and a film is continuously on the inner face of said circumferential wall, wherein the substrate web functions as a structural member of the film-forming chamber. The function as the structural member means to physically and chemically isolate the atmospheric space for film formation i.e. the film-forming space from other atmospheric space which does not concern film formation. More particularly, it means to form an atmosphere having a different gas composition or a different state thereof, to control the direction of a gas flow, or to form an atmosphere having different pressure.

In the MW-PCVD apparatus of the present invention, a desirably uniform semiconductor deposited film is continuously formed on a large area and lengthy substrate web serving as the circumferential wall of the film-forming chamber having a film-forming space, which is formed by curving and projecting said substrate web while moving it to establish a columnar portion to be said circumferential wall, wherein a film-forming raw material gas is fed into the film-forming space while simultaneously applying a microwave energy into said film-forming space while evacuating the film-forming space to thereby produce plasma while confining said plasma as produced. Thus, the substrate web itself functions as the structural member to isolate the film-forming space from the space which does not concern film formation and it also functions as a substrate on which a film is to be formed.

In this connection, the atmosphere isolated from the film-forming space is in such a state that the gas composition, the state thereof, the pressure, etc. are significantly different from those in the film-forming space.

On the other hand, in the known MW-PCVD apparatus, the substrate on which a film is to be formed is placed on a substrate holder in a film-forming chamber and thus, the substrate functions as a member to deposit thereon a film-forming precursor produced in the film-forming chamber. The substrate therefore does not function as the structural member as in the present invention. This is a marked point that apparently distinguishes the MW-PCVD apparatus of the present invention from the known MW-PCVD apparatus.

In the known RF plasma CVD apparatus or the known sputtering apparatus, a substrate on which a film is to be formed occasionally serves also as an electrode to cause and maintain discharge, but it does not work to sufficiently confine plasma. And the substrate in this case does not function as the structural member to sufficiently isolate the film-forming space from other space which does not concern film formation as in the present invention.

In the film formation in the MW-PCVD apparatus of the present invention, there is an optimum condition for each of the film-forming parameters in order to stably and continuously produce plasma having a desirable uniformity whereby causing the formation of a desirable semiconductor film on the moving substrate web. However, it is difficult to generalize those film-forming parameters since the film-forming parameters such as the shape and volume of the film-forming chamber, the kind of a film-forming raw material gas and the flow rate thereof, the inner pressure of the film-forming chamber, the quantity of a microwave energy, matching of microwave, bias voltage, etc. are complicatedly interrelated in terms of organic relation.

Now, upon film formation in the MW-PCVD apparatus of the present invention, the gas composition and the state thereof in the space isolated from the film-forming space circumscribed by the moving substrate web constituting the circumferential wall of the film-forming chamber are made different from those in said film-forming space in order to perform the film formation only in the film-forming space. For instance, the atmosphere of the space outside the film-forming space may be comprised of a gas which is not capable of contributing to the formation of a film or a gas containing the gas exhausted from the film-forming space.

In the MW-PCVD apparatus of the present invention, plasma is confined in the film-forming space upon film formation, where it is important to prevent said plasma from leaking outside the film-forming space in order to improve the stability and the reproducibility of plasma in the film-forming space and to prevent a film from depositing on other portions than the substrate web. For this purpose, it is effective (a) to provide a difference between the pressure of the film-forming space and the pressure of the space outside the film-forming space, (b) to form a gas atmosphere comprising an inert gas having a small ionization cross-section of $H_2$ gas in the space outside the film-forming space or (c) to purposely provide a means for preventing leakage of plasma from the film-forming space. In the case (c), it is effective to seal the space connecting the film-forming space and the space outside the film-forming space with the use of an appropriate conductive member. Other than this, it is also effective to cover the foregoing space by a metal mesh member or a punching board having a plurality of perforations.

When the pressure of the space outside the film-forming space is made remarkably lower than the pressure of the film-forming space or when the former pressure is made higher than the latter pressure, the generation of plasma in the space outside the film-forming space can be effectively prevented.

In addition to what above described, in the MW-PCVD apparatus of the present invention, at least a microwave applicator means is mounted to the film-forming chamber through one of the two side faces thereof such that part of the microwave applicator means is plunged into the film-forming space, the microwave applicator means having a specific dielectric member having a value of $2\times10^{-2}$ or less in the product of the dielectric constant ($\epsilon$) and the dissipation factor ($\tan\delta$) with respect to the frequency of microwave used being disposed on at least the exterior of said part of the microwave applicator means to be in contact with plasma generated in the film-forming space so as to cover the entire of the exterior of said part of the microwave applicator means, said microwave applicator means being capable of radiating a microwave energy in the film-forming space in the direction parallel to the circumferential wall comprising the curved moving substrate web. And the substrate web serving as the circumferential wall of the film-forming chamber is continuously moved in the direction substantially perpendicular to the lengthwise direction of the microwave applicator means. Because of this, uniform plasma is always generated and sustained in the film-forming space circumscribed by the curved moving substrate web to cause continuous formation of a deposited film on the inner face of the circumferential wall of the film-forming chamber in a state of being uniform not only in the width direction but also in the longitudinal direction while efficiently catching up precursors capable of contributing to the formation of said deposited film on the inner face of the circumferential wall of the film-forming chamber. Thus, it is possible to continuously form a desirable functional deposited film having a uniform thickness and excelling in homogeneity of the property on a large area and lengthy substrate at a markedly improved gas utilization efficiency and with an improved yield. It is also possible to continuously produce a multi-layered device excelling particularly in the interface property with an improved yield.

Now, in the MW-PCVD apparatus of the present invention, the outside of the substrate web functioning as a structural member of the apparatus may be atmospheric air. However, in a preferred embodiment, said outside is enclosed by an appropriate enclosing means such that it is isolated from the open air. Particularly, the film-forming chamber may be isolated from the open air by means of a mechanically enclosing means with the use of O-ring, gasket, helicoflex, magnetic fluid, etc. In this case, the structure is made such that the substrate web can be continuously moved while being structurally sealed. In an alternative, there may be provided a enclosing vessel in the outside of the film-forming chamber which is capable of forming an atmosphere comprising a dilution gas which does not provide any negative influence to or provides a positive influence to a film to be formed in the film-forming chamber. Other than this, there may be provided other enclosing vessel in the outside of the film-forming chamber which is capable of vacuumizing said outside.

The MW-PCVD apparatus of the present invention may include a plurality of the foregoing film-forming chambers being horizontally arranged. In this case, the above enclosing vessel may be provided to each of those film-forming chamber. Alternatively, the foregoing enclosing may be provided such that it dominates all the film-forming chambers.

The MW-PCVD apparatus of the present invention may include one or more other film-forming apparatus. In this case, it is desired that every two adjacent apparatus are connected by means of, for example, a gas gate means.

In the MW-PCVD apparatus of the present invention, the pressure of the outside of the film-forming chamber may be made to be either in a reduced pressure state or a pressured state. However, in order to prevent the circumferential wall comprising the curved moving substrate web of the film-forming chamber from deforming because of a difference caused between the pressure in the film-forming chamber and the pressure in the outside of said chamber, it is possible to provide an appropriate auxiliary structural member in the film-forming chamber. As such auxiliary member, there can be illustrated mesh members made of metal, ceramic or reinforced plastics. In this case, the auxiliary structural member comprising one of said mesh members is installed along the inner face of the circumferential wall in the film-forming chamber. In the case where the auxiliary structural mesh member is installed in this way in the film-forming chamber, the portions of the inner face of the circumferential wall shadowed by said mesh member are hardly exposed to plasma and thus, slightly deposited with a film. In view of this, it is necessary to design said auxiliary structural mesh member such that it does not provide such shadowed portions on the inner face of the circumferential wall.

It is possible to design the auxiliary structural mesh member such that it rotates at the same speed as the substrate web moves upon film formation, to thereby purposely form a mesh pattern on said substrate web.

As above described, the substrate web on which a film is to be deposited is desired to be such that is neither deformed nor distorted because of a high temperature upon film-formation by the MW-PCVD process, has a sufficient strength and is conductive. As such substrate web, there can be mentioned web members made of metals or alloys thereof such as stainless steel, aluminum, aluminum alloy, iron, iron alloy, copper, copper alloy, etc., web members made of combinations of two or more of these metals, and web members comprising any of said web members applied with a thin film of a different metal to the surface thereof by sputtering method, evaporation method or coating method, etc.

Other than these web members, there can be also illustrated heat-resistant sheets made of resins such as polyimide, polyamide, polyethyleneterephthalate, epoxy resins, etc. or other sheets made of compositions of said resins and glass fiber, carbon fiber, boron fiber, metal fiber, etc., which were respectively applied with a conductive film of a metal such as Al, Ag, Pt, Au, Ni, Mo, W, Fe, V, Cr, Cu, etc., an alloy such as stainless steel, brass, nichrome, etc., or a transparent conductive oxide (TCO) film of $SnO_2$, $In_2O_3$, ZnO, $SnO_2$-$In_2O_3$ (ITO) to their surface by a plating method, a coating method, an evaporation method, a sputtering method, etc.

Any of these web members having a conductive surface may have an insulating film comprising $SiO_2$, $Si_3N_4$, $Al_2O_3$, AlN or one of said heat resistant region on part of the surface thereof.

The substrate web to be used in the present invention is desired to be thin as much as possible, as long as it can be desirably curved to provide a desirable curved columnar portion having a desirable strength to constitute the circumferential wall of the film-forming chamber of the present invention, particularly in view of a cost, storage space, etc.

In general, the thickness of the substrate web is preferably in the range of from 0.01 to 5 mm, more preferably in the range of from 0.02 to 2 mm, and most preferably, in the range of from 0.05 to 1 mm.

As for the width of the substrate web, a due care should be made so that desirable uniform plasma can be stably and repeatedly produced in the width direction of the moving substrate web as the circumferential wall of the film-forming chamber and the shape of the columnar portion can be stably maintained. In general, it is preferably in the range of from 5 to 100 cm and more preferably, in the range of from 10 to 80 cm.

Further, as for the length of the substrate web, there is not any particular restriction therefor.

In the MW-PCVD apparatus of the present invention, as previously described, it is basically required that the moving substrate web is desirably curved and projected to provide a columnar portion to be the circumferential wall of the film-forming chamber by a first supporting and curving roller capable of initially curving and projecting the substrate web delivered from a pay-out mechanism while conveying said substrate web upward and a second supporting and curving roller capable of terminally curving the substrate web while conveying the substrate web in the longitudinal direction toward to a take-up mechanism while leaving a spacing of a predetermined width in the longitudinal direction between the two rollers. And each of the two side faces of the columnar portion are respectively provided with a supporting and conveying rotary ring to maintain the columnar portion in a desired state, wherein each of the two side end parts of the columnar portion is supported by one of the two rotary rings such that the substrate web is contacted on the surface of said rotary ring. The substrate web is moved by rotating the two supporting and curving rollers or/and the two supporting and conveying rotary rings by a driving motor. In the case of moving the substrate web by rotating the two supporting and conveying rotary rings, it is possible to use as the two supporting and conveying rotary rings a pair of toothed rotary rings. In this case, it is necessary that the two side portions of the substrate web are provided with perforations corresponding to the projections of the two toothed rotary rings. Alternatively, it is possible to slidably convey the substrate web over the two supporting and conveying rotary rings without rotating them. Each of the two supporting and conveying rotary rings is desired to have the same shape. A truly round shape is the most desirable. However, they may take other shapes such as oval shape, rectangular-like shape, etc.

In the MW-PCVD apparatus of the present invention, it is an important factor to maintain the transportation speed of the substrate web constant in order to prevent the substrate web from loosening, wrinkling, side-sliding, etc. during its transportation. For this purpose, it is desired to provide a detecting mechanism capable of detecting the transportation speed of the substrate web and a transportation speed controlling mechanism capable of automatically controlling the transportation speed of the substrate web based on a signal from the detecting mechanism to the supporting and conveying mechanism. These mechanisms are also effective for controlling the thickness of a functional deposited film to be formed on the substrate web.

In any case, each of the two supporting and conveying rotary rings is situated to be unavoidably exposed to plasma upon film formation. Thus, there is a fear that a film is deposited also on the surface thereof and said film is removed therefrom to fly into a film deposited on the inner face of the circumferential wall comprising the curved moving substrate web of the film-forming chamber, wherein the resulting film becomes such that is accompanied with defects such as pinholes. Therefore, it is required for each of the two supporting and conveying rotary ring to have a sufficient resistance not only against heat and but also against corrosin. It is also required therefor to be hardly deposited with a film or to have an ability to hold a repeatedly deposited film thereon without being removed therefrom. In view of this, each of the two supporting and conveying rotary rings is necessary to be made of a selected material so that said requirements be fulfilled.

Specifically, each of the two supporting and conveying rotary rings is made of a material selected from the group consisting of stainless steel, nickel, titanium, vanadium, tungsten, molybdenum, niobium, and alloys of two or more of these metals. The surface of each of the two the rotary rings made of one these materials may applied with a coat comprising a ceramic material such as alumina, quartz, magnesia, zirconia or silicon nitride which is formed by a flame-spraying method, a evaporation method, a sputtering method, an ion-plating method, a CVD-coating method, etc. Further, each of the two supporting and conveying rotary rings may be made of one of the foregoing ceramic materials or one of composites comprising two or more those ceramic materials. The surface of each of the two supporting and conveying rotary rings may be a mirror-ground surface or an uneven surface depending upon the related factors such as stress of the film to be deposited thereon.

It is desired to purposely remove a film deposited on each of the two supporting and conveying rotary rings before the film is peeled off and dispersed in the film-forming chamber. The removal of such film is desired to be conducted by dry-etching or decomposing the film under vacuum condition and thereafter, carrying out chemical or physical treatment such as wet-etching or beads-blast. The foregoing first and second supporting and curving rollers are so designed respectively to have a larger area to be in contact with the substrate web in comparison with the foregoing pair of rotary rings. Thus, the heat exchange effectiveness of each of the two supporting and curving rollers with the substrate web is large. Therefore, it is necessary to have a due care so that the moving substrate web is not excessively heated or cooled by the first and second supporting and curving rollers. For this purpose, it is desired to provide an appropriate temperature controlling mechanism to said rollers. Further, it is possible to provide an appropriate conveying tension detecting mechanism to said rollers. This is effective in order to maintain the transportation speed of each of the two supporting and curving rollers constant. Further, in order to prevent the moving substrate web from deflecting, twisting, side-sliding, etc. upon curving it by each of the two supporting and curving rollers, a crown mechanism may be provided to said rollers.

The foregoing columnar portion to be the circumferential wall of the film-forming chamber is so established as to include part of the microwave applicator means. As previously described, the microwave applicator means is desired to be plunged through the central position of one of the two side faces of the columnar portion into the film-forming space such that part thereof applied with the foregoing dielectric member on the surface of said part is situated in the film-forming space in view of uniformly generating plasma in the film-forming chamber and securing the uniformity of a film to be formed on the inner face of the circumferential wall of the film-forming chamber.

The inside diameter of each of the side faces of the columnar portion is to decide the propagating mode of microwave and the volume of a plasma region to be provided. Particularly, the thickness of a film to be formed on the inner face of the circumferential wall comprising the curved moving substrate web of the film-forming chamber will be decided depending upon a period of time during which said inner face is exposed to said plasma region wherein said inner face is being transported. And depending upon the width of the substrate web, the area ratio of the inner face of the circumferential wall to the entire surface circumscribing the film-forming space will be decided. As a result, the gas utilization efficiency will be decided.

The microwave power density ($W/cm^3$) in order to maintain plasma in the foregoing plasma region will be decided with the interrelations among the kind of a film-forming raw material gas to be used, its flow rate, the inner pressure, radiation state of a microwave energy from the microwave applicator, propagating ability of said microwave energy, the absolute volume of the plasma region, etc. Thus, it is extremely difficult to generalize said microwave power density.

The control of the thickness of a film to be formed on the inner face of the circumferential wall of the film-forming chamber may be carried out by placing a substrate cover over part of said inner face.

Now, as for the substrate web to be used in the present invention, it may have an electroconductive layer thereon in case where necessary. For example, in the case of continuously preparing a solar cell, when a substrate web made of an electroconductive material is used, it is not necessary to apply an electroconductive layer thereon since the electroconductive substrate web itself is capable of being a current outputting electrode. However, when a substrate web made of an insulating material such as synthetic resin is used, it is necessary to provide an electroconductive layer capable of serving as the current outputting electrode on the surface thereof, on which a semiconductor film is to be formed in the MW-PCVD apparatus of the present invention. Such electroconductive layer may be formed by applying onto the surface of the insulating substrate web an electroconductive material of Al, Ag, Pt, Au, Ni, Ti, Mo, W, Fe, V, Cr, Cu, stainless steel, brass, nichrome, $SnO_2$, $In_2O_3$, ZnO, $SnO_2$-$In_2O_3$(ITO) or TCO by means of metal plating, evaporation or sputtering.

In any case, any of these substrate webs may have an insulating layer portion intermitently on the surface thereof in order to ease the operation of dividing the product into a plurality of independent elements.

Further, in order to improve the reflectivity of a long wavelength light at the surface of a substrate, or in order to prevent mutual dispersions of the constituent elements of a substrate and a deposited film formed thereon between the substrate and the deposited film or in order to prevent occurrence of short circuit, it is possible to provide an appropriate layer on the substrate which comprises a metal different from the constituent element of the substrate or of the electroconductive layer.

In the case of preparing a solar cell of the type that light is impinged from the substrate side, when there is used a relatively transparent web member as the substrate web, it is desired that an electroconductive thin layer comprising the foregoing electroconductive oxide material or metal is applied onto the surface thereof in advance.

The substrate web may be one that has an even surface or an uneven surface accompanied with minute irregularities.

In the case of the latter substrate web, the minute irregularities may be comprised of a plurality of dimples in round, conical or pyramid form, wherein the maximum height (R max) of the dimple is preferably from 500 to 5000 Å.

The solar cell prepared using such substrate web becomes such that light is irregularly reflected to increase the optical path length of light reflected at the surface thereof.

In the MW-PCVD apparatus of the present invention, in order to generate and sustain plasma in a uniform state in the columnar film-forming space, it is necessary to radiate a microwave energy in the direction parallel to an inner face of the circumferential wall comprising the curved moving substrate web of the columnar film-forming chamber in the film-forming space through at least a microwave applicator, which is plunged into the film-forming space through one of the two side faces of the columnar film-forming chamber such that part of the microwave applicator having a microwave transmissive window member at its top portion is situated to be in contact with the plasma generated in the film-forming space wherein at least said part is provided with the foregoing specific dielectric member thereon, and to confine the microwave energy thus radiated within the film-forming space. In this case, although depending upon the kind of a film-forming raw material gas introduced into the film-forming space, the microwave energy radiated thereinto has a strong correlation with the gas pressure in the film-forming space and has a tendency of being attenuated in the interrelation with said gas pressure as the distance from the microwave transmissive window member increases. In view of this, particularly in the case of the columnar film-forming chamber of which circumferential wall comprising a curved moving substrate web having a relatively large width, the gas pressure in the film-forming space is desired to maintain at a sufficiently low value in order to uniformly generate desirable plasma in the width direction in the film-forming space. In a preferred embodiment in this case, a pair of microwave applicators respectively having a microwave transmissive window member at its end portion are mounted to the columnar film-forming chamber by plunging each of the two microwave applicators into the film-forming space through one of the two side faces of the columnar film-forming chamber such that part of the microwave applicator is situated to be in contact with the plasma generated in the film-forming space wherein at least said part is provided with the foregoing specific dielectric member thereon, whereby applying a microwave energy into the film-forming space through each of the two microwave applicators. It is desired that the two microwave applicators are arranged to be opposite each other while maintaining a predetermined distance between their tops in the film-forming space. And the two microwave applicators are desired to be arranged in the film-forming space such that the distance between one side face of the columnar film-forming chamber through which one of the two microwave applicators is plunged into the film-forming space and the top of said microwave applicator is substantially the same as the distance between the other side face of the columnar film-forming chamber through which the remaining microwave applicator is plunged into the film-forming space and the top of said microwave applicator. In this case, plasma is efficiently generated in a uniform state in the film-forming space without having such problem as above mentioned which will be occurred in the case where the foregoing microwave applicator is singly used. In the case where the curved shape of one of the two side faces of the columnar film-forming chamber is asymmetrical to that of the other side face, the arrangement of the two microwave applicators should be properly designed so as to attain the objects of the present invention. And when the two microwave applicators are oppositely arranged, it is not always necessary that their central axes are on the same line.

The microwave applicator in the MW-PCVD apparatus of the present invention has such a structure that functions to radiate a microwave energy supplied from a microwave power source into the film-forming space in a desirable state, whereby decomposing a film-forming raw material gas supplied from the gas feed means with the action of said microwave energy to stably generate plasma causing the formation of a functional deposited film on the inner face of the circumferential wall comprising the curved moving substrate web of the film-forming chamber and to maintain said plasma constant in a desirable state. Specifically, the microwave applicator comprises a waveguide and a microwave transmissive window member being hermetically disposed at the top portion thereof.

The microwave applicator may be of the same specification as that of the waveguide. It is a matter of cause that the microwave applicator means may be other appropriate specification.

The microwave applicator is desired to be designed with respect to its size and shape such that the microwave propagating mode in said microwave applicator be a single mode in order to make a microwave energy effectively propagated in the film-forming chamber whereby stably generating, maintaining and controlling plasma in the film-forming space.

However, it is possible to employ a plurality of modes in the case where the plasma generating parameters including the kind of a film-forming raw material gas, the inner pressure, the microwave power, etc. are properly determined.

As the microwave propagating mode to establish the single mode, there can be mentioned, for example, $TE_{10}$ mode, $TE_{11}$ mode, $eH_1$ mode, $TM_{11}$ mode and $TM_{01}$ mode. Of these modes, $TE_{10}$ mode, $TE_{11}$ mode and $eH_1$ mode are the most desirable. To the microwave applicator means, a waveguide capable of propagating a microwave energy with the abovementioned mode is connected. In a preferable embodiment, the microwave propagating mode in the waveguide is made equivalent to that in the microwave applicator.

The kind of said waveguide should be decided properly depending upon the frequency band and the propagating mode of a microwave to be used. And its cut-off frequency is desired to be smaller than the frequency to be used.

Usable as the waveguide are, for example, rectangular waveguide, circular waveguide and elliptic waveguide of JIS, EIAJ, IEC or JAN. Other than these waveguides, it is possible to use a waveguide for microwave of 2.45 GHz which has a rectangular cross-section which is of 96 mm in width and 27 mm in height.

In the MW-PCVD apparatus of the present invention, the microwave energy from the microwave power source is effectively radiated through the foregoing microwave applicator into the film-forming chamber, so that problems relating to the so-called reflected wave can be desirably eliminated, and relatively stable discharge can be maintained without using a microwave matching circuit such as three-stub tuner or E-H tuner in the microwave circuit.

However, in the case where there is a fear that strong reflected wave would be caused before commencement of discharge or such strong reflected wave would be caused by abnormal discharge after discharge is started, it is desired to provide the foregoing microwave matching circuit in order to protect the microwave power source.

The microwave applicator in the MW-PCVD apparatus of the present invention basically comprises a portion comprising a metal (hereinafter referred to as "metallic portion") which forms an outer wall and serves to transmit microwave from a microwave power source and a portion comprising a dielectric material by which microwave is hardly absorbed at the frequency of the microwave used and which is disposed on the surface of the metallic portion as the outer wall to be in contact with the plasma generated in the film-forming space so as to cover the entire of said surface (this latter portion will be hereinafter referred to as "dielectric portion"). This constitution is apparent with reference to a typical example of the microwave applicator shown in FIG. 2.

The metallic portion is desired to be constituted by a metal capable of securing vacuum-tightness and which can provide a waveguide. As such metal, stainless steel, aluminum alloy, brass, etc. are desirable in view of workability, durability, and the like.

The dielectric portion which constitutes the exterior potion of the microwave applicator is constituted by a selected dielectric material having a value of, preferably $2.5 \times 10^{-2}$ or less or more preferably $2 \times 10^{-2}$ or less in the product of the dielectric constant ($\epsilon$) and the dielectric dissipation factor ($\tan\delta$) with respect to the frequency of microwave used. Specific examples of such dielectric material are alumina, beryllium oxide, aluminum nitride, boron nitride, silicon carbide, silicon nitride, silicon oxide, etc., and fine ceramics containing one or more of these materials. Of these dielectric materials, said fine ceramics are the most desirable in view of heat resistance and durability.

In the microwave applicator thus constituted, each of the metallic portion as the outer wall and the dielectric portion disposed on the surface of the metallic portion should have a uniform thickness and the latter is desired to be laminated on the surface of the former in a sufficiently contacted state. To laminate these two portions in a desired state can performed in any of the following manner: (i) a method in which the metallic portion and the dielectric portion are separately fabricated by means of cutting, casting, baking or the like, and the two resultants are laminated by means of oxide soldering process, metal soldering process, high melting point metal processing, or the like; (ii) a method in which the metallic portion and the dielectric portion are separately fabricated by means of cutting, casting, baking or the like, and the two resultants are screwed; and (iii) a method in which the metallic portion is independently fabricated by means of cutting, casting, baking or the like, and a given dielectric material is applied onto the surface of the resultant metallic portion by means of ion plating process, sputtering process, CVD process, coating process, thermal spraying process, or the like.

The surface state of the dielectric portion should be properly determined with due cars on the related factors such as the stress of a film which will be deposited on the surface of the dielectric portion during film formation so that it exhibits a sufficient adhesion to said film. However, it is desired for the surface of the dielectric portion to be provided with minute irregularities. Specifically, the surface of the dielectric portion is desired to be provided with minute irregularities satisfying the ten points-average roughness Rz=1 to 100 m (preferably) or 5 to 50 μm (more preferably).

To form such irregularities at the surface of the dielectric portion may be performed in an appropriate surface finishing or processing manner such as a barrel finishing method, a belt sanding method, an abrasive blasting method, a buffing method, a brushing method, a lapping method, etc.

In the MW-PCVD apparatus of the present invention, as previously described, the microwave applicator is provided with a microwave transmissive member (microwave transmissive window member in other words) at its top portion. The top portion of the microwave applicator at which the microwave transmissive member being disposed is designed to be a pressure durable structure in which the inside of the microwave applicator means is isolated from the atmosphere of the film-forming and is stably maintained without being affected by a change in the pressure outside the microwave applicator means. Particularly, the structure of this part is designed to be in a round, rectangular, bell jar, doublet or conical form in terms of the cross-sectional shape in the direction of microwave to propagate.

As for the thickness of the foregoing microwave transmissive member in the direction of microwave to propagate, it should be determined so that the reflection of microwave at the microwave transmissive member can be minimized, with due cares about the dielectric constant of a material of which said microwave transmissive member is made. For instance, in the case where it is of a plate form, the thickness is desired to be a ½ of the wavelength of microwave.

The dielectric material by which the microwave transmissive member is constituted is desired to be such that permits a microwave energy from the microwave applicator to be efficiently radiated into the film-forming space with a minimum loss and excels in airtightness to prohibit flow of air into the film-forming chamber.

Examples as such material are glasses or fine ceramics such as quartz, alumina, silicon nitride, beryllia, magnesia, boron nitride, silicon carbide, etc.

In the MW-PCVD apparatus, in order to prevent the microwave transmissive member from being damaged because of microwave energy or plasma energy, an appropriate mechanism for uniformly cooling said microwave transmissive member may be provided.

As such cooling mechanism, there can be employed, for example, a cooling mechanism of blowing cooled air over the outside surface of the microwave transmissive member; or a mechanism of cooling the microwave applicator with the use of a cooling medium such as cooled air, water, oil or freon to thereby cool the microwave transmissive member.

In this case, as the microwave transmissive member is cooled and maintained constant at a sufficiently low temperature, it is not damaged with heat even if a microwave energy is applied with a relatively high power into the film-forming space, wherein it is possible to desirably generate plasma of a high electron density.

In the MW-PCVD apparatus of the present invention, the surface of the microwave transmissive member which is situated in the film-forming space and is to be in contact with plasma generated therein is also deposited with a film upon repeating film formation. In this case, it depends upon the kind and the property of the film deposited on said surface of the microwave transmissive member but in general, a microwave energy to be radiated from the microwave applicator is absorbed or reflected by such deposited film to cause reduction in the quantity of microwave energy radiated into the film-forming chamber. As a result, there will sometimes happen such a case that plasma cannot be stably maintained and as a result reduction is caused in the film deposition rate, and the resulting film becomes such that is defective in the property. In order to avoid occurrence of this situation, it is necessary to periodically clean the microwave transmissive member by dry-etching, wet-etching or a mechanical cleaning means. The cleaning of the microwave transmissive member can be desirably carried out by dry-etching the film deposited thereon while maintaining the vacuum of the film-forming chamber. Alternatively, the cleaning of the microwave transmissive member can be also carried out in the following manner. That is, the whole unit of the microwave applicator containing the microwave transmissive member is transported into a load lock chamber being connected to the film-forming chamber without breaking the vacuum of the film-forming chamber, the microwave transmissive member is cleaned by dry-etching or a mechanical cleaning means in said load lock chamber, and said whole unit containing the cleaned microwave transmissive member is returned to the film-forming chamber. In a further alternative, the microwave transmissive member having a deposited film thereon can be replaced by a new one.

Further in addition, it is possible to maintain the microwave transmissive member in a desirable state without being deposited with a film thereon by continuously moving a sheet made of a dielectric material equivalent to the dielectric material constituting the microwave transmissive member along the surface thereof situated in the film-forming space to thereby prevent a film from depositing on said surface and taking out the sheet having a film deposited thereon from the film-forming chamber.

In the MW-PCVD apparatus of the present invention, the film-forming chamber includes the foregoing spacing provided between the foregoing first and second supporting and curving rollers, through which spacing the film-forming space is evacuated by means of an exhaust means to thereby maintain the film-forming space at a predetermined pressure upon film formation.

The size of said spacing is necessary to be designed such that a sufficient exhaust conductance is provided and the microwave energy radiated into the film-forming space is not leaked out of the film-forming chamber.

Particularly, the microwave applicator is arranged such that the face containing the central axis of the foregoing first supporting and curving roller and the central axis of the foregoing second supporting and curving roller is not in parallel to the electric field direction of the microwave to be propagated in the microwave applicator. That is, the foregoing waveguide is arranged such that the face containing the longer edge or the longer axis of said waveguide is not in parallel to the face containing the central axises of the foregoing first and second supporting and curving rollers.

Even in the case where a microwave energy is radiated into the film-forming space by using a plurality of the foregoing microwave applicators, it is necessary for each of the microwave applicators to be arranged in the same way as above described.

As previously described, the maximum size of the width of the foregoing spacing in the longitudinal direction which is provided between the first and second supporting and curving rollers is desired to be made preferably less than ½ or more preferably less than ¼ of the wavelength of microwave used.

Further, in the case where a plurality of the foregoing microwave applicators are provided to the film-forming chamber such that they are situated to be opposite each other in the film-forming, it is necessary to arrange each of them in the way of not causing problems that a microwave energy radiated by one microwave applicator is received by the other microwave applicator and the microwave energy thus received by the latter microwave applicator arrives at the microwave power source for the latter microwave applicator to thereby damage said power source or cause abnormality for the oscillation of microwave power. Particulary in this respect, those microwave applicators are arranged such that the electric field direction of a microwave energy propagating in one microwave applicator is not in parallel to the electric field direction of a microwave energy propagating in other microwave applicator. In other words, those microwave applicators are so arranged that the face containing the longer edge or longer axis of the waveguide connected to one microwave applicator is not in parallel to the other face containing the longer edge or longer axis of the waveguide connected to the other microwave applicator.

In the case where the MW-PCVD apparatus of the present invention is structured such that a microwave energy is radiated through the microwave applicator singly into the film-forming space, it is necessary to design the remaining side face of the film-forming chamber such that a microwave energy is not leaked through that side face. For this purpose, the remaining side face is covered by a electro-conductive member or a perforated member such as metal mesh member or punching board respectively having a plurality of perforations each of which perforations being preferably less than a ½ or more preferably less than ¼ of the wavelength of microwave used to prevent a microwave energy from leaking to the outside of the film-forming chamber.

In the MW-PCVD apparatus, as previously described, it is possible to provide a bias voltage applying means to the film-forming chamber in order to control the potential of plasma generated in the film-forming chamber.

As previously described, the MW-PCVD apparatus of the present invention may include one or more other film-forming vacuum vessels. In this case, each of the vacuum vessels is isolated one from the other by means of a gas gate means capable of allowing transportation of the substrate web from one to the other under vacuum. In the MW-PCVD apparatus, the inside of the film-forming chamber (or vacuum vessel) is desired to maintain at such a pressure which is required for the performance near the minimum value of the modified Pashen's curve. Therefore, the inside pressure of other vacuum vessel connected to the film-forming chamber (vacuum vessel) of the present invention often becomes equivalent or superior to that of the film-forming chamber (vacuum vessel) of the present invention. Thus, it is required that said gas gate means functions to prevent a film-forming raw material gas used in one vacuum vessel from dispersing into the other vacuum vessel. In order to design the gas gate means so as to statisty this requirement, the principle of a gas gate means disclosed in the specification of U.S. Pat. No. 4,438,723 may be employed. Particularly in this respect, the gas gate means is required to stand against a pressure difference of about 106 hold. And as the exhaust pump therefor, there is used an exhaust pump having a high exhausting capacity such as oil diffusion pump, turbo-molecular pump, mechanical booster pump, etc.

The cross-section form of the gas gate means is desired to be in the form of a slit or the like form. The scale thereof is properly designed based on the result obtained by a known conductance computation equation in connection with its full length and the exhausting capacity of the exhaust pump used.

Figure 10:
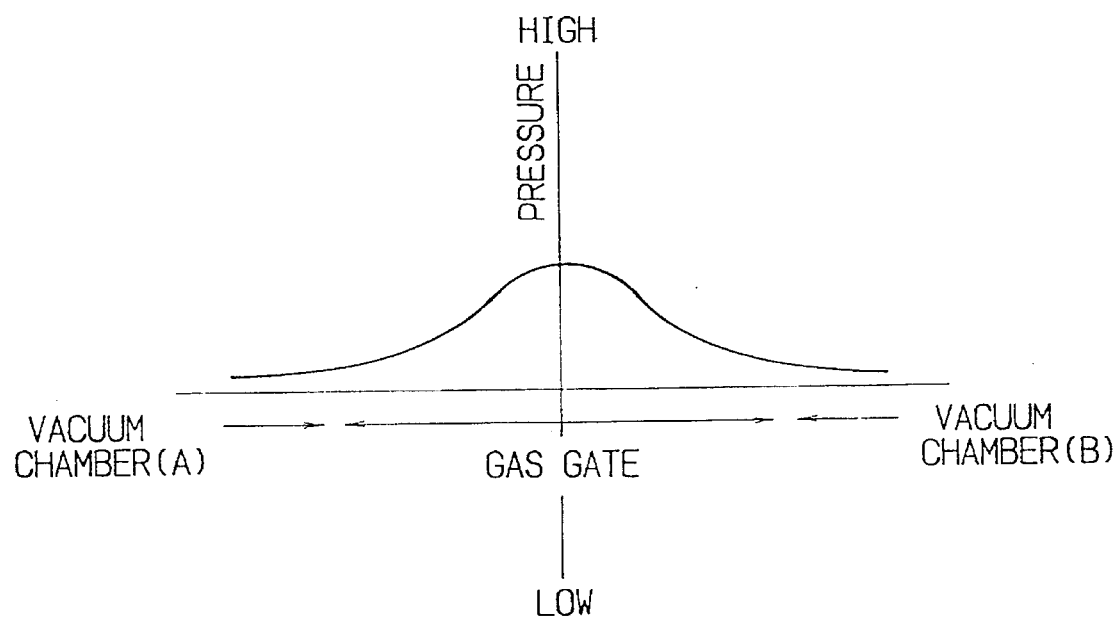
FIGS. 10(a) and 10(b) are schematic graphs respectively for illustrating a pressure gradient in the gas gate in the present invention.
Figure 10:
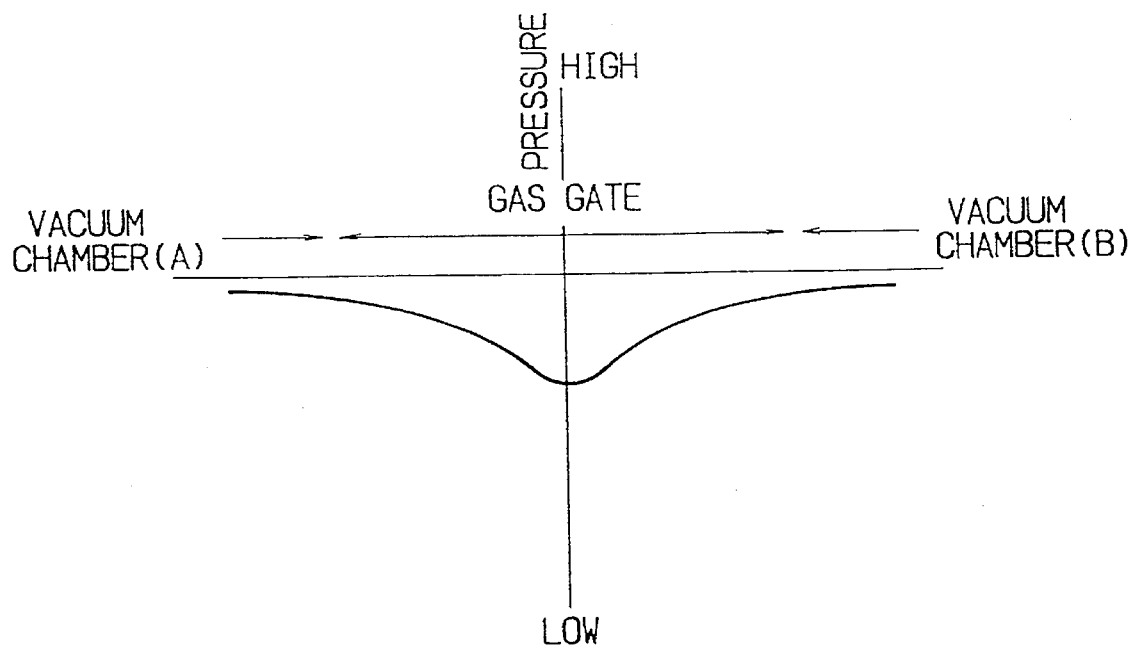

In order to sufficiently isolate one vacuum vessel from the other vacuum vessel, it is desired to use a gate gas. Specific examples of such gate gas are rare gases such as Ar, He, Ne, Kr, Xe, Rn, etc. and dilution gases for diluting a film-forming raw material such as $H_2$. The flow rate of such gate gas can be properly decided depending upon the conductance of the entire gas gate and the exhausting capacity of the exhaust pump used, utilizing the pressure gradient shown in FIG. 10(a) or FIG. 10(b). In the case of FIG. 10(a), it is understood that the point where pressure becomes maximum is situated near the central part of the gas gate and thus, the gate gas dividedly flows from the central part toward the respective adjacent vacuum vessels positioned in the both sides. In the case of FIG. 10(b), it is understood that the point where pressure becomes minimum is situated near the central part of the gas gate and thus, the gate gas is exhausted together with film-forming raw material gases from the adjacent vacuum vessels through the central part. In this connection, in each of these two cases, it is possible to prevent mutual dispersion of the gases used in the adjacent vacuum vessels. In practice, this is done by measuring the amount of a gas to be dispersed by a mass spectrometer or by analyzing the composition of the resultant deposited film to find an optimum condition.

In the MW-PCVD apparatus of the present invention, the film formation in other vacuum vessel than the film-forming chamber of the present invention can be carried out by any known film-forming method such as RF plasma CVD method, sputtering method, reactive sputtering method, ion plating method, light-induced CVD method, thermally induced CVD method, MO-CVD method, MBE method, HR-CVD method, etc. It is also possible to use a microwave plasma CVD method similar to the MW-PCVD method of the present invention.

The frequency of microwave used in the MW-PCVD apparatus of the present invention is preferably of 2.45 GHz, but it is possible to use microwave of other frequency.

The oscillation system in order to provide stable discharge in the film-forming space is desired to be continuous oscillation. And its ripple width is desired to be preferably within 30% or more preferably within 10% in the use output region.

In order to obtain a high quality functional deposited film in the present invention, it is desired to continue film formation without opening the film-forming chamber to the open air. However, there is a limit for the length of a substrate web used. Therefore, it is necessary to connect a new substrate web to the previously used substrate web by means of an appropriate connecting means such as welding. This can be carried out, for example, in a processing chamber arranged next to the chamber containing the pay-out mechanism or the take-up mechanism.

In the following, explanation will be made of the processing of a substrate web upon film formation.

FIG. 9(a) through FIG. 9(j) are, respectively, schematic views for illustrating the outline of the substrate web processing chamber and the operation of the substrate web upon film-formation.

In FIG. 9, 901a represents a first substrate web processing chamber disposed on the side of deliverying the substrate web and 901b represents a second substrate web processing chamber disposed on the side of taking-up the substrate web, in which are contained a pair of rollers 907a or a pair of rollers 907b, respectively made of a fluorine-contained rubber, a pair of cutting blades 908a or 908b and a welding jig 909a or 909b.

Figure 9A:
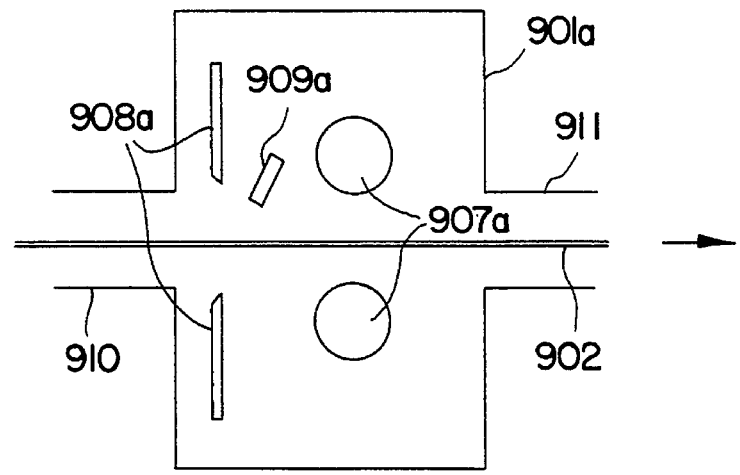
FIGS. 9(a) through 9(j) are schematic explanatory views for illustrating the operations in the substrate web processing chamber in the present invention.

Specifically, FIG. 9(a) shows a state of the usual film-formation, in which the substrate web 902 is moving in the direction indicated by an arrow, and the rollers 907a, the cutting blades 908a and the welding jig 909a are not in contact with the substrate web 902. Reference numeral 910 represents a connection pipe (gas gate) with an initial substrate web container (not shown). Reference numeral 911 represents a connection pipe (gas gate) with a first film-forming chamber (A).

Figure 9B:
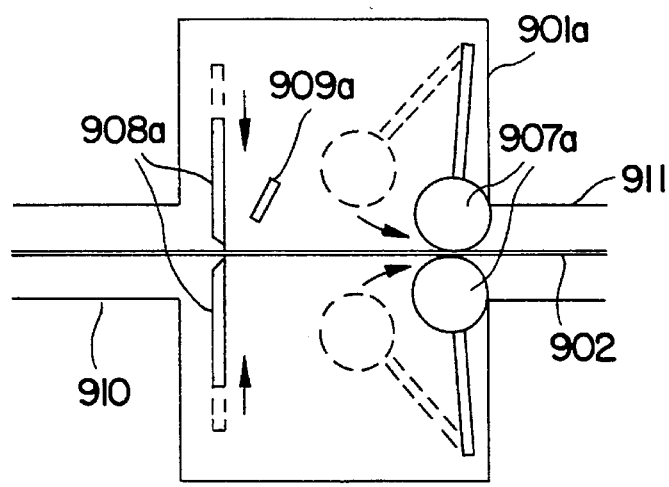

FIG. 9(b) shows a first step for replacing with a new substrate web after the completion of the film-forming step to one roll of the substrate web. At first, the substrate web 902 is stopped, and the rollers 907a are moved from the positions shown by the dotted lines along the directions of arrows shown in the figure, thereby brought into close contact with the substrate web 902 and the wall of the substrate web processing chamber 901a. In this state, the initial substrate web container and the first film-forming chamber are separated in a gas sealed manner of operating the gas gate. Then, the pair of cutting blades 908a are operated in the directions of arrows to cut the substrate web 902. The cutting blades 908a are constituted so as to mechanically, electrically or thermally cut the substrate web 902.

Figure 9C:
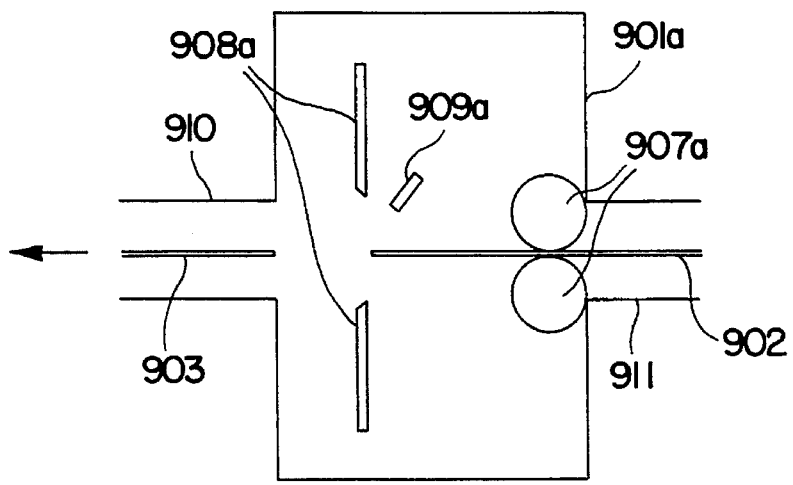

FIG. 9(c) shows a state in which the cut and separated substrate web 903 is taken up on the side of the initial substrate web container.

The above cutting and taking-up steps can be conducted on the inside of the initial substrate web container under a vacuum state or under a state of leaking to atmospheric air.

Figure 9D:
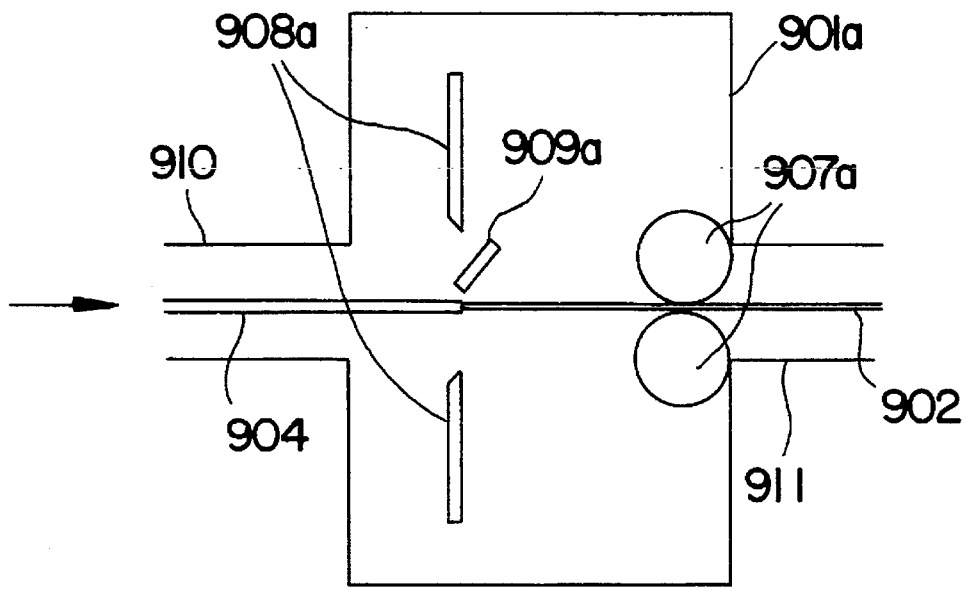

FIG. 9(d) shows a step in which new substrate web 904 is supplied and connected with the former substrate web 902. The substrate webs 904 and 902 are brought into contact at the ends thereof and then connected by welsion using the welding jig 909a.

Figure 9E:
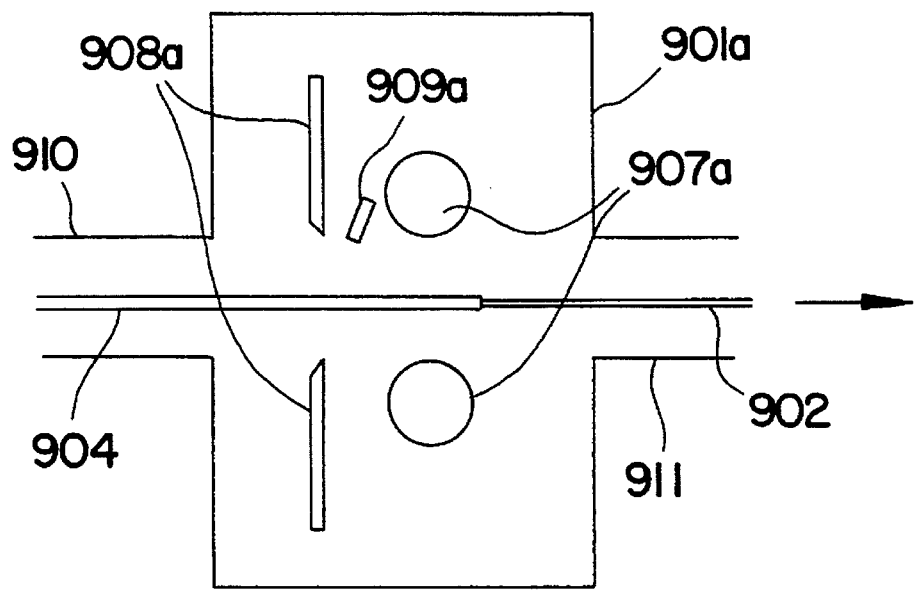

FIG. 9(e) shows a state in which the inside of the first substrate web container (not shown) is evacuated to reduce the pressure difference relative to the film-forming chamber sufficiently and, thereafter, the pair of roller 907a are aparted from the substrate web 902 and the substrate webs 902 and 904 are taken up.

Then, description will be made of the operation on the side of taking-up the substrate web with reference to FIG. 9(f) through FIG. 9(j), in which reference numeral 912 represents a connection pipe (gas gate) with a vacuum vessel (not shown), and reference numeral 913 represents a connection pipe (gas gate) with a substrate web container (not shown).

Figure 9F:
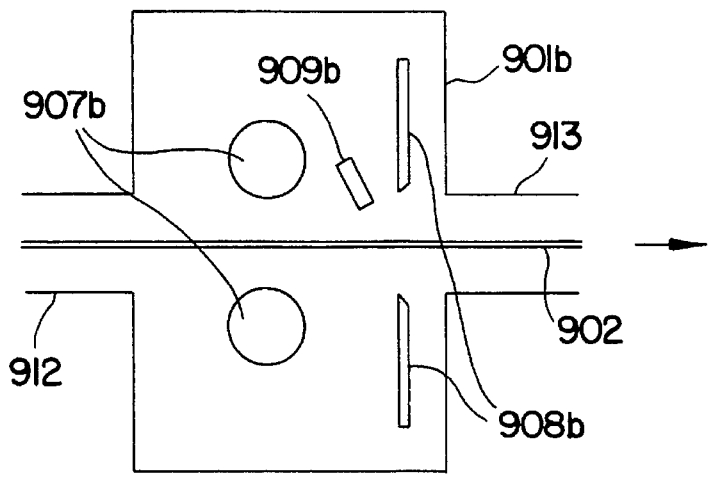

FIG. 9(f) shows a usual film-forming state, in which respective jigs are disposed substantially in symmetry with those described in FIG. 9(a).

Figure 9G:
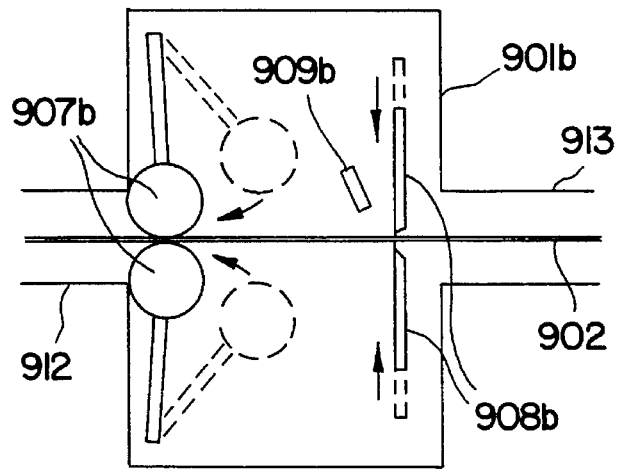

FIG. 9(g) shows a step for taking out one roll of a substrate web after the completion of the film formation thereto, and placing an empty bobbin for taking-up the substrate web applied with the subsequent film-forming step.

At first, the substrate web 902 is stopped, and the pair of rollers 907b are moved from the positions shown by the dotted lines along the directions of arrows shown in the figure and are brought into close contact with the substrate web 902 and the wall of the second substrate web processing chamber 901b. In this state, the foregoing terminal substrate web container and the film-forming chamber are separated in a gas tight manner of operating the gas gate. Then, the pair of cutting blades 908b are moved in the directions of arrows to out the substrate web 902. The cutting blades 908b are constituted with any one of those capable of mechanically, electrically or thermally cutting the substrate web 902.

Figure 9H:
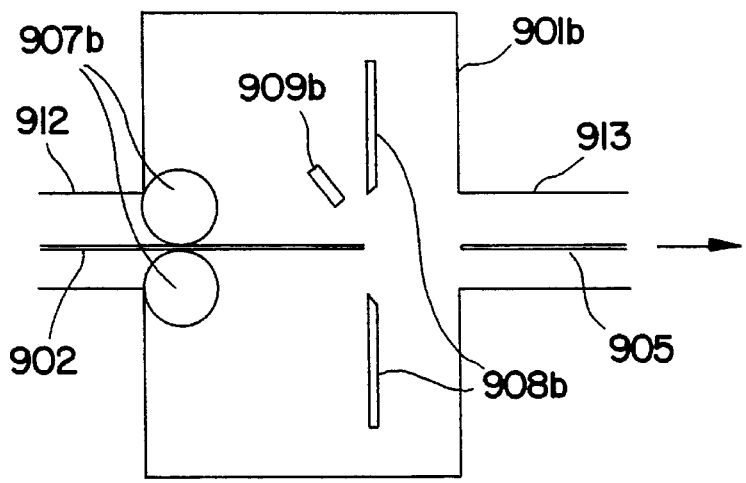

FIG. 9(h) shows the state in which a cut substrate web 905 after the completion of the film-forming step is taken up on the side of the terminal substrate web container.

The above cutting and taking-up steps can be conducted on the inside of the terminal substrate web container under an evacuated state or under a state of leaking to atmospheric.

Figure 9I:
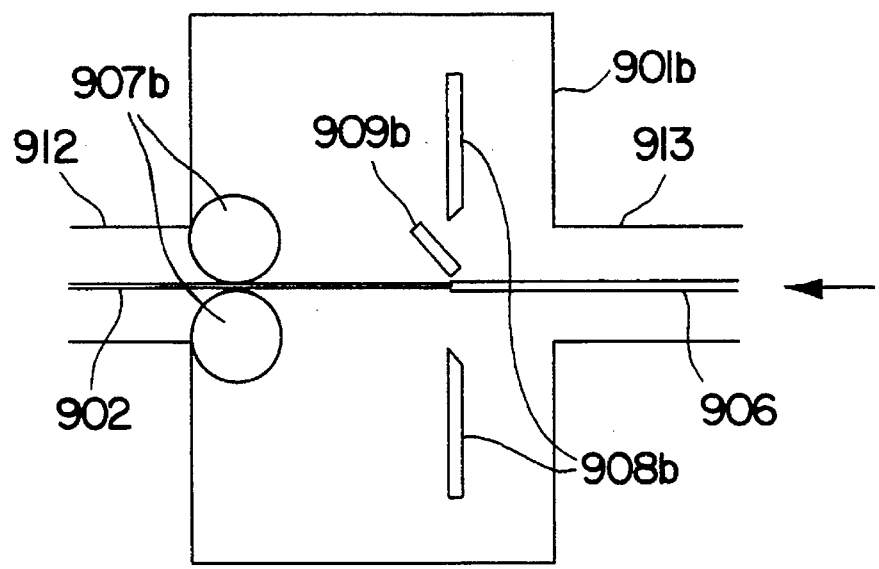

FIG. 9(i) shows a step in which a stand-by substrate web 906 for taking-up use attached to a new taking-up bobbin is supplied and connected with the substrate web 902. The substrate web 906 and the substrate web 902 are in contact with each other at the ends thereof and then connected by welsion using the welding jig 909b.

Figure 9J:
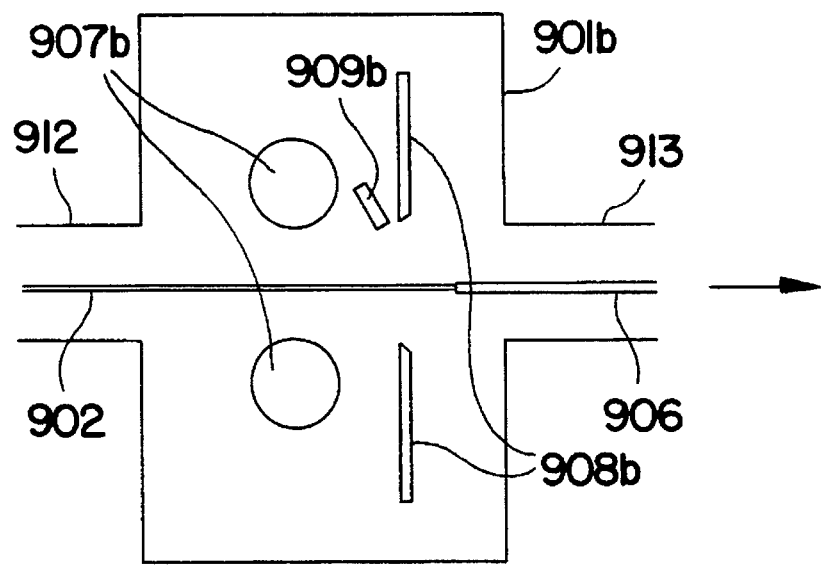

FIG. 9(j) shows a state in which the inside of the terminal substrate web container (not shown) is evacuated to reduce the pressure difference with a film-forming chamber (B) sufficiently and thereafter, the rollers 907b are aparted from the substrate web 902 and the wall of the second substrate web processing chamber 901b and the substrate webs 902 and 906 are being taken up.

As shown in FIG. 9, since the substrate web can be replaced by another substrate web easily while maintaining the evacuated state in the film-forming chamber, the operation efficiency can be remarkably improved. In addition, since the inside of the film-forming chamber is not exposed to the atmospheric pressure, there is not any occasion for the inner wall of the film-forming chamber to be wetted with water, thereby enabling to stably prepare semiconductor devices of high quality.

According to the MW-PCVD apparatus of the present invention, there can be continuously formed a desirable high quality amorphous or crystalline semiconductor film on a large area and lengthy substrate at a high deposition rate and with a high yield.

As such semiconductor film, there can be mentioned, for example, so-called IV Group semiconductor films containing Si, Ge, C, etc.; so-called IV Group alloy semiconductor films containing SiGe, SiC, SiSn, etc.; so-called III-V Group semiconductor films containing GaAs, GaP, GaSb, InP, InAs, etc.; and so-called II-VI Group semiconductor films containing ZnSe, ZnS, ZnTe, CdS, CdSe, CdTe, etc.

As the film-forming raw material gases for forming these semiconductor films in the present invention, there can be used known gaseous or easily gasifiable compounds capable of contributing to the formation of such semiconductor film such as hydrides, halides or organic metal compounds of one or more of the constituent elements of a semiconductor film to be formed.

One or more of these film-forming raw material gases are introduced through the gas feed means or the bias voltage applying means capable of serving as the gas feed means into the film-forming space of the film-forming chamber having the circumferential wall comprising the curved moving substrate web upon film formation.

The gas feed means may comprise a single gas feed pipe or a plurality of gas feed pipes. In any case, the gas feed pipe is desired to be provided with one or more gas liberation holes capable of spouting a film-forming raw material gas into the film-forming space. The gas feed pipe is desirably made of a material which is not damaged by the action of plasma generated in the film-forming space and which permits smooth gas flow. Specifically, the gas feed pipe may be constituted by a heat resistant metal such as stainless steel, nickel, titanium, tangusten, vanadium, nichrome, etc. Other than this, it may be constituted by a member comprising one of these metals applied with a ceramic such as alumina, silicon nitride, etc. to the surface thereof, for example, by means of flame spraying process. In the case of using, as the bias voltage applying means capable of serving also as the gas feed means, a bias voltage applying pipe capable of serving also as a gas feed pipe, a due care should be made so that it is not damaged with the action of plasma generated in the film-forming space and it effectively functions not only as the bias voltage applying means but also as the gas feed means. Thus, the bias voltage applying pipe is necessary to be constituted by an appropriate heat resistant and electroconductive member.

It is possible that the film-forming raw material gas is mixed with an appropriate rare gas or dilution gas and then introduced into the film-forming chamber. Specific examples of such rare gas are He, Ne, Ar, Kr, Xe, Rn, etc. Specific examples of such dilution gas are $H_2$, HF, HCl, etc.

In the present invention, the semiconductor film to be continuously formed on the foregoing substrate web may be controlled with respect to the valence electron or the forbitten band gap by incorporating a valence electron controlling element or a forbitten band gap controlling element into the film upon its formation. In this case, a raw material gas capable of imparting such element is introduced into the film-forming space independently or together with the film-forming raw material gas, optionally while being mixed with the above rare gas or dilution gas.

In the present invention, as previously described, the film-forming raw material gas introduced into the film-forming space is decomposed with the action of a microwave energy to produce a precursor causing the formation of a film on the moving foregoing substrate web.

The MW-PCVD apparatus of the present invention will now be explained more specifically with reference to the drawings as follows. The description is not intended to limit the scope of the present invention.

APPARATUS EMBODIMENT 1

FIG. 1 is a schematic perspective view illustrating the constitution of a typical embodiment of the MW-PCVD apparatus according to the present invention.

In FIG. 1, a substrate web 101 is continuously moved in the direction expressed by an arrow while being curved and projected by a first supporting and curving roller 102 and a second supporting and curving roller 103 to establish a columnar portion to be the circumferential wall of a film-forming chamber 116 having a film-forming space, the two side ends of said columnar portion being supported by a pair of supporting and conveying rings 104 and 105 so that the shape of said columnar portion is maintained in a desired state. Reference numerals 106a through 106e are temperature controlling mechanisms for heating or cooling the substrate web which are provided over the exterior of said circumferential wall comprising the curved moving substrate web. The temperature controlling mechanisms 106a through 106e are designed such that each of them can be independently operated (this part is not shown).

Reference numeral 107 stands for a microwave applicator of the constitution shown in FIG. 2, which is mounted to the film-forming chamber 116 through one of the two side faces thereof such that part of the microwave applicator is plunged into the film-forming space, wherein the exterior portion of said part is comprised of the foregoing specific dielectric material. Likewise, reference numeral 108 stands for the other microwave applicator of the constitution shown in FIG. 2, which is mounted to the film-forming chamber 116 through the remaining side face thereof such that part of the microwave applicator is plunged into the film-forming space, wherein the exterior portion of said part is comprised of the foregoing specific dielectric material. Each of the microwave applicators 107 and 108 is provided with a microwave transmissive member 109 or 110 at its top portion. In FIG. 1, for explanatory purposes, the microwave transmissive member 109 is shown in a state apparted from the side face.

Each of the microwave applicators 107 and 108 is connected through a rectangular waveguide 111 or 112 to a microwave power source (not shown).

The two microwave applicators 107 and 108 are oppositely arranged such that each face containing the long edge of one of said rectangular waveguides 111 and 112 is not perpendicular to each face containing the central axis of one of the rollers 102 and 103 in the film-forming space and also the face containing the long edge of one waveguide is not in parallel to the face containing the long edge of the other waveguide.

In this embodiment, the location of the top portion of each of the two microwave applicators 107 and 108 in the film-forming apace is made to be 5 cm apart from an inner face of the corresponding side face.

However, the location of the top portion of each of the two microwave applicators 107 and 108 in the film-forming apace should be properly adjusted depending upon the width of the substrate web so that desirable plasma may be generated in a uniform state in the film-forming space.

Reference numeral 113 stands for a gas feed pipe provided with one or more gas liberation holes which is extending into the film-forming space.

The gas feed pipe 113 is connected through a flow rate controlling means (not shown) to one or more reservoirs (not shown) containing film-forming raw material gases.

Reference numeral 114 stands for an exhaust means connected through an exhaust valve (not shown) to an exhaust pump (not shown).

Reference numerals 115a and 115b are isolated passages for use in the case where other film-forming chamber (vacuum vessel) is connected to the film-forming chamber 116.

Each of the first and second supporting and curving rollers 102 and 103 contains a transportation speed detecting mechanism and a tensible strength detecting mechanism (these mechanisms are not shown) for detecting and controlling the transportation speed and the tensible strength in order to always maintain the shape of the foregoing columnar portion in a desired state.

In this embodiment, the gas feed pipe 113 may be designed such that it functions also as a bias voltage applying means. In this case, the gas feed pipe 113 is electrically connected through a lead wire (not shown) to a bias power source (not shown), wherein one or more kinds of film-forming raw material gases are spouted into the film-forming space from the gas feed pipe 113 while simultaneously, applying a predetermined bias voltage thereinto through the same gas feed pipe upon film formation.

Alternatively, it is possible to provide an independent bias voltage applying means (not shown) in the film-forming chamber 116. In this case, the independent bias voltage applying means is arranged such that it is in contact with plasma generated in the film-forming space of the film-forming chamber 116. The independent bias voltage applying means may be comprised of one or more bias bars (not shown) electrically connected to a bias power source (not shown).

In a further alternative, it is possible to apply a predetermined bias voltage into the film-forming space through the circumferential wall comprising the curved moving substrate web 101 of the film-forming chamber 116. In this case, the related system is designed such that the circumferential wall is electrically connected to a bias power source (not shown).

These alternatives with respect to bias voltage applying means are applicable in other embodiments of the MW-PCVD apparatus of the present invention which will be hereinafter followed.

APPARATUS EMBODIMENT 2

There can be mentioned the case where the MW-PCVD apparatus shown in Apparatus Embodiment 1 is placed in an isolation vessel.

The isolation vessel can take any shape as long as it can enclose the MW-PCVD apparatus shown in FIG. 1. Among others, cubic shape, rectangular paralleopiped-like shape or cylindrical shape is preferable.

In any case, there is provided an auxiliary gas feed pipe in the space remained between the film-forming chamber and the isolation vessel, wherein a pressure controlling gas such as rare gas or $H_2$ is supplied through said gas feed pipe into the above space in order to prevent occurrence of discharge therein. It is possible to evacuate the above space through the exhaust pipe for the film-forming chamber or by means of an independent exhaust means.

APPARATUS EMBODIMENT 3

There can be mentioned a partial modification of the MW-PCVD apparatus shown in Apparatus Embodiment 1, wherein the cylindrical microwave applicator is replaced by a prismatic-shaped microwave applicator.

The cross-section size of the prismatic-shaped microwave applicator may be equivalent to or different from the size of the waveguide used.

Said size may be enlarged as desired as long as a plurality of modes can not be established to the frequency of microwave used therein.

APPARATUS EMBODIMENT 4

There can be mentioned a partial modification of the MW-PCVD apparatus shown in Apparatus Embodiment 2, wherein the cylindrical microwave applicator is replaced by the same prismatic-shaped microwave applicator as described in Apparatus Embodiment 3.

APPARATUS EMBODIMENTS 5 AND 6

There can be mentioned a partial modification of the MW-PCVD apparatus shown in Apparatus Embodiment 1 and a partial modification of the MW-PCVD apparatus shown in Apparatus Embodiment 2, wherein the cylindrical microwave applicator is replaced by an elliptical microwave applicator in each case.

APPARATUS EMBODIMENT 7

Figure 3:
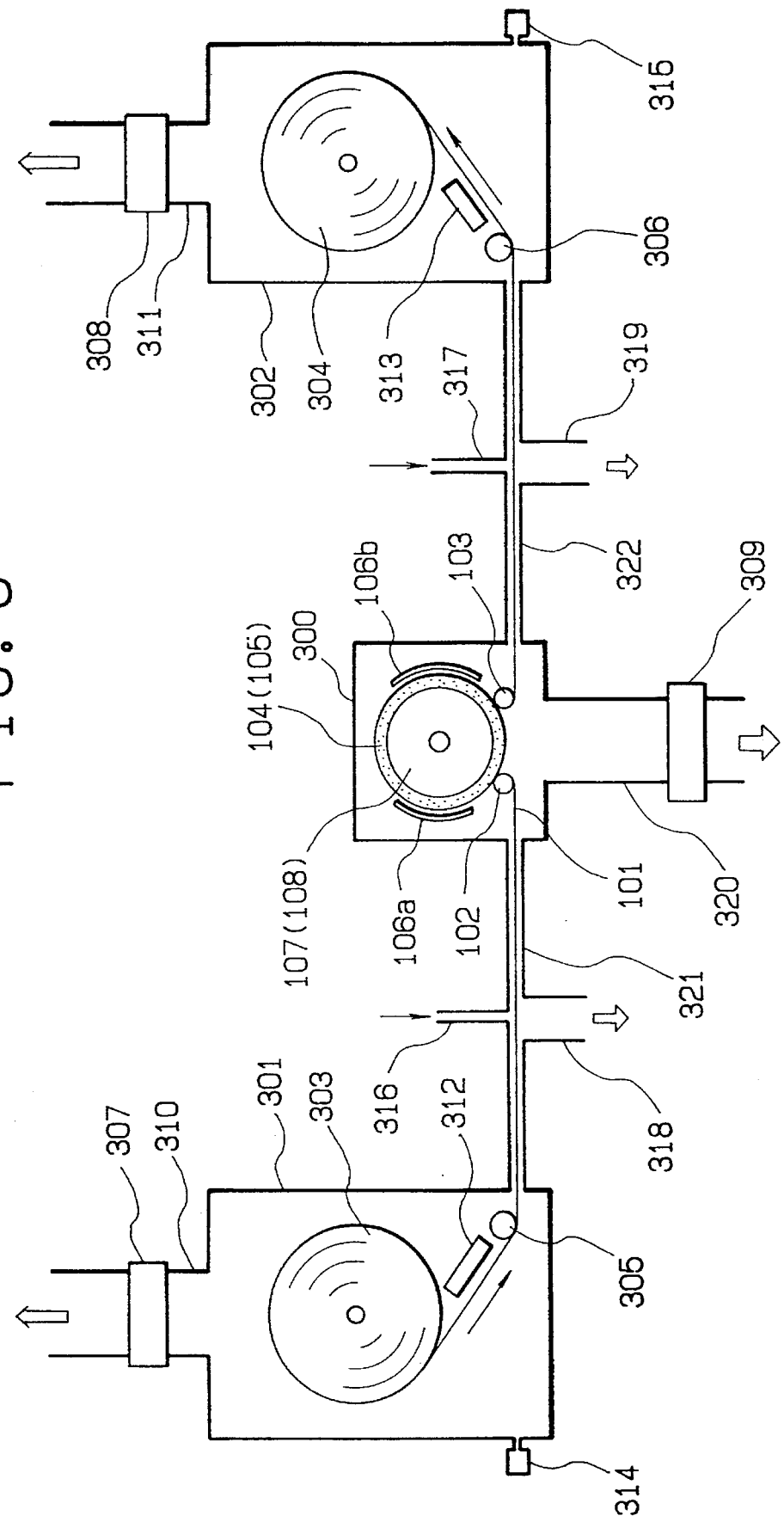
FIG. 3, FIG. 4 and FIG. 5 are schematic explanatory views respectively for illustrating the entire constitution of a representative embodiment of the MW-PCVD apparatus according to the present invention.

There can be mentioned a MW-PCVD apparatus comprising the apparatus shown in Apparatus Embodiment 2 which includes a substrate web feed chamber 301 for paying out a substrate web 101 and an unload chamber 302 for taking up said substrate web as shown in FIG. 3, wherein the substrate web feed chamber 301 is connected through a gas gate 321 to an isolation vessel 300 containing the film-forming chamber of the same constitution as that shown in FIG. 1, and the unload chamber 302 is connected through a gas gate 322 to the isolation vessel 300.

Figure 4:
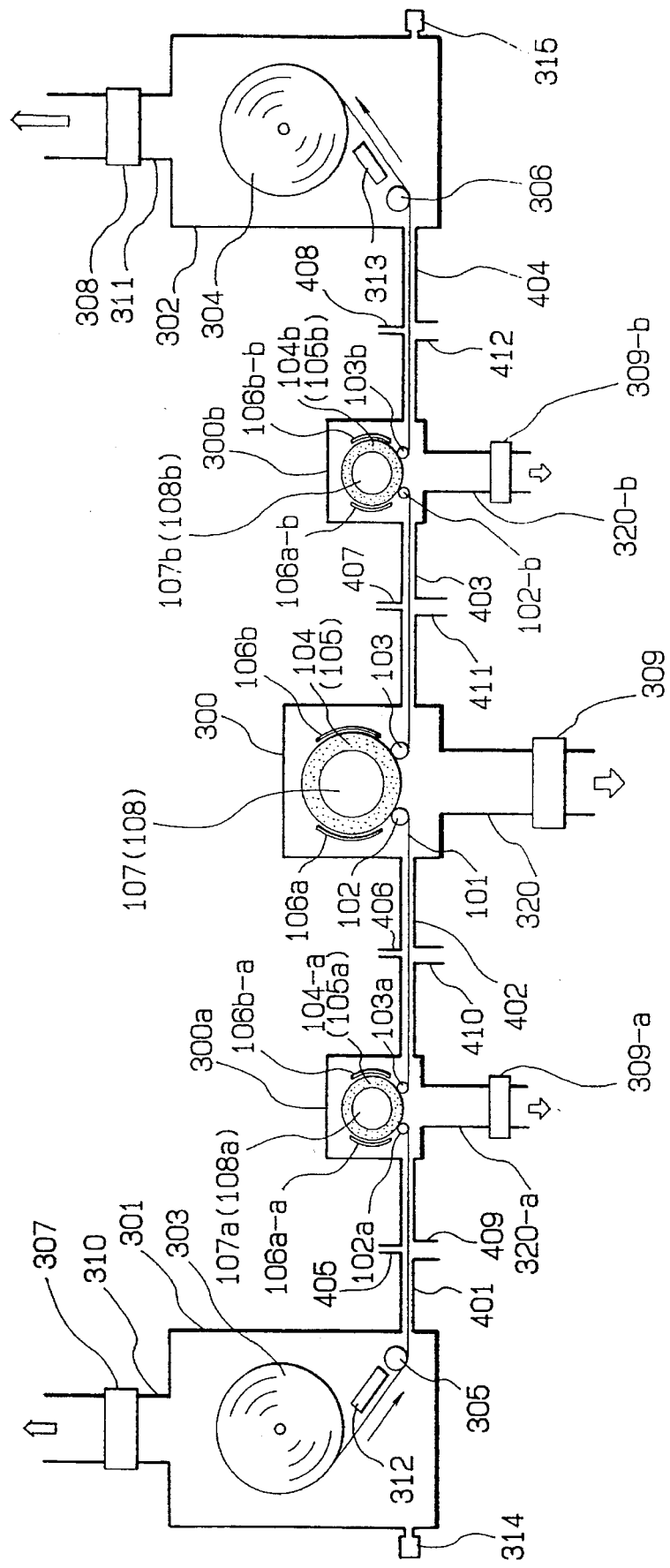

As shown in FIG. 4, the substrate web feed chamber 301 contains a pay-out reel 303 having the substrate web 101 wound thereon and a feed roller 305. The unload chamber 302 contains a take-up reel 304 and a feed roller 306. Each of the chambers 301 and 302 contains a temperature controlling mechanism 312 or 313 for heating or cooling the substrate web 101 and is provided with an exhaust pipe 310 or 311 provided with a slot valve 307 or 308 capable of regulating the exhausting degree.

Each of the chambers 301 and 302 is also provided with a pressure gage 314 or 315.

The substrate web feed chamber 301 may be provided with an appropriate protective sheet feed means for feeding a protective sheet to the rear face of the substrate web 101 to be delivered. Likewise, the unload chamber 302 may be provided with an appropriate protective sheet feed means for feeding a protective sheet to the surface of a film formed on the substrate web 101. As such protective sheet, there can be mentioned a thin film sheet made of a heat resistant resin such as polyimide resin, polyfluoroethylene fiber, etc., or a thin glass wool sheet.

Reference numerals 316 and 317 are gate gas supply pipes. Reference numerals 318 and 319 are exhaust pipes respectively for exhausting a gate gas and sometimes, a film-forming raw material gas.

APPARATUS EMBODIMENT 8

There can be mentioned a MW-PCVD apparatus shown in FIG. 4 which comprises a modification of the apparatus shown in Apparatus Embodiment 3 wherein a MW-PCVD apparatus 300a of the same constitution as that shown in FIG. 1 is additionally arranged between the substrate web feed chamber 301 and the MW-PCVD apparatus 300 and another MW-PCVD apparatus 300b of the same constitution as that shown in FIG. 1 is also arranged between the MW-PCVD apparatus 300 and the unload chamber 302.

The MW-PCVD apparatus in this embodiment is suitable for continuously preparing a multi-layered semiconductor device.

In FIG. 4, reference numerals added with the mark "a" or the mark "b" are used for purposes of distinguishing one from the other among the three MW-PCVD apparatus 300, 300a and 300b being separately arranged. Each of reference numerals 401 through 404 stands for a gas gate. Each of reference numerals 405 through 408 stands for a gate gas supply pipe. Each of reference numerals 409 through 412 stands for a gate gas exhaust pipe.

APPARATUS EMBODIMENTS 9 AND 10

There can be mentioned a partial modification of the MW-PCVD apparatus shown in Apparatus Embodiment 7 and a partial modification of the MW-PCVD apparatus shown in Apparatus Embodiment 8, wherein the cylindrical microwave applicator is replaced by a prismatic-shaped microwave applicator of the same constitution as that used in the MW-PCVD apparatus shown in Apparatus. Embodiment 3 in each case.

APPARATUS EMBODIMENTS 11 AND 12

There can be mentioned a partial modification of the MW-PCVD apparatus shown in Apparatus Embodiment 7 and a partial modification of the MW-PCVD apparatus shown in Apparatus Embodiment 8, wherein the cylindrical microwave applicator is replaced by an elliptical microwave applicator in each case.

APPARATUS EMBODIMENT 13

Figure 5:
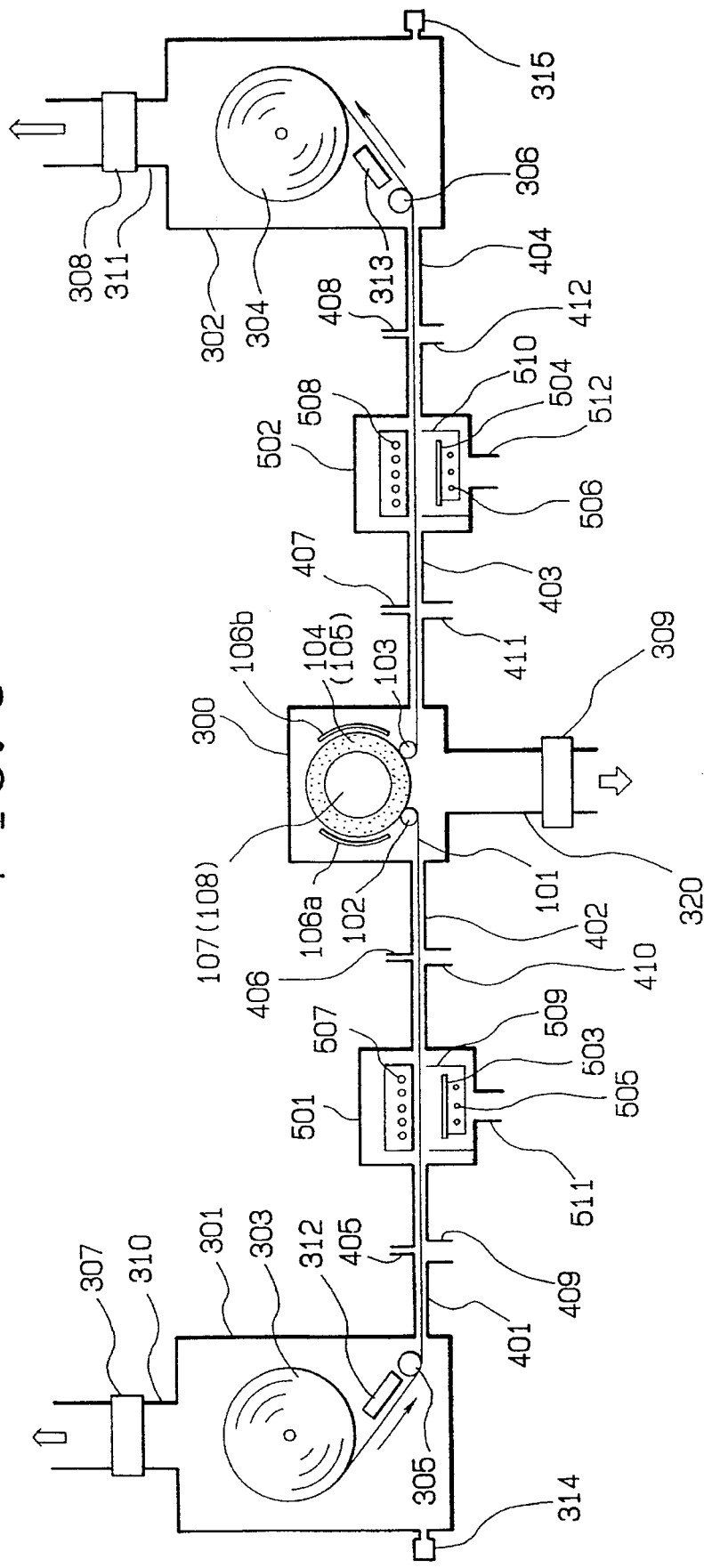

There can be mentioned a MW-PCVD apparatus shown in FIG. 5 which comprises a modification of the MW-PCVD apparatus shown in Apparatus Embodiment 7 wherein a known RF plasma CVD apparatus is additionally arranged between the substrate web feed chamber 301 and the MW-PCVD apparatus 300 and also between said apparatus 300 and the unload chamber 302. The MW-PCVD apparatus in this embodiment is suitable for continuously preparing a multi-layered semiconductor device.

In FIG. 5, each of reference numerals 501 and 502 stands for a vacuum vessel. Each of reference numerals 503 and 504 stands for a RF power applying cathode electrode. Each of reference numerals 505 and 506 stands for a heater containing a plurality of gas feed pipes. Each of reference numerals 507 and 508 stands for a halogen lamp for heating the substrate web 101. Each of reference numerals 509 and 510 stands for an anode electrode. Each of reference numerals 511 and 512 stands for an exhaust pipe.

APPARATUS EMBODIMENTS 14 AND 15

There can be mentioned a partial modification of the MW-PCVD apparatus shown in Apparatus Embodiment 1 and a partial modification of the MW-PCVD apparatus shown in Apparatus Embodiment 2, wherein a cylindrical microwave applicator of the same constitution as that used in each of the embodiments is mounted to the film-forming chamber through one of the two side faces thereof such that it is plunged into the film-forming space in the same manner as described in Apparatus Embodiment 1 and the remaining side face of the film-forming chamber is sealed with a metal mesh member, a punching board or a metal thin plate respectively capable of preventing leakage of microwave energy.

OTHER APPARATUS EMBODIMENTS

Other than those embodiments mentioned above, there can be mentioned further apparatus embodiments as will be hereunder mentioned.

(1) Modifications of the MW-PCVD apparatus described in Apparatus Embodiment 8 wherein each of the isolated vessels 300, 300a and 300b is provided with one or two microwave applicators of various shapes as previously described.

(2) Modifications of the MW-PCVD apparatus described in Apparatus Embodiment 8 wherein the three chambered unit is repeated twice or three times.

(3) Modifications of the MW-PCVD apparatus described in Apparatus Embodiment 8 wherein the three chambered unit added with a known RF plasma CVD apparatus is repeated twice or three times.

According to the present invention, various kinds of semiconductor devices can be continuously and effectively prepared.

As a representative example of those semiconductor devices, there can be mentioned a solar cell of the configuration shown in FIG. 8(a), FIG. 8(b), FIG. 8(c), or FIG. 8(d).

The solar cell 800 shown in FIG. 8(a) is of the type that light is impinged from the side of a transparent electrode.

The solar cell 800 shown in FIG. 8(a) comprises a substrate 801, a lower electrode 802, an n-type semiconductor layer 803, an i-type semiconductor layer 804, a p-type semiconductor layer 805, a transparent electrode 806 and a comb-shaped collecting electrode 807.

The solar cell 800' shown in FIG. 8(b) is of the type that light is impinged from the side of a transparent substrate.

The solar cell 800' shown in FIG. 8(b) comprises a transparent substrate 801, a transparent electrode 806, a p-type semiconductor layer 805, an i-type semiconductor layer 804, an n-type semiconductor layer 803, and a lower electrode 802.

The solar cell shown in FIG. 8(c) is of a so-called tandem type which comprises a first pin junction photovoltaic cell 811 and a second pin junction photovoltaic cell 812 having an i-type layer different from the i-typ layer of the former cell 811 with respect to the band gap or/and the layer thickness, the two cells 811 and 812 being stacked in this order from the side of a substrate 801. For this solar cell, light is impinged from the side of a transparent electrode 806.

The tandem type solar cell shown in FIG. 8(c) comprises a substrate 801, a lower electrode 802, the first photovoltaic cell 811 comprising an n-type semiconductor layer 803, an i-type semiconductor layer 804 and a p-type semiconductor layer 805, the second photovoltaic cell 812 comprising an n-type semiconductor layer 808, an i-type semiconductor layer 809 and a p-type semiconductor layer 810, a transparent electrode 806, and a comb-shaped collecting electrodes 807.

The solar cell shown in FIG. 8(d) is of a so-called triple cell type which comprises a first pin junction photovoltaic cell 820, a second pin junction photovoltaic cell 821 and a third pin junction photovoltaic cell 822, the three cells 820, 821 and 822 being stacked in this order from the side of a substrate 801, wherein the i-type layer of each of said three cells is different one from the other with respect to the band gap or/and the layer thickness. For this solar cell, light is impinged from the side of a transparent electrode 806 disposed on the top cell (the third photovoltaic cell 822).

The solar cell shown in FIG. 8(d) comprises a substrate 801, a lower electrode 802, the first photovoltaic cell 820 comprising an n-type semiconductor layer 803, an i-type semiconductor layer 804 and a p-type semiconductor layer 805, the second photovoltaic cell 821 comprising an n-type semiconductor layer 814, an i-type semiconductor layer 815 and a p-type semiconductor layer 816, the third photovoltaic cell 822 comprising an n-type semiconductor layer 817, an i-type semiconductor layer 818 and a p-type semiconductor layer 819, a transparent electrode 806, and a comb-shaped collecting electrode 807.

For any of the above solar cells, the position of the n-type semiconductor layer may be replaced by the position of the p-type semiconductor layer.

Explanation will be made of the substrate, each constituent semiconductor layer and each constituent electrode in these pin Junction photovoltaic elements of the present invention.

Substrate

As the substrate web (that is the substrate 801 in FIG. 8), it is desired to use such a web member that can be desirably curved to provide the foregoing columnar portion to be the cirumferential wall of the film-forming chamber. It may be electroconductive or electrically insulating, and it may be transparent or opaque. It is necessary to be transparent in the case of preparing a solar cell of the type that light is impinged from the side of the substrate. Particularly, those web member as previously described may be selectively used. According to the present invention, as a substrate web is used as the substrate for the preparation of such solar cell as above described, it enables to mass-produce any of the foregoing solar cells with an improved gas utilization efficiency and with a high yield.

Electrodes

For the solar cell to be provided according to the present invention, an appropriate electrode is optionally used depending upon the configuration of a solar cell to be prepared. As such electrode, there can be mentioned lower electrode, upper electrode (transparent electrode) and collecting electrode. Said upper electrode denotes the one to be placed at the side through which light is impinged, and said lower electrode denotes the one to be placed opposite to the upper electrode through the semiconductor layers to be arranged between the two electrodes.

These electrodes will be explained in the following.

(i) Lower electrode

For the pin junction photovoltaic element according to the present invention, the side through which light is impinged is determined depending upon whether there is used a transparent member or an opaque member as the substrate 801.

In this connection, the position where the lower electrode 802 is to be placed is properly determined upon the kind of the substrate 801 to be used. For example, in the case where an opaque member such as metal member is used as the substrate 801, light for the generation of a photoelectromotive force is impinged from the side of the transparent electrode 806.

Now, in the case where the solar cell is of the configuration shown in FIG. 8(a), FIG. 8(c) or FIG. 8(d), the lower electrode 802 is disposed between the substrate 801 and the n-type semiconductor layer 803.

In the case of FIG. 8(b), there is used a transparent member as the substrate 801 and light is impinged from the side of the substrate 801. In this connection, the lower electrode 802 capable of serving to output a photocurrent is placed on the surface of the top semiconductor layer above the substrate 801. In the case where there is used an electrically insulating member as the substrate 801, the lower electrode 802 capable of serving to output a photocurrent is placed between the substrate 801 and the n-type semiconductor layer 803.

The electrode 802 may be a metallic thin film of a metal selected from the group consisting of Ag, Au, Pt, Ni, Cr, Cu, Al, Ti, Zn, Mo and W. The metallic thin film may be properly formed by way of the known vacuum deposition technique, electron-beam deposition technique or reactive sputtering technique. However, a due care shall be made for the metallic thin film to be thus formed not to be a resistant component for the photovoltaic element. In this respect, the metallic thin film to constitute the electrode 802 is desired to be such that has a sheet resistance of preferably, 50 $\Omega$ or less, more preferably 10 $\Omega$ or less.

In alternative, it is possible to place a diffusion preventive layer comprising an electroconductive material such as zinc oxide between the lower electrode 802 and the n-type semiconductor layer 803. (This is not shown in the figure.)

In the case where such diffusion preventive layer is placed in the way as above mentioned, the following advantages will be expected: it prevents the metal elements constituting the electrode 802 from diffusing into the n-type semiconductor layer 803; by making it to have a certain resistance value, it prevents occurrence of a short circuit, which would otherwise occur between the lower electrode 802 and the transparent electrode 806 through the semiconductor layers being arranged between them due to pinholes and the like; and it serves to generate multiple interferences with the thin film and confines the light as impinged within the photovoltaic element.

(ii) Upper electrode (transparent electrode)

The transparent electrode 806 is desired to have a light transmittance of more than 85% so that it serves to make the semiconductor layer to efficiently absorb sunlight or fluorescent light. In addition to this, it is desired to have a sheet resistance of 100 Ω or less from the viewpoint of preventing the internal resistance of the photovoltaic element from becoming great to result in impairing the performance.

In view of this, the transparent electrode 806 is desired to comprise a thin film of a metal oxide selected from the group consisting of $SnO_2$, $In_2O_3$, ZnO, CdO, $Cd_2SnO_4$ and ITO ($In_2O_3+SnO_2$) or a semitransparent thin film of a metal selected from the group consisting of Au, Al and Cu.

Figure 8:
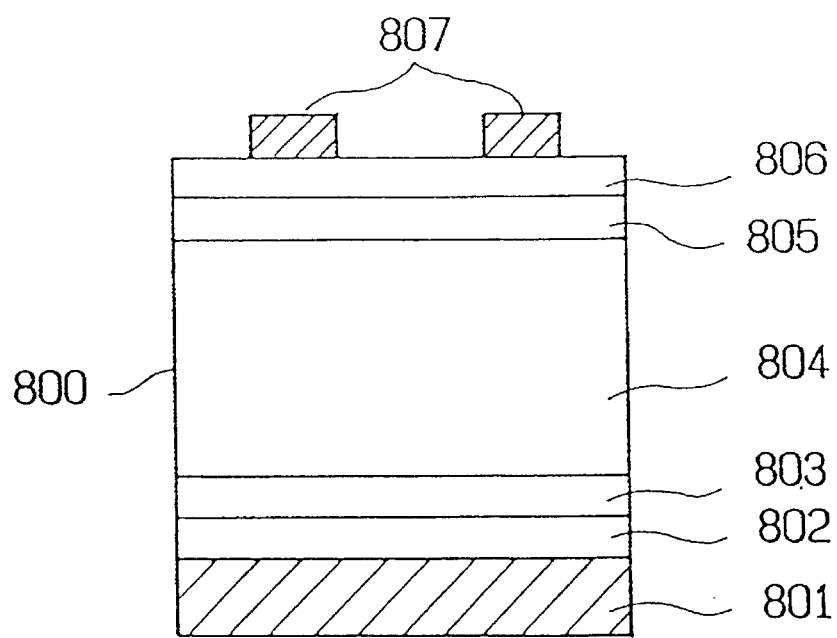
FIGS. 8(A) through 8(D) are schematic cross-section views respectively for illustrating the constitution of a pin junction photovoltaic device prepared in the present invention.
Figure 8:
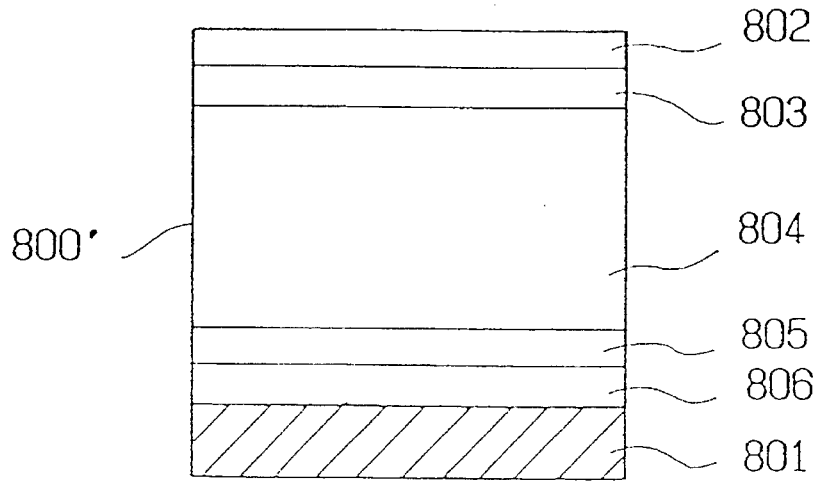
Figure 8:
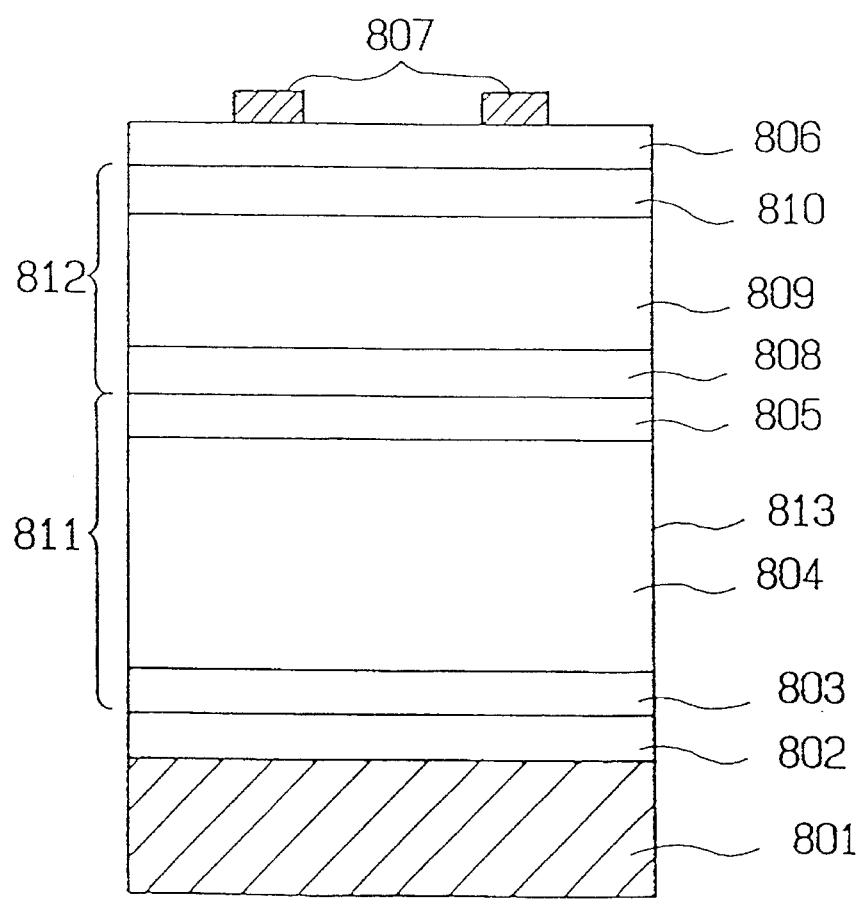
Figure 8:
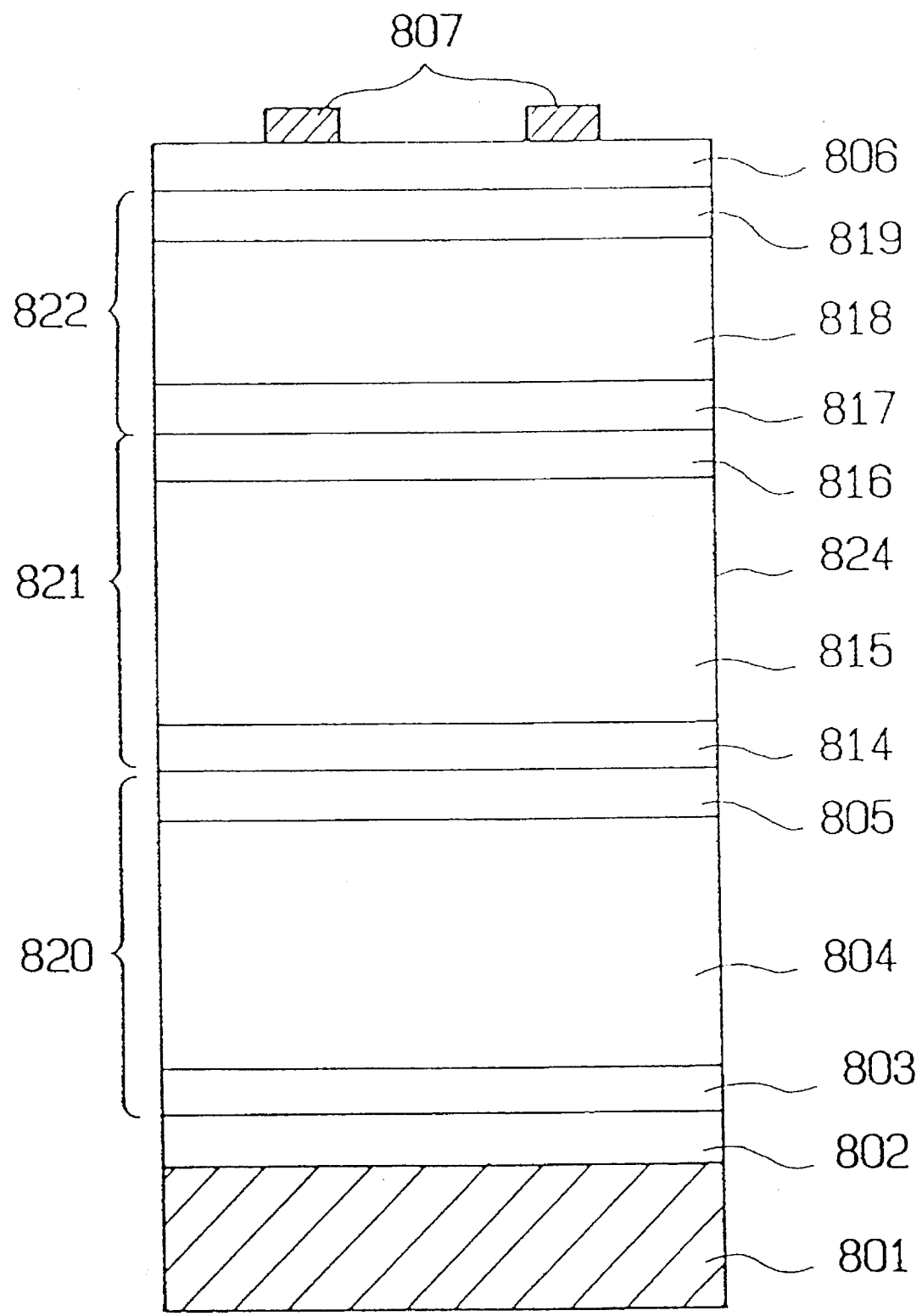

The transparent electrode 806 is disposed on the p-type semiconductor layer 805 in the case of FIG. 8(*a*), FIG. 8(*c*) or FIG. 8(*d*), and it is disposed on the substrate 801 in the case of FIG. 8(*b*).

In any of these cases, it is necessary to constitute the transparent electrode 806 by a thin film member selected from the foregoings which is good in adhesion with the layer or the substrate.

The transparent electrode 806 comprising such thin film may be formed by way of the known resistance heating deposition technique, electron-beam heating deposition technique, reactive sputtering technique or spraying technique.

(iii) Collecting electrode

The collecting electrode 807 in the solar cell according to the present invention is disposed on the transparent electrode 806 for the purpose of reducing the surface resistance of said transparent electrode.

The collecting electrode 807 is desired to comprise a metallic thin film of Ag, Cr, Ni, Al, Ag, Au, Ti, Pt, Cu, Mo, W or alloy of these metals. It is possible for the collecting electrode 807 to be constituted by a member comprising a plurality of such metallic thin films being stacked.

The shape and the area of the collecting electrode 807 are properly designed so that a sufficient quantity of light be impinged into the semiconductor layer.

Specifically as for the shape, it is desired to be such that extends uniformly all over the light receiving face of the photovoltaic element. As for the area, it is desired to correspond to a 15% or less in a preferred embodiment or a 10% or less in a more preferred embodiment respectively of said light receiving face.

And the member of constituting the collecting electrode 807 is desired to be such that has a sheet resistance of preferably 50 Ω or less, more preferably, 10 Ω or less.

i-type semiconductor layer

The i-type semiconductor layer of any of the foregoing solar cells may be formed of an appropriate non-doped semiconductor film.

Specific examples of such non-doped semiconductor film are so-called Group IV semiconductor films or so-called group IV semiconductor alloy films such as a-Si:H, a-Si:F, a-Si:H:F, a-SiC:H, a-SiC:F, a-SiC:H:F, a-SiGe:H, a-SiGe:F, a-SiGe:H:F, poly-Si:H, poly-Si:F, poly-Si:H:F films, etc.

Other than these semiconductor films, so-called compound semiconductor films of Group II-VI or Group III-V are also usable.

n-type semiconductor layer and p-type semiconductor layer

The n-type semiconductor layer of any of the foregoing solar cells may be formed of an n-type semiconductor film obtained by doping any of the films mentioned in the case of the i-type semiconductor layer with an n-type dopant.

Likewise, the p-type semiconductor layer of any of the foregoing solar cells may be formed of a p-type semiconductor film obtained by doping any of the films mentioned in the case of the i-type semiconductor layer with a p-type dopant.

The features and the effects of the present invention will be described more in detail referring to the following production examples.

It should, however, be noted that the present invention is not restricted only to these examples.

PRODUCTION EXAMPLE 1 AND COMPARATIVE PRODUCTION

Example 1

Production Example 1

Figure 7:
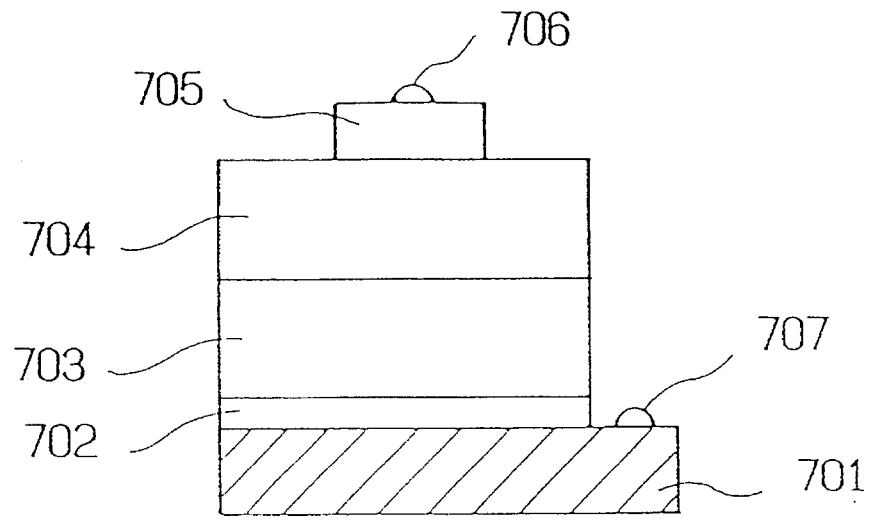
FIG. 7 is a schematic cross-section view of a Shottky diode prepared in the present invention.

There was prepared a Schottky junction type diode of the configuration shown in FIG. 7, using the MW-PCVD apparatus described in Apparatus Embodiment 7 (having the constitution shown in FIG. 3).

The Schottky junction type diode shown in FIG. 7 comprises a substrate 701, a lower electrode 702, an $n^+$-type semiconductor layer 703, a non-doped semiconductor layer 704, a metallic layer 705, and a pair of current outputting terminals 706 and 707.

Firstly, there was provided a continuous sputtering apparatus. A well cleaned SUS 430 BA (stainless steel) substrate web of 45 cm in width, 0.25 mm in thickness and 200 m in length as the substrate 701 was set to said sputtering apparatus, wherein a Cr target (99.98% purity) was used to deposit a 1300 Å thick Cr film to be the lower electrode 702 on the surface of the substrate web.

A pay-out reel 303 having the substrate web 101 having the lower electrode comprising the Cr thin film being formed on the surface thereof wound thereon was set in the substrate web feed chamber 301. The substrate web 101 was paid out from the pay-out reel, it was passed through the gas gate 321, the transportation mechanism of the isolated vessel 300 and the gas gate 322, and it was fixed to the take-up reel 304 of the unload chamber 302. Wherein, the substrate web was adjusted not to have any loosing part. In this case, the substrate web was set such that the Cr layer formed thereon was faced downward.

The size of the columnar portion to be the circumferential wall of the film-forming chamber and the foregoing spacing L were made as shown in Table 6. As each of the pair of microwave applicators, there was used one shown in Table 6. The substrate web feed chamber 301, the isolated vessel 300, and the unload chamber 302 were provisionally evacuated respectively by means of a rotary vacuum pump (not shown). These three vessels were then evacuated respectively by means of a mechanical booster pump (not shown) to a vacuum of about $10^{-3}$ Torr.

The substrate web 101 was heated to and maintained at a temperature of about 250° C. by the temperature controlling mechanisms 106*a* and 106*b* in the isolated vessel 300. The inner pressure of the isolated vessel was regulated to a vacuum of less than $5\times10^{-6}$ Torr by means of an oil diffusion pump (not shown).

Thereafter, $SiH_4$ gas, $SiF_4$ gas, $PH_3/H_2$ gas (diluted to 1% with $H_2$ gas), and $H_2$ gas were fed through a gas feed pipe (not shown) into the film-forming space at respective flow rates of 300 sccm, 4 sccm, 55 sccm and 150 sccm. The gas pressure in the film-forming space was controlled to and maintained at about 5m Torr by regulating the opening of the slot valve 309 of the exhaust pipe 320.

After the flow rates of the four gases and the gas pressure in the film-forming space became stable respectively, a microwave power source (not shown) was switched on to radiate a microwave energy (2.45 GHz) through the pair of microwave applicators 107 and 108 into the film-forming space with an effective power of 1KW (×2), wherein discharge was caused to provide a plasma region in the film-forming space. Then, the first and second supporting and curving rollers 102 and 103 and the pair of supporting and conveying rings 104 and 105 were started rotating respectively by a driving mechanism (not shown) to transport the substrate web at a speed of 60 cm/min. from the left side to the right side in the FIG. 3 for 5 minutes. In this case, $H_2$ gas as the gate gas was fed into the gas gates 321 and 322 through the gate gas supply pipes 316 and 317 at a flow rate of 50 sccm. And the gas gates 321 and 322 were evacuated through the exhaust pipes 318 and 319 by means of an oil diffusion pump (not shown) to bring their insides to and maintain at a vacuum of 1.5m Torr.

As a result, there was formed an n+-type a-Si:H:F film doped with P as the n+-type semiconductor later 703 on the Cr layer as the lower electrode 702 previously formed on the substrate web. Thereafter, the application of the microwave energy and the introduction of the film-forming raw material gases were suspended. At the same time, the transportation of the substrate web was stopped.

Then, the isolated vessel 300 was evacuated to a vacuum of less than $5 \times 10^{-6}$ Torr.

Following the procedures in the above film formation, $SiH_4$ gas, $SiF_4$ gas and $H_2$ gas were fed into the film-forming space at respective flow rates of 250 sccm, 3 sccm and 200 sccm. The gas pressure in the film-forming space was maintained at about 6m Torr. Then, a microwave energy (2.45 GHz) was radiated into the film-forming space with an effective power of 0.8KW (×2). Upon generation of microwave plasma, the substrate web 101 was transported from the right side to the left side at a transportation speed of 60 cm/min. Film formation was performed for 6 minutes.

As a result, there was formed a non-doped a-Si:H:F film as the non-doped semiconductor layer 704 on the previously formed n+-type a-Si:H:F film.

Thus, there was formed a Shottky Junction type diode element on the substrate web.

After the above film formation completed, the application of the microwave energy, the introduction of the film-forming raw material gas, and the transportation of the substrate web were all terminated. The residual gas in the isolated vessel 300 was exhausted. After the substrate web being cooled to room temperature, the substrate web was taken out from the substrate web feed chamber 301 which served as the unload chamber in the case of the last film formation.

Comparative Production Example 1

The procedures of Production Example 1 were repeated, except that the two microwave applicators were replaced by a pair of microwave applicators respectively of the same constitution as that of the microwave applicator used in Production Example 1 except for not having any dielectric coat on the exterior of the outer wall, to thereby form a Shottky junction type diode element on the substrate web.

Evaluation

Each of the resultants obtained in Production Example 1 and the resultant obtained in Comparative Example 1 was evaluated as follows.

That is, the substrate web having the foregoing three layers being laminated thereon was randomly cut off to obtain ten specimens respectively of an identical size.

Each of the ten specimens was applied with a 80 Å thick Au film as the metallic layer 705 by an electron beam evaporation method. Then, a pair of current outputting terminals 706 and 707 were provided thereto by using a wire bonder.

Each of the resultants was examined with respect to diode characteristics by using a PA (pico-ampere) Meter/DC Voltage Source (HP 4140B: trademark name, product by Hewlett Packard Company).

As a result, each of the ten specimens in Production Example 1 exhibited a desirable diode factor (n=1.15± 0.05) and about 6 digits for the rectification ratio at ±1 V. On the other hand, any of the ten specimens in Comparative Production Example 1 was inferior any of the specimens in Production Example 1 with respect to any of the evaluation items, and inferior by more than 7% as for the diode factor. As a result, it was found that any of the ten specimens in Production Example 1 excels in the diode characteristics desired for the Schottky junction type diode.

PRODUCTION EXAMPLE 2 AND COMPARATIVE PRODUCTION EXAMPLE 2

Production Example 2

There was prepared a pin junction photovoltaic element of the configuration shown in FIG. 8(a), using the three film-forming chambered MW-PCVD apparatus shown in FIG. 4.

There was used a PET substrate web as the substrate web 101 in FIG. 4.

The PET substrate web was set to a continuous sputtering apparatus, wherein a 1000 Å thick Ag film as a electroconductive layer was formed on said substrate web by sputtering an Ag target (99.99%). Successively, a 1.2 µm thick ZnO film as the lower electrode 802 was formed on the previously formed Ag film by sputtering a ZnO target (99.999%).

The substrate web having the Ag thin film and the ZnO thin film being laminated thereon was set to the three film-forming chambered MW-PCVD apparatus having the constitution shown in FIG. 4 in the same manner as in Production Example 1.

In this case, the size of the columnar portion provided in the isolated vessel 300 was made to be 20 cm in inside diameter as shown in Table 7. Likewise, the size of the columnar portion in the isolated chamber 300a and the size of the columnar portion in the isolated chamber 300b were made to be 10 cm and 9 cm in inside diameter. As each of the pair of microwave applicators 107 and 108 to be mounted to the film-forming chamber in the isolated vessel 300, there was used one shown in Table 7. Likewise, as each of the pair of microwave applicators 107a and 108a to be mounted to the film-forming chamber in the isolated vessel 300a and also as each of the pair of microwave applicator means 107b and 108b in the isolated vessel 300b, there were used those shown in Table 8.

There was caused microwave discharge in each of the three film-forming chambers under the respective conditions shown in Table 7 for the isolated vessel 300 and in Table 8 for the isolated vessels 300a and 300b. After the state of the discharge in each of the three film-forming chamber became stable, the substrate web started moving at a transportation speed of 55 cm/min. from the left side to the right side. Thus, there were continuously formed an n-type a-Si:H:F film doped with P to be the n-type semiconductor layer 803 in the film-forming chamber of the isolated vessel 300a under the film-forming conditions shown in Table 8, a non-doped a-Si:H:F film to be the i-type semiconductor layer 804 in the film-forming chamber of the isolated vessel 300 under the film-forming conditions shown in Table 7, and a p+-type microcrystal Si:H:F film doped with B to be the p-type semiconductor layer 805 in the film-forming chamber of the isolated vessel 300b under the film-forming conditions shown in Table 8 respectively on the moving substrate in the same manner as in Production Example 1.

The substrate web having the foregoing n-type, i-type and p+-type semiconductor layers being lamined on the lower electrode comprising the foregoing ZnO thin film was cooled to room temperature in the unload chamber 302 and it was taken out therefrom. This substrate web was set to a reactive sputtering apparatus, wherein a 700 Å thick ITO film as the transparent electrode 806 was formed thereon. Then, the resultant was cut off to obtain a plurality of specimens respectively of 35 cm×70 cm in size. Each of the specimens thus obtained was applied with a comb-shaped collecting electrode comprising an about 1 μm thick Ag film onto the surface thereof by an electron beam evaporation method.

Thus, there were obtained a plurality of solar cell modules respectively of the pin junction type.

Comparative Production Example 2

The procedures of Production Example 2 were repeated, except that each pair of the microwave applicators in each of the three isolated vessels were replaced by each pair of microwave applicators respectively of the same constitution as those microwave applicator used in Production Example 2 except for not having any dielectric coat on the exterior of their outer wall, to thereby obtain a plurality of solar cell modules respectively of the pin junction type.

Evaluation

Each of the resultants obtained in Production Example 1 and the resultant obtained in Comparative Example 1 was evaluated as follows.

That is, for each of the resultants, the photovoltaic characteristics were evaluated under irradiation of AM 1.5 light (100 mW/cm$^2$). As a result, every module obtained in Production Example 2 exhibited a photoelectric conversion efficiency of more than 8.3%, which was surpassing any of the modules obtained in Comparative Production Example 2 by more than 0.2%. As for each of the modules obtained in Production Example 2, the unevenness with respect to the characteristics among the modules was within 4%. On the other hand, it was more than 5% as for the comparative moduled.

Further, each of the modules was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10% as for any of the modules in Production Example 2. On the other hand, it was 12% or more as for the comparative modules.

Further in addition, as for each module, the rate of occurrence of pinholes was examined by a conventional method. As a result, said rate of any of the modules in Production Example 2 was less than one third over that of any of the comparative modules.

The modules obtained in Production Example 2 were properly combined to obtain a power supply system. It was found that the resultant system outputs a power of about 3 KW.

There was prepared a power supply system from the comparative modules in the same manner as in the above, which was then examined with respect to its power output. As a result, it was inferior to the former by about 10%.

PRODUCTION EXAMPLE 3

There was prepared a pin junction photovoltaic element of the configuration shown in FIG. 8(a) by repeating the procedures of Production Example 2, except that in stead of the a-Si:H:F film as the i-type semiconductor layer, there was formed a non-doped a-SiGe:H:F film in the same manner as in Production Example 2 under the conditions shown in Table 9, wherein the substrate web was maintained at 200° C. and the substrate web was moved at a transportation speed of 52 cm/min.

The resultant was processed in the same manner as in Production Example 2 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 7.3%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 4

There was prepared a pin junction photovoltaic element of the configuration shown in FIG. 8(a) by repeating the procedures of Production Example 2, except that in stead of the a-Si:H:F film as the i-type semiconductor layer, there was formed a non-doped a-SiC:H:F film in the same manner as in Production Example 2 under the conditions shown in Table 10, wherein the substrate web was maintained at 200° C. and the substrate web was moved at a transportation speed of 50 cm/min.

The resultant was processed in the same manner as in Production Example 2 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 6.6%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 5

There was prepared a photovoltaic element of the configuration shown in FIG. 8(c), using a modification of the three film-forming chambered MW-PCVD apparatus shown in FIG. 4 wherein a first isolated vessel 300a' equivalent to the isolation vessel 300a, a second isolated vessel 300' equivalent to the isolated vessel 300 and a third isolated vessel 300b' equivalent to the isolated vessel 300b are additionally arranged between the isolated vessel 300b and the unload chamber 302 and these three isolated vessels are connected each other by means of gas gates (not shown).

As the substrate web 101, there was used a substrate web made of SUS 430 BA of the same kind as that used in Production Example 1.

Firstly, the substrate web was applied with a 1.2 μm thick ZnO film as the lower electrode 802 to the surface thereof in the same manner as in Production Example 2.

Then, the substrate web was set to the foregoing modified six film-forming chambered MW-PCVD apparatus. The lower cell 811 was formed using the first unit comprising the isolated vessels 300a, 300 and 300b in the same manner as in Production Example 3 and under the conditions shown in Table 11, and the upper cell 812 was formed using the second unit comprising the isolated vessels 300a, 300' and 300b' in the same manner as in Production Example 2 under the conditions shown in Table 11.

The resultant was applied with a ITO thin film as the transparent electrode 806 to the surface of the top layer thereof in the same manner as in Production Example 2.

The product thus obtained was cut off to obtain a plurality of specimens respectively of 35 cm×70 cm in size.

Each of the specimens was applied with a comb shaped Ag film as the collecting electrode 807 to the surface of the ITO film as the transparent electrode 806 in the same manner as in Production Example 2.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 10.5%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.5%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 6

There was prepared a photovoltaic element of the configuration shown in FIG. 8(c), using the same six film-forming chambered MW-PCVD apparatus as used in Production Example 5.

As the substrate web 101, there was used a substrate web made of SUS 430 BA of the same kind as that used in Production Example 1.

Firstly, the substrate web was applied with a 1.2 um thick ZnO film as the lower electrode 1202 to the surface thereof in the same manner as in Production Example 2.

Then, the substrate web was set to the six film-forming chambered MW-PCVD apparatus. The lower cell 811 was formed using the first unit comprising the isolated vessels 300a, 300 and 300b in the same manner as in Production Example 2 and under the conditions shown in Table 12, and the upper cell 812 was formed using the second unit comprising the isolated vessels 300a', 300' and 300b' in the same manner as in Production Example 4 under the conditions shown in Table 12.

The resultant was applied with a ITO thin film as the transparent electrode 806 to the surface of the top layer thereof in the same manner as in Production Example 2.

The product thus obtained was cut off to obtain a plurality of specimens respectively of 35 cm×70 cm in size.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 10.2%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.5%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 7

There was prepared a triple cell type photovoltaic element of the configuration shown in FIG. 8(d), using a modification of the six film-forming chambered MW-PCVD apparatus used in Production Example 5, wherein a first isolated vessel 300a" equivalent to the isolation vessel 300a, a second isolated vessel 300" equivalent to the isolated vessel 300 and a third isolated vessel 300b" equivalent to the isolated vessel 300b are additionally arranged between the isolated vessel 300b' and the unload chamber 302 and these three isolated vessels are connected each other by means of gas gates (not shown).

As the substrate web 101, there was used a substrate web made of SUS 430 BA of the same kind as that used in Production Example 1.

Firstly, the substrate web was applied with a 1.2 μm thick ZnO film as the lower electrode 802 to the surface thereof in the same manner as in Production Example 2.

Then, the substrate web was set to the foregoing modified nine film-forming chambered MW-PCVD apparatus. The lower cell 820 was formed using the first unit comprising the isolated vessels 300a, 300 and 300b in the same manner as in Production Example 3 and under the conditions shown in Table 13. The middle cell 821 was formed using the second unit comprising the isolated vessels 300a', 300' and 300b' in the same manner as in Film Production Example 2 under the conditions shown in Table 13. And the upper cell 822 was formed using the third unit comprising the isolated vessels 300a", 300" and 300b" in the same manner as in Production Example 4 and under the conditions shown in Table 13.

The resultant was applied with a ITO thin film as the transparent electrode 806 to the surface of the top layer thereof in the same manner as in Production Example 2.

The product thus obtained was cut off to obtain a plurality of specimens respectively of 35 cm×70 cm in size.

Each of the specimens was applied with a comb shaped Ag film as the collecting electrode 807 to the surface of the ITO film as the transparent electrode 806 in the same manner as in Film Formation Example 2.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 10.5%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 8

There was prepared a pin junction photovoltaic element of the configuration shown in FIG. 8(a), using a modification of the three film-forming chambered MW-PCVD apparatus shown in FIG. 4, in which the gas feed pipe in each of the isolated vessels 300a, 300 and 300b is designed such that it functions also as a bias voltage applying means as described in Apparatus Embodiment 1.

There was used a PET substrate web as the substrate web 101.

The PET substrate web was set to a continuous sputtering apparatus, wherein a 1000 Å thick Ag film as a electroconductive layer was formed on said substrate web by sputtering an Ag target (99.99%). Successively, a 1.2 µm thick ZnO film as the lower electrode 802 was formed on the previously formed Ag film by sputtering a ZnO target (99.999%).

The substrate web having the Ag thin film and the ZnO thin film being laminated thereon was set to the modified three film-forming chambered MW-PCVD apparatus in the same manner as in Production Example 1.

In this case, the size of the columnar portion provided in the isolated vessel 300 was made to be 20 cm in inside diameter as shown in Table 7. Likewise, the size of the columnar portion in the isolated chamber 300a and the size of the columnar portion in the isolated chamber 300b were made to be 10 cm and 9 cm in inside diameter. As each of the pair of microwave applicators 107 and 108 to be mounted to the film-forming chamber in the isolated vessel 300, there was used one shown in Table 7. Likewise, as each of the pair of microwave applicators 107a and 108a to be mounted to the film-forming chamber in the isolated vessel 300a and also as each of the pair of microwave applicator means 107b and 108b in the isolated vessel 300b, there were used those shown in Table 8.

There was caused microwave discharge in each of the three film-forming chambers under the conditions shown in Table 7 for the isolated vessel 300 while applying a bias voltage of 190 V (500 Hz) through the gas feed pipe into the film-forming space and the conditions in Table 8 for the isolated vessels 300a and 300b while applying a bias voltage of a DC bias voltage of 80 V/7.0 A through the gas feed pipe into the film-forming space of the isolated vessel 300a and applying a DC bias voltage of 90 V/7.5 A through the gas feed pipe into the film-forming space of the isolated vessel 300b. After the state of the discharge in each of the three film-forming chambers became stable, the substrate web started moving at a transportation speed of 55 cm/min. from the left side to the right side. Thus, there were continuously formed an n-type a-Si:H:F film doped with P to be the n-type semiconductor layer 803 in the film-forming chamber of the isolated vessel 400a, a non-doped a-Si:H:F film to be the i-type semiconductor layer 804 in the film-forming chamber of the isolated vessel 300, and a p+-type microcrystal Si:H:F film doped with B to be the p-type semiconductor layer 805 in the film-forming chamber of the isolated vessel 300b respectively on the moving substrate in the same manner as in Production Example 1.

The substrate web having the foregoing n-type, i-type and p+-type semiconductor layers being lamined on the lower electrode comprising the foregoing ZnO thin film was cooled to room temperature in the unload chamber 302 and it was taken out therefrom. This substrate web was set to a reactive sputtering apparatus, wherein a 700 Å thick ITO film as the transparent electrode 806 was formed thereon. Then, the resultant was cut off to obtain a plurality specimens respectively of 35 cm×70 cm in size. Each of the specimens thus obtained was applied with a comb-shaped collecting electrode 806 comprising an about 1 µm thick Ag film onto the surface thereof by an electron beam evaporation method.

Thus, there were obtained a plurality of solar cell modules respectively of the pin junction type.

For each of the resultant nodules, the photovoltaic characteristics were evaluated under irradiation of AM 1.5 light (100 mW/cm$^2$). As a result, every module exhibited a photoelectric conversion efficiency of more than 8.7%. As for each of the modules, the unevenness with respect to the characteristics among the modules was within 3.9%.

Further, each of the modules was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.0%.

Further in addition, as for each module, the rate of occurrence of pinholes was examined by a conventional method. As a result, said rate of any of the modules was sight.

The modules were properly combined to obtain a power supply system. It was found that the resultant system outputs a power of about 3 KW.

PRODUCTION EXAMPLE 9

There was prepared a pin junction photovoltaic element of the configuration shown in FIG. 8(a) by repeating the procedures of Production Example 8, except that in stead of the a-Si:H:F film as the i-type semiconductor layer, there was formed a non-doped a-SiGe:H:F film in the same manner as in Production Example 8 under the conditions shown in Table 9 while applying a bias voltage of 190 V (500 Hz) into the film-forming space of the isolated vessel 300, wherein the substrate web was maintained at 200° C. and the substrate web was moved at a transportation speed of 52 cm/min.

The resultant was processed in the same manner as in Production Example 8 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 7.7%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.3%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 10

There was prepared a pin junction photovoltaic element of the configuration shown in FIG. 8(a) by repeating the procedures of Production Example 8, except that in stead of the a-Si:H:F film as the i-type semiconductor layer, there was formed a non-doped a-SiC:H:F film in the same manner as in Production Example 8 under the conditions shown in Table 10 while applying a bias voltage of 195 V (500 Hz) into the film-forming space of the isolated vessel 300, wherein the substrate web was maintained at 200° C. and the substrate web was moved at a transportation speed of 50 cm/min.

The resultant was processed in the same manner as in Production Example 8 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 6.8%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.3%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 11

There was prepared a photovoltaic element of the configuration shown in FIG. 8(c), using a modification of the MW-PCVD apparatus used in Production Example 5 wherein the gas feed pipe in each of the isolated vessels is designed such that it functions also as a bias voltage applying means as described in Apparatus Embodiment 1.

As the substrate web 101, there was used a substrate web made of SUS 430 BA of the same kind as that used in Production Example 1.

Firstly, the substrate web was applied with a 1.2 µm thick ZnO film as the lower electrode 802 to the surface thereof in the same manner as in Production Example 2.

Then, the substrate web was set to the foregoing modified six film-forming chambered MW-PCVD apparatus. The lower cell 811 was formed using the first unit comprising the isolated vessels 300a, 300 and 300b in the same manner as in Production Example 3 and under the conditions shown in Table 11 while applying a DC bias voltage of 70 V/6 A into the film-forming space of the isolated vessel 300a, a DC bias voltage of 50 V/6.5 A into the film-forming space of the isolated vessel 300, and a DC bias voltage of 100 V/7.2 A into the film-forming space of the isolated vessel 300b; and the upper cell 812 was formed using the second unit comprising the isolated vessels 300a', 300' and 300b' in the same manner as in Production Example 2 under the conditions shown in Table 11 while applying a DC bias voltage of 70 V/6 A into the film-forming space of the isolated vessel 300a', a square-wave AC of 170 Vp-p (500 Hz) into the film-forming space of the isolated vessel 300', and a DC bias voltage of 100 V/7.0 A into the film-forming space of the isolated vessel 300b'.

The resultant was applied with a ITO thin film as the transparent electrode 806 to the surface of the top layer thereof in the same manner as in Production Example 2.

The product thus obtained was cut off to obtain a plurality of specimens respectively of 35 cm×70 cm in size.

Each of the specimens was applied with a comb shaped Ag film as the collecting electrode 807 to the surface of the ITO film as the transparent electrode 806 in the same manner as in Production Example 2.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 10.7%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.0%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 12

There was prepared a photovoltaic element of the configuration shown in FIG. 8(c), using the same six film-forming chambered MW-PCVD apparatus as used in Production Example 11.

As the substrate web 101, there was used a substrate web made of SUS 430 BA of the same kind as that used in Production Example 1.

Firstly, the substrate web was applied with a 1.2 µm thick ZnO film as the lower electrode 1202 to the surface thereof in the same manner as in Production Example 2.

Then, the substrate web was set to the six film-forming chambered MW-PCVD apparatus. The lower cell 811 was formed using the first unit comprising the isolated vessels 300a, 300 and 300b in the same manner as in Production Example 2 and under the conditions shown in Table 12 while applying a DC bias voltage of 70 V/6 A into the film-forming space of the isolated vessel 300a, a DC bias voltage of 50 V/6.5 A into the film-forming space of the isolated vessel 300, and a DC bias voltage of 100 V/7.0 A into the film-forming space of the isolated vessel 300b; and the upper cell 812 was formed using the second unit comprising the isolated vessels 300a', 300' and 300b' in the same manner as in Production Example 4 under the conditions shown in Table 12 while applying a DC bias voltage of 70 V/5 A into the film-forming space of the isolated vessel 300a', a pulse-wave Ac of 165 Vp-p (500 Hz; reference voltage: −20 V) into the film-forming space of the isolated vessel 300', and a DC bias voltage of 100 V/7.0 A into the film-forming space of the isolated vessel 300b'.

The resultant was applied with a ITO thin film as the transparent electrode 806 to the surface of the top layer thereof in the same manner as in Production Example 2.

The product thus obtained was cut off to obtain a plurality of specimens respectively of 35 cm×70 cm in size.

Thus, there were obtained a plurality of solar cell modules respectively of the pin Junction type.

For each of them, the photovoltaic characteristics were evaluated under irradiation of AM 1.5 light (100 mW/cm$^2$). As a result, every module exhibited a photoelectric conversion efficiency of more than 10.5%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.2%.

As for each of the modules, the rate of occurrence of pinholes was examined. As a result, said rate was slight for any of them.

These modules were properly combined to obtain a power supply system. It was found that the resultant system outputs a power of about 3 KW.

PRODUCTION EXAMPLE 13

There was prepared a triple cell type photovoltaic element of the configuration shown in FIG. 8(d), using a modification of the MW-PCVD apparatus used in Production Example 7, wherein the gas feed pipe in each of the isolated vessels is designed such that it functions also as a bias voltage applying means as described in Apparatus Embodiment 1.

As the substrate web 101, there was used a substrate web made of SUS 430 BA of the same kind as that used in Production Example 1.

Firstly, the substrate web was applied with a 1.2 µm thick ZnO film as the lower electrode 802 to the surface thereof in the same manner as in Production Example 2.

Then, the substrate web was set to the foregoing modified nine film-forming chambered MW-PCVD apparatus. The lower cell 820 was formed using the first unit comprising the isolated vessels 300a, 300 and 300b in the same manner as in Production Example 3 and under the conditions shown in Table 13 while applying a pulse-wave AC of 180 Vp-p (1 MHz; reference voltage: −200 V) into the film-forming space of the isolated vessel 300a, a DC bias voltage of 50 V/6.0 A into the film-forming space of the isolated vessel 300, and a DC bias voltage of 110 V/7.0 A into the film-forming space of the isolated vessel 300b. The middle cell 821 was formed using the second unit comprising the isolated vessels 300a', 300' and 300b' in the same manner as in Film Production Example 2 under the conditions shown in Table 13 while applying a pulse-wave AC of 180 Vp-p (1 MHz; reference voltage: −200 V) into the film-forming space of the isolated vessel 300a', a DC bias voltage of 80 V/6.8 A into the film-forming space of the isolated vessel 300', and a sine-wave AC of 160 Vp-p (1 MHz) into the film-forming space of the isolated vessel 300b'. And the upper cell 822 was formed using the third unit comprising the isolated vessels 300a", 300" and 300b" in the same manner as in Production Example 4 and under the conditions shown in Table 13 while applying a DC voltage of 65 V/5.0 A into the film-forming space of the isolated vessel 300a", a square-wave AC of 190 Vp-p (1.5 KHz) into the film-forming space of the isolated vessel 300", and a pulse-wave AC of 140 Vp-p (500 Hz; reference voltage: 0 V) into the film-forming space of the isolated vessel 300b".

The resultant was applied with a ITO thin film as the transparent electrode 806 to the surface of the top layer thereof in the same manner as in Production Example 2.

The product thus obtained was cut off to obtain a plurality of specimens respectively of 35 cm×70 cm in size.

Each of the specimens was applied with a comb shaped Ag film as the collecting electrode 807 to the surface of the ITO film as the transparent electrode 806 in the same manner as in Film Formation Example 2.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 10.7%. The unevenness with respect to the characteristics among the modules was within 4%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 7.8%.

As for each of the modules, the rate of occurrence of pinholes was examined. As a result, said rate was slight for any of them.

These modules were properly combined to obtain a power supply system. It was found that the resultant system outputs a power of about 3 KW.

TABLE 3-continued

| | |
|---|---|
| microwave propagating waveguide | EIAJ, WRI-26 |

TABLE 4

| $\epsilon \times \tan \delta$ | with no second region | $8 \times 10^{-3}$ | $1 \times 10^{-2}$ | $1.5 \times 10^{-2}$ | $2 \times 10^{-2}$ | $2.5 \times 10^{-2}$ | $5 \times 10^{-2}$ | $1 \times 10^{-1}$ | $5 \times 10^{-1}$ |
|---|---|---|---|---|---|---|---|---|---|
| discharge stability | Δ | ⊙ | ⊙ | ⊙ | ⊙ | ○ | ○ | Δ | Δ |
| electric characteristics | 100 | 131 | 123 | 125 | 120 | 105 | 103 | 104 | 102 |
| evenness in the electric characteristics | | A | A | A | A | A | B | C | D |

TABLE 1

| | |
|---|---|
| raw material gas and its flow rate | SiH$_4$:150 sccm |
| microwave frequency and microwave power | 2.45 GHz |
| spacing L | 3.0 cm |
| inside diameter and width of curved portion | φ35 cm 60 cm |
| inner pressure of the film-forming chamber | 3 mTorr |
| the kind of the substrate web and its thickness | SUS 430 BA 0.20 mm |
| the size of microwave applicator (inside diameter × length) | φ98 mm × 150 mm |
| microwave propagating waveguide | EIAJ, WRI-26 |

TABLE 2

| the distance of the microwave, applicator to have been plunged into the film-forming space (cm) | 0 | 1 | 2 | 3 | 5 | 10 |
|---|---|---|---|---|---|---|
| power applied at the time of starting discharge (w) | 700 × 2 | 500 × 2 | 470 × 2 | 450 × 2 | 450 × 2 | 450 × 2 |

TABLE 3

| | |
|---|---|
| raw material gas and its flow rate | SiH$_4$:100 sccm H$_2$:100 sccm |
| microwave frequency and microwave power | 2.45 GHz 1000 W × 2 |
| spacing L | 3.5 cm |
| inside diameter and width of curved portion | φ35 cm 60 cm |
| inner pressure of the film-forming chamber | 1 mTorr |
| the kind of the substrate web and its thickness | SUS 430 BA, PET 0.25 mm |
| the size of microwave applicator (inside diameter × length) | φ98 mm × 150 mm |

TABLE 5

| thickness of the second region (mm) | defect | H content in the film |
|---|---|---|
| 0.01 | 7 | 2.2 |
| 0.03 | 5 | 2.0 |
| 0.05 | 2 | 2.1 |
| 0.08 | 2 | 1.7 |
| 0.1 | 0 | 1.5 |
| 0.5 | 0 | 1.9 |
| 1.0 | 0 | 2.0 |
| 3.0 | 0 | 2.1 |
| 5.0 | 0 | 1.8 |
| 8.0 | 0 | 2.2 |
| 10.0 | 0 | 2.0 |
| 13.0 | 2 | 2.5 |
| 15.0 | 3 | 2.9 |
| 20.0 | 3 | 3.5 |
| 23.0 | 5 | 4.3 |
| 25.0 | 5 | 5.0 |
| 28 | 10 | 13.9 |
| 30 | 13 | 21.3 |
| 40 | 20 | 27.6 |
| 50 | 20 | 31.5 |

TABLE 6

| | |
|---|---|
| inside diameter of curved portion | φ30 cm |
| spacing L | 4.5 cm |
| the size of microwave applicator (inside diameter × length) | φ98 mm × 135 mm |
| microwave propagating waveguide | EIAJ, WRI-32 |

TABLE 7

| | |
|---|---|
| isolated vessel parameter | 300 |
| film-forming raw material gas and its flow rate (sccm) | SiH$_4$:240 H$_2$:150 SiF$_4$:8 |
| inner pressure (mTorr) | 4 |
| microwave power (kW) | 0.75 × 2 |
| inside diameter of curved portion (cm) | φ20 |
| spacing L (cm) | 3.2 |
| the size of microwave applicator (inside diameter × length) | φ98 mm 135 mm |
| microwave propagating waveguide | EIAJ, WRI-26 |
| surface temperature of the substrate web (°C.) | 210 |

TABLE 8

| isolated vessel parameter | 300-a | 300-b |
|---|---|---|
| film-forming raw material gas and its flow rate (sccm) | SiH$_4$ 25<br>H$_2$ 100<br>PH$_3$/H$_2$ 5<br>(diluted to 1% by H$_2$ gas)<br>SiF$_4$ 5 | SiH$_4$ 20<br>H$_2$ 300<br>B$_2$H$_6$/H$_2$ 20<br>(diluted to 3000 ppm by H$_2$ gas)<br>SiF$_4$ 3 |
| inner pressure (mTorr) | 9 | 6 |
| microwave power (kW) | 0.55 × 2 | 0.90 × 2 |
| inside diameter of curved portion (cm) | φ10 *⁾ | φ9 *⁾ |
| spacing L (cm) | 1.0 | 1.2 |
| the size of microwave applicator (inside diameter × length) | φ95 mm × 125 mm | φ85 mm × 120 mm |
| microwave propagating waveguide | EIAJ, WRI-26 | EIAJ, WRI-26 |
| surface temperature of the substrate web (°C.) | 210 | 200 |

*⁾ a substrate cover for finely controlling the thickness of a film to be formed was provided in the curved structure.

TABLE 9

| isolated vessel parameter | 300 |
|---|---|
| film-forming raw material gas and its flow rate (sccm) | SiH$_4$:80<br>H$_2$:120 |

TABLE 9-continued

| isolated vessel parameter | 300 |
|---|---|
|  | GeH$_4$:60<br>SiF$_4$:2 |
| inner pressure (mTorr) | 6 |
| microwave power (kW) | 0.55 × 2 |
| inside diameter of curved portion (cm) | φ20 |
| spacing L (cm) | 3.2 |
| the size of microwave applicator (inside diameter × length) | φ98 mm 135 mm |
| microwave propagating waveguide | EIAJ, WRI-26 |
| surface temperature of the substrate web (°C.) | 200 |

TABLE 10

| isolated vessel parameter | 300 |
|---|---|
| film-forming raw material gas and its flow rate (sccm) | SiH$_4$:150<br>H$_2$:500<br>CH$_4$:15<br>SiF$_4$:5 |
| inner pressure (mTorr) | 3 |
| microwave power (kW) | 1.5 × 2 |
| inside diameter of curved portion (cm) | φ20 |
| spacing L (cm) | 3.2 |
| the size of microwave applicator (inside diameter × length) | φ98 mm 135 mm |
| microwave propagating waveguide | EIAJ, WRI-26 |
| surface temperature of the substrate web (°C.) | 200 |

TABLE 11

| | semiconductor layer Lower Cell | | |
|---|---|---|---|
| parameter | 300-a | 300 | 300-b |
| film-forming raw material gas and its flow rate (sccm) | SiH$_4$ 25<br>H$_2$ 100<br>PH$_3$/H$_2$ 5<br>(diluted to 1% by H$_2$ gas)<br>SiF$_4$ 3 | SiH$_4$ 90<br>GeH$_4$ 70<br>H$_2$ 150<br>SiF$_4$ 3 | SiH$_4$ 20<br>H$_2$ 300<br>BF$_3$/H$_2$ 20<br>(diluted to 3000 ppm by H$_2$ gas)<br>SiF$_4$ 3 |
| inner pressure (mTorr) | 9 | 10 | 6 |
| microwave power (kW) | 0.55 × 2 | 0.65 × 2 | 0.90 × 2 |
| inside diameter of curved portion (cm) | φ10*⁾ | φ20 | φ9*⁾ |
| spacing L (cm) | 1.0 | 3.2 | 1.2 |
| the size of microwave applicator (inside diameter × length) | φ95 mm × 125 mm | φ98 mm × 135 mm | φ85 mm × 120 mm |
| microwave propagating waveguide | EIAJ WRI-26 | EIAJ WRI-26 | EIAJ WRI-26 |
| surface temperature of the substrate web (°C.) | 260 | 250 | 240 |
| transportation speed | | 55 cm/min | |
| | semiconductor layer Upper Cell | | |
| parameter | 300-a' | 300' | 300-b' |
| film-forming raw material gas and its flow rate | SiH$_4$ 23<br>H$_2$ 90<br>PH$_3$/H$_2$ 3 | SiH$_4$ 220<br>H$_2$ 150<br>SiF$_4$ 7 | SiH$_4$ 18<br>H$_2$ 300<br>BF$_3$/H$_2$ 17 |

TABLE 11-continued

| | | | |
|---|---|---|---|
| (sccm) | (diluted to 1% by H$_2$ gas) SiF$_4$ 3 | | (diluted to 3000 ppm by H$_2$ gas) SiF$_4$ 2 |
| inner Pressure (mTorr) | 9 | 4 | 6 |
| microwave power (kW) | 0.55 × 2 | 0.75 × 2 | 0.90 × 2 |
| inside diameter of curved portion (cm) | φ10*⁾ | φ20 | φ9*⁾ |
| spacing L (cm) | 1.0 | 3.2 | 1.2 |
| the size of microwave applicator (inside diameter × length) | same as in the case of the 300-a | same as in the case of the 300 | same as in the case of the 300-b |
| microwave propagating waveguide | EIAJ WRI-26 | EIAJ WRI-26 | EIAJ WRI-26 |
| surface temperature of the substrate web (°C.) | 240 | 230 | 230 |
| transportation speed | | 55 cm/min | |

*⁾a substrate cover for finely controlling the thickness of a film to be formed was provided in the curved structure.

TABLE 12

| | semiconductor layer Lower Cell | | |
|---|---|---|---|
| parameter | 300-a | 300 | 300-b |
| film-forming raw material gas and its flow rate (sccm) | SiH$_4$ 25 H$_2$ 100 PH$_3$/H$_2$ 5 (diluted to 1% by H$_2$ gas) SiF$_4$ 5 | SiH$_4$ 280 H$_2$ 200 SiF$_4$ 10 | SiH$_4$ 20 H$_2$ 300 BF$_3$/H$_2$ 20 (diluted to 3000 ppm by H$_2$ gas) SiF$_4$ 3 |
| inner pressure (mTorr) | 9 | 10 | 6 |
| microwave power (kW) | 0.55 × 2 | 0.85 × 2 | 0.90 × 2 |
| inside diameter of curved portion (cm) | φ10*⁾ | φ20 | φ9*⁾ |
| spacing L (cm) | 1.0 | 3.2 | 1.2 |
| the size of microwave applicator (inside diameter × length) | φ95 mm × 125 mm | φ98 mm × 135 mm | φ85 mm × 120 mm |
| microwave propagating waveguide | EIAJ WRI-26 | EIAJ WRI-26 | EIAJ WRI-26 |
| surface temperature of the substrate web (°C.) | 260 | 250 | 240 |
| transportation speed | | 52 cm/min | |

| | semiconductor layer Upper Cell | | |
|---|---|---|---|
| parameter | 300-a' | 300' | 300-b' |
| film-forming raw material gas and its flow rate (sccm) | SiH$_4$ 23 H$_2$ 90 PH$_3$/H$_2$ 3 (diluted to 1% by H$_2$ gas) SiF$_4$ 3 | SiH$_4$ 180 CH$_4$ 20 H$_2$ 600 SiF$_4$ 7 | SiH$_4$ 18 H$_2$ 300 BF$_3$/H$_2$ 17 (diluted to 3000 ppm by H$_2$ gas) SiF$_4$ 2 |
| inner pressure (mTorr) | 9 | 5 | 6 |
| microwave power (kW) | 0.55 × 2 | 1.8 × 2 | 0.90 × 2 |
| inside diameter of curved portion (cm) | φ10*⁾ | φ20 | φ9*⁾ |
| spacing L (cm) | 1.0 | 3.2 | 1.2 |
| the size of microwave applicator (inside diameter × length) | same as in the case of the 300-a | same as in the case of the 300 | same as in the case of the 300-b |
| microwave propagating waveguide | EIAJ WRI-26 | EIAJ WRI-26 | EIAJ WRI-26 |
| surface temperature of the substrate web (°C.) | 250 | 250 | 240 |
| transportation speed | | 52 cm/min | |

TABLE 12-continued

*a substrate cover for finely controlling the thickness of a film to be formed was provided in the curved structure.

TABLE 13

| | semiconductor layer Lower Cell | | |
|---|---|---|---|
| parameter | 300-a | 300 | 300-b |
| film-forming raw material gas and its flow rate (sccm) | SiH$_4$ 25<br>H$_2$ 100<br>PH$_3$/H$_2$ 5<br>(diluted to 1% by H$_2$ gas)<br>SiF$_4$ 5 | SiH$_4$ 110<br>GeH$_4$ 80<br>H$_2$ 180<br>SiF$_4$ 5 | SiH$_4$ 20<br>H$_2$ 300<br>BF$_3$/H$_2$ 20<br>(diluted to 3000 ppm H$_2$ gas)<br>SiF$_4$ 3 |
| inner pressure (mTorr) | 9 | 12 | 6 |
| microwave power (kW) | 0.55 × 2 | 0.75 × 2 | 0.90 × 2 |
| inside diameter of curved portion (cm) | φ10*⁾ | φ22 | φ9*⁾ |
| spacing L (cm) | 1.0 | 3.5 | 1.2 |
| the size of microwave applicator (inside diameter × length) | φ95 mm × 125 mm | φ98 mm × 135 mm | φ85 mm × 120 mm |
| microwave propagating waveguide | EIAJ WRI-26 | EIAJ WRI-32 | EIAJ WRI-26 |
| surface temperature of the substrate web (°C.) | 280 | 280 | 270 |
| transportation speed | | 54 cm/min | |

| | semiconductor layer Middle Cell | | |
|---|---|---|---|
| parameter | 300-a' | 300' | 300-b' |
| film-forming raw material gas and its flow rate (sccm) | SiH$_4$ 23<br>H$_2$ 90<br>PH$_3$/H$_2$ 3<br>(diluted to 1% by H$_2$ gas)<br>SiF$_4$ 3 | SiH$_4$ 250<br>H$_2$ 180<br>SiF$_4$ 8 | SiH$_4$ 18<br>H$_2$ 290<br>BF$_3$/H$_2$ 17<br>(diluted to 3000 ppm H$_2$ gas)<br>SiF$_4$ 3 |
| inner pressure (mTorr) | 8 | 6 | |
| microwave power (kW) | 0.55 × 2 | 0.8 × 2 | 0.9 × 2 |
| inside diameter of curved portion (cm) | φ10*⁾ | φ20 | φ9*⁾ |
| spacing L (cm) | 1.0 | 3.5 | 1.0 |
| the size of microwave applicator (inside diameter × length) | same as in the case of the 300-a | same as in the case of the 300 | same as in the case of the 300-b |
| microwave propagating waveguide | EIAJ WRI-26 | EIAJ WRI-32 | EIAJ WRI-26 |
| surface temperature of the substrate web (°C.) | 270 | 260 | 260 |
| transportation speed | | 54 cm/min | |

| | semiconductor layer Upper Cell | | |
|---|---|---|---|
| parameter | 300-a" | 300" | 300-b" |
| film-forming raw material gas and its flow rate (sccm) | SiH$_4$ 21<br>H$_2$ 85<br>PH$_3$/H$_2$ 2<br>(diluted to 1% by H$_2$ gas)<br>SiF$_4$ 2 | SiH$_4$ 200<br>CH$_4$ 25<br>H$_2$ 800<br>SiF$_4$ 9 | SiH$_4$ 15<br>H$_2$ 280<br>BF$_3$/H$_2$ 14<br>(diluted to 3000 ppm H$_2$ gas)<br>SiF$_4$ 2 |
| inner pressure (mTorr) | 8 | 3 | 5 |
| microwave power (kW) | 0.5 × 2 | 2.0 × 2 | 0.85 × 2 |
| inside diameter of curved portion (cm) | φ10*⁾ | φ18 | φ9*⁾ |
| spacing L (cm) | 1.0 | 3.2 | 1.2 |
| the size of microwave applicator (inside diameter × | same as in the case of the 300-a | same as in the case of the 300 | same as in the case of the 300-b |

TABLE 13-continued

| length) | | | |
|---|---|---|---|
| microwave propagating waveguide | EIAJ WRI-26 | EIAJ WRI-26 | EIAJ WRI-26 |
| surface temperature of the substrate web (°C.) | 250 | 250 | 240 |
| transportation speed | | 54 cm/min | |

*a substrate cover for finely controlling the thickness of a film to be formed was provided in the curved structure.

What we claim is:

1. An apparatus for continuously forming a functional deposited film on a continuously moving web member by a microwave plasma CVD process, said apparatus comprising:

a substantially enclosed columnar film-forming chamber having two opposed side faces and a curved circumferential wall formed by curving and projecting said web member as said web member is moved in a longitudinal direction by a curved portion-forming means, said film-forming chamber having a film-forming space defined by the curved moving web member constituting said circumferential wall in which a plasma is generated;

at least one microwave applicator means capable of radiating microwave energy in the microwave propagation direction, said microwave applicator means being mounted to said film-forming chamber through one of the two side faces thereof such that a part of said microwave applicator means is plunged into said film-forming space, at least said part of the microwave applicator means having a two-layered member on the exterior thereof, said two-layered member comprising a metal member and a dielectric member laminated to the metal member such that the dielectric member is exposed to the film forming space wherein said dielectric member comprises a dielectric material having a value of $2 \times 10^{-2}$ or less in the product of the dielectric constant ($\epsilon$) and the dielectric dissipation factor (tan $\delta$) with respect to the frequency of microwave used;

means for evacuating said film-forming chamber;

means for introducing a film-forming raw material gas into said film-forming chamber; and a temperature controlling means capable of heating and/or cooling said web member.

2. The apparatus according to claim 1, wherein the two-layered member is of 0.05 to 25 mm in thickness.

3. The apparatus according to claim 1, wherein the two-layered member has an uneven surface satisfying the ten points-average roughness Rz=1 to 100 μm.

4. The apparatus according to claim 1, wherein the two-layered member is composed of a material selected from the group of ceramics containing alumina as a main constituent.

5. The apparatus according to claim 1, wherein the curved portion-forming means comprises at least one pair of a curving initiation end forming means and a curving termination end forming means wherein said curving initiation end forming means and said curving termination end forming means are arranged such that a spacing is provided been said curving initiation end forming means and said curving termination end forming means in the longitudinal direction of the web member to be moved.

6. The apparatus according to claim 1, wherein the curved portion-forming means comprises a pair of supporting and transporting rollers and a pair of supporting and transporting rings wherein said pair of supporting and transporting rollers are arranged in parallel with each other while leaving a spacing in the longitudinal direction of the web member to be moved.

7. The apparatus according to claim 1 said at least one microwave applicator means includes a pair of microwave applicator means, one of said microwave applicator means being mounted to the film-forming chamber through one of the two side faces thereof such that part of said one of said microwave applicator means is plunged into the film-forming space and the other microwave applicator means being mounted to the film-forming chamber through the other side face thereof such that a part of said other microwave applicator means is plunged into the film-forming space.

8. The apparatus according to claim 7, wherein the pair of microwave applicator means are arranged in a direction perpendicular to the corresponding side faces of the film-forming chamber.

9. The apparatus according to claim 1, wherein a microwave transmissive member is disposed at a tip portion of the microwave applicator means, said microwave transmissive member being capable of transmitting microwave energy radiated from the microwave applicator means into the film-forming space.

10. The apparatus according to claim 7, wherein each of the microwave applicator means includes a waveguide capable of transmitting a microwave energy from a microwave power source, said waveguide comprising a rectangular waveguide or an elliptic waveguide.

11. The apparatus according to claim 10, wherein the pair of microwave applicator means are arranged so as to be opposite to each other in the film-forming space.

12. The apparatus according to claim 11, wherein the pair of microwave applicator means and their respective waveguides are disposed along a common central axis, and wherein sidewalls of one waveguide are rotationally offset from corresponding sidewalls of the other waveguide.

13. The apparatus according to claim 11, wherein the curved portion-forming means comprises a pair of supporting and transporting rollers and a pair of supporting and transporting rings, said pair of supporting and transporting rollers being arranged in parallel with each other while leaving a spacing in the longitudinal direction of the web member to be moved, and the pair of microwave applicator means and their respective waveguides are disposed along a common central longitudinal axis, and wherein sidewalls of one waveguide are rotationally offset from corresponding sidewalls of the other waveguide such that they are disposed along a common central longitudinal axis and side faces of said one applicator means are not parallel to corresponding faces of the other applicator means.

14. An apparatus for continuously forming a functional deposited film on a continuously moving web member by a microwave plasma CVD process, said apparatus comprising:

a substantially enclosed columnar film-forming chamber having two opposed side faces and a curved circumferential wall formed by curving and projecting said web member as said web member is moved in a longitudinal direction by a curved portion-forming means, said film-forming chamber having a film-forming space defined by the curved moving web member constituting said circumferential wall in which a plasma is generated;

at least one microwave applicator means capable of radiating microwave energy in the microwave propagation direction, said microwave applicator means being mounted to said film-forming chamber through one of two side faces thereof such that a part of said microwave applicator means is plunged into said film-forming space, at least said part of the microwave applicator means having a two-layered member on the exterior thereof, said two layered member comprising a metal member and a dielectric member laminated to the metal member such that the dielectric layer is exposed to the film forming space wherein the dielectric member comprises a dielectric material having a value of 2×10 or less in the product of the dielectric constant ($\epsilon$) and the dielectric dissipation factor (tan $\delta$) with respect to the frequency of microwave used;

a bias voltage applying means capable of applying a bias voltage to control the potential of said plasma generated in said film-forming space;

means for evacuating said film-forming chamber;

means for introducing a film-forming raw material gas into said film-forming chamber; and a temperature controlling means capable of heating and/or cooling said web member.

15. The apparatus according to claim 14, wherein the two-layered material is of 0.05 to 25 mm in thickness.

16. The apparatus according to claim 14, wherein the two-layered material has an uneven surface satisfying the ten points-average roughness Rz=1 to 100 μm.

17. The apparatus according to claim 14, wherein the dielectric member of the two-layered member is composed of a material selected from the group of ceramics containing alumina as a main constituent.

18. The apparatus according to claim 14, wherein the curved portion-forming means comprises at least one pair of a curving initiation end forming means and a curving termination end forming means wherein said curving initiation end forming means and said curving termination end forming means are arranged such that a spacing is provided between said curving initiation end forming means and said curving termination end forming means in the longitudinal direction of the web member to be moved.

19. The apparatus according to claim 14, wherein the curved portion-forming means comprises a pair of supporting and transporting rollers and a pair of supporting and transporting rings wherein said pair of supporting and transporting rollers are arranged in parallel with each other while leaving a spacing between the supporting and transporting rollers in the longitudinal direction of the web member to be moved.

20. The apparatus according to claim 14 wherein said at least one microwave applicator means includes a pair of microwave applicator means, one of said microwave applicator means being mounted to the film-forming chamber through one of the two side faces thereof such that part of said one of said microwave applicator means is plunged into the film-forming space and the other microwave applicator means being mounted to the film-forming chamber through the other side face thereof such that part of said other microwave applicator means is plunged into the film-forming space.

21. The apparatus according to claim 20, wherein the pair of microwave applicator means is arranged in a direction perpendicular to the corresponding side faces of the film-forming chamber.

22. The apparatus according to claim 14, wherein a microwave transmissive member is disposed at a tip portion of the microwave applicator means, said microwave transmissive member being capable of transmitting microwave energy radiated from the microwave applicator means into the film-forming space.

23. The apparatus according to claim 20, wherein each of the microwave applicator means includes a waveguide capable of transmitting microwave energy from a microwave power source, said waveguide comprising a rectangular waveguide or an elliptic waveguide.

24. The apparatus according to claim 23, wherein the pair of microwave applicator means are arranged so as to be opposite to each other in the film-forming space.

25. The apparatus according to claim 24, wherein the pair of microwave applicator means and their respective waveguides are disposed along a common central longitudinal axis, and wherein sidewalls of one waveguide are rotationally offset from corresponding sidewalls of the other waveguide.

26. An apparatus for continuously forming a functional deposited film on a continuously moving web member by a microwave plasma CVD process, said apparatus comprising:

(a) a first vacuum chamber;

(b) a second vacuum chamber having a film-forming space disposed in said first vacuum chamber, said second vacuum chamber having a wall defined by said web member, said second vacuum chamber being provided with means for supporting and conveying said web member to form said wall, said means for supporting and conveying being capable of continuously moving said web member in a lengthwise direction of said web member;

(c) at least one microwave applicator means for introducing microwave energy into said second vacuum chamber to generate a plasma in said second vacuum chamber, said microwave applicator means being mounted to said second vacuum chamber through one of two opposed side faces thereof such that a part of said microwave applicator means is plunged into said second vacuum chamber, at least said part of the microwave applicator means having a two-layered material on the exterior thereof, said two-layered material comprising a metal member and a dielectric member laminated to the metal member such that the dielectric member is exposed to the film forming space of said second vacuum chamber wherein said dielectric member is comprised of a dielectric material having a value of $2\times10^{-2}$ or less in the product of a dielectric constant ($\epsilon$) and a dielectric dissipation factor (tan $\delta$) with respect to the frequency of microwave used;

(d) means for evacuating said first vacuum chamber and said second vacuum chamber;

(e) means for introducing a film-forming raw material gas into said second vacuum chamber; and (f) a temperature controlling means capable of heating and/or cooling said web member.

27. The apparatus according to claim 26, wherein the two-layered material is of 0.05 to 25 mm in thickness.

28. The apparatus according to claim 26, wherein the two-layered material has an uneven surface satisfying the ten points-average roughness Rz=1 to 100 μm.

29. The apparatus according to claim 26, wherein the dielectric member of the two-layered material is composed of a material selected from the group of ceramics containing alumina as a main constituent.

30. The apparatus according to claim 26, wherein a microwave transmissive member is disposed at a tip portion of the microwave applicator means, said microwave transmissive member being capable of transmitting microwave energy radiated from the microwave applicator means into the film-forming space of the second vacuum chamber.

* * * * *

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

ON THE TITLE PAGE
Item
[57] Abstract

Line 12, "circumferential" should read --circumferential wall--

Line 14, "direction of microwave to propagate," should read --microwave propagation direction,-;

Line 26, "means." Should read --means for heating and/or cooling said web member--.

COLUMN 1

Lines 33-34, "direction of microwave to propagate," should read --microwave propagation direction,--;

Line 41, "2x10" should read --$2 \times 10^{-2}$--;

Line 55, "on" should read --in--;

Line 58, "that" should read --that have--, and "to newly establish" should read --newly establishing--.

COLUMN 2

Line 4, "the" (second occurrence)" should be deleted;

Line 21, "the" should be deleted;

Line 25, "the" (second occurrence) should be deleted.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 2

Line 47, "the" should be deleted;
Line 51, "as" should read --as a--;
Line 63, "are occurred." should read --occurs.--;
Line 66, "necessary" should read --necessarily--.

COLUMN 3

Line 1, "so as" should be deleted;
Line 4, "view point" should read --viewpoint--;
Line 7, "the" (both occurrences) should be deleted;
Line 9, "characteristics-" should read --characteristics.--;
Line 24, "cased" should read --caused--.
Line 32, "that" should read --wherein--;
Line 36, "the" (first occurrence) should be deleted;
Line 53, "other" should read --another--;
Line 61, "junctions" should read --junctions in--.

COLUMN 4

Line 44, "the" should be deleted;
Line 50, "that it is" should read --making it--;
Line 67, "over" should read --over a--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 6

Line 28, "necessary" should read --necessarily--;
Line 30, "necessary" should read --necessarily--;
Line 31, "necessary" should read --necessarily--;
Line 35, "Further in" should read --In--;
Line 45, "be excelling" should read --excel--;
Line 53, "any" should read --neither--;
Line 54, "not" should be deleted;
Line 58, "what " should read --what is--;
Line 59, "know" should read --known--;
Line 64, "other" should be deleted.

COLUMN 7

Line 12, "Other" should read --Another--;
Line 15, "to continuously deposit" should read --continuously depositing--;
Line 63, "direction of microwave to propagate," should read --microwave propagation direction,--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 8

- Line 6, "other should read --another--;
- Line 40, "is desirably occurred" should read --desirably occurs--;
- Line 47, "along" should read --during--, and "occur' should read --incur--;
- Line 50, "into" should be deleted;
- Line 58, "to be" should be deleted.

COLUMN 9

- Line 11, "direction of microwave to propagate," should read --microwave propagation direction,--;
- Line 23, "chamber," should read --chamber;--;
- Line 26, "Other" should read --Another--;
- Line 41, "direction of microwave to propagate," should read --microwave propagation in direction,--;

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.                Page 5 of 24

It is certified that error appears in the above-identified patent and that said Letters Patent is hereby corrected as shown below:

COLUMN 9

Line 49,   "2x10" should read --$2 \times 10^{-2}$--;
Line 55,   "chamber," should read --chamber;--.

COLUMN 10

Line 2,    "film forming" should read --film-forming--;
Lines
 19-20     "direction of microwave to propagate," should read --microeave propagation direction,--;
Line 54,   "Further in" should read --In--.

COLUMN 11

Line 3,    "deteriorated" should read --deterioration--;
Line 49,   "in" should read --in a--.

COLUMN 12

Line 1,    "($\eta$)" should read --($\eta$),--;
Line 49,   "to" (second occurrence) should be deleted;

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 12

Line 51, "to" (first occurrence) should be deleted;
Line 52, "to be" should be deleted;
Line 67, "to be" should be deleted.

COLUMN 13

Line 2, "to generate." should read --generated.--;
Line 8, "space," should read --space, and--;
Line 23, "advantage," should read --disadvantage,--;
Line 27, "thicken" should read --thicker--;
Line 28, "proceeds;" should read --proceeds,--, and "effects to cause" should read --effect causing--;
Line 29, "for" should read --in--;
Line 30, "follows to influence to" should read --followingly influences--;
Line 33, "stress to remove" should read --stress, removing--;
Line 34, "scatter" should read --scattering--;
Line 54, "becomes" should read --comes--.

UNITED STATES PATENT AND TRADEMARK OFFICE
CERTIFICATE OF CORRECTION

PATENT NO. : 5,514,217
DATED : May 7, 1996
INVENTORS : HIROAKI NIINO ET AL.

It is certified that error appears in the above-identified patent and that said Letters Patent is hereby corrected as shown below:

COLUMN 14

| | |
|---|---|
| Line 10, | "a" should read --an--; |
| Line 45, | "made" should read --paid--; |
| Line 48, | "to expose" should read --to be exposed--; |
| Line 53, | "by" should read --of--; |
| Line 55, | "to govern" should read --governing--; |
| Line 59, | "to govern" should read --governing--. |

COLUMN 15

| | |
|---|---|
| Line 26, | "direction of microwave to propagate," should read --microwave propagation direction,--; |
| Line 59, | "direction of microwave to propagate," should read --microwave propagation direction,--. |

COLUMN 16

| | |
|---|---|
| Line 27, | "to" should read --in--; |
| Line 29, | "entire" should read --entirety--; |
| Line 30, | "the" (second occurrence) should be deleted; |
| Lines 55-56 | "direction of microwave to propagate," should read --microwave propagation direction,--; |
| Line 59, | "much" should be deleted. |

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 17

Line 21, "direction of microwave to propagate;" should read --microwave propagation direction;--;

Lines 58-59 "to thereby establish" should read --thereby establishing--;

Line 59, "be to" should read --to be---.

COLUMN 18

Line 22, "is" should be deleted;

Lines 47-48 "necessary to be made is" should read --necessarily to be taken in--.

COLUMN 19

Line 20, "constituding" should read --constituting--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 20

Line 4,  "opposited" should read --opposite--;
Line 28, "replaced" should read --replaced with--;
Line 51, "having" should read --had--;
Line 54, "termes" should read --terms--.

COLUMN 21

Line 14, "entire" should read --entirety--;
Line 18, "(tanδ)" should read --(tan δ)--;
Line 24, "(tanδ)" should read --(tan δ)--;
Line 32, "photoemmission" should read --photoemission--;
Line 35, "respect" should read --respect to--.

COLUMN 22

Line 9,  "wallLikewise," should read --wall, likewise,--;
Line 14, "Resuls" should read --Results--;

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

<u>COLUMN 22</u>

Line 22, "film" should read --film was--;
Line 28, "but" should read --but is--;
Line 29, "but" should read --but is--;
Line 53, "(tan$\delta$)" should read --(tan $\delta$),--;
Line 62, "being" should read --were--.

<u>COLUMN 23</u>

Line 3, "0.5 x 10" should read --0.5 x $10^{-2}$--;
Line 5, "(tan$\delta$)" should read --(tan $\delta$)--;
Line 62, "being" should read --were--.

<u>COLUMN 25</u>

Line 9, "is occcurred on" should read --occurs in--;
Line 22, "thickenes" should read --thickens--;
Line 24, "and" should be deleted, and "is occurred" should read --occurs--;
Line 34, "into" should be deleted;
Line 49, "makes" should read --causes--;
Line 57, "is not occurred" should read --does not occur--;
Lines 62-63 "Further in" should read --In--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 26

Line 1, "makes" should read --causes--;
Line 26, "(tanδ)" should read --(tan δ)--;
Line 30, "entire" should read --entirety--;
Line 45, "contiuously" should read --continuously formed.--.

COLUMN 28

Line 11, "what" should read --what is--;
Line 19, "(tanδ)" should read --(tan δ)--;
Line 22, "entire" should read --entirety--;
Line 60, "a" should read --an--;
Line 65, "other" should read --another--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 29

Line 5, "chamber." should read --chambers.--;
Line 66, "region" should read --regions--.

COLUMN 30

Line 6, "a" should be deleted;
Line 11, "made so" should read --taken--;
Line 30, "to" should be deleted.

COLUMN 31

Line 9, "ring" should read --rings--;
Line 10, "and" should be deleted;
Line 15, "necessary" should read --necessarily--;
Line 21, "the rotary" should read --rotary--;

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 31

Line 22, "one" should read --one of--, and "may" should read --may be--;
Line 25, "a" (first occurrence) should read --an--;
Line 29, "more" should read --more of--;

COLUMN 32

Line 32, "in" should read --in a--;
Line 51, "intermitently" should read --intermittently--;
Column 33, line 67, "be occurred" should read --occur--.

COLUMN 34

Line 23, "cause" should read --course--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 35

Line 16, "entire" should read --entirety--;
Line 31, "(tanδ)" should read --(tan δ)--;
Line 43, "To laminate" should read --Lamination of-- and "can" should read --can be--;
Line 44, "manner:" should read --manners:--;
Line 61, "cars on" should read --care of--.

COLUMN 36

Line 2, "100m" should read --100μm--;
Line 3, "To form" should read --Formation of--;
Line 20, "direction of microwave to propagate." should read --microwave propagation direction.--;
Line 22, "direction of microwave to propagate," should read --microwave propagation direction.--;
Line 25, "cares about" should read --care to--;
Line 45, "of" should be deleted ;
Line 47, "of" should read --for--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 37

Line 22,   "Further in" should read --In--;
   Line 39,   "necessary" should read --necessarily--;
   Line 51,   "axises" should read --axes--.

COLUMN 38

Line 11,   "in" should read --in the--;
   Line 24,   "a" should read --an--;
   Line 45,   "other" should read --another--;
   Line 56,   "106" should read --$10^6$--;

COLUMN 39

Line 24,   "other" should read --another--;
   Line 58,   "deliverying" should read --delivering--.

COLUMN 40

Line 32,   "welsion" should read --welding--;
   Line 37,   "aparted" should read --parted--;
   Line 65,   "out" should read --cut--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 41

Line 12, "welsion" should read --welding--;
Line 16, "aparted" should read --parted--;
Line 27, "to stably prepare" should read
 --stable preparation of--.

COLUMN 42

Line 5, "made so" should read --taken--;
Line 9, "necessary" should read --necessarily--;
Lines
 18-19 "forbitten" should read --forbidden--;
Line 20, "forbitten" should read --forbidden--.

COLUMN 43

Line 7, "apparted" should read --parted--;
Line 21, "apace" should read --space--;
Line 25, "apace" should read --space--;

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 43

Line 39, "other" should read --another--;
  Line 55, "while" should read --while,--.

COLUMN 44

Line 10, "be" should be deleted;
  Line 11, "followed." should read --follow.--.

COLUMN 45

Line 15, "gage" should read --gauge--;
  Line 61, "Apparatus." shoud read --Apparatus--.

COLUMN 47

Line 16, "i-typ" should read --i-type--;
  Line 29, "a" should read --a pair of--;

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 47

Line 50, "a" (second occurrence) should read --a pair of--;
   Line 51, "electrode" should read --electrodes--;
   Line 57, "Junction" should read --junction--;
   Line 65, "necessary" should read --necessarily--.

COLUMN 48

Line 1, "member" should read --members--;
   Line 4, "to mass-produce" should read --mass-producing--;
   Line 51, "shall be made" should read --should be taken--.

COLUMN 49

Line 8, "to" should be deleted;
   Line 50, "of" should be deleted.

UNITED STATES PATENT AND TRADEMARK OFFICE
CERTIFICATE OF CORRECTION

PATENT NO. : 5,514,217
DATED : May 7, 1996
INVENTORS : HIROAKI NIINO ET AL.

It is certified that error appears in the above-identified patent and that said Letters Patent is hereby corrected as shown below:

COLUMN 50

Line 9, "more in detail" should read --in more detail--;
Line 15, "PRODUCTION" should read --PRODUCTION EXAMPLE 1--;
Line 17, "Example 1" should be deleted.

COLUMN 51

Line 23, "later" should read --layer--;
Line 44, "Junction" should read --junction--.

COLUMN 52

Line 4, "a" should read --an--;
Line 17, "inferior" should read --inferior to--;
Line 34, "a" (second occurrence) should read --an--;
Line 38, "(99,999%)." should read --(99.999%).--
Line 62, "chamber" should read --chambers--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 53

Line 10, "lamined" should read --laminated--;
Line 16, "plurality" should read --plurality of--;
Line 27, "were" should read --was--;
Line 29, "applicator" should read --applicators--;
Line 47, "moduled." should read --modules.--;
Line 58, "Further in" should read --In--;

COLUMN 54

Line 9, "in stead" should read --instead--;
Line 44, "in stead" should read --instead--.

COLUMN 55

Line 19, "connected" should read --connected with--;
Line 36, "a" should read --an--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

<u>COLUMN 56</u>

Line 10,   "1202" should read --802--;
   Line 21,   "a" should read --an--;
   Line 59,   "connected" should read --connected with--.

<u>COLUMN 57</u>

Line 13,   "a" should read --an--;
   Line 58,   "a" should read --an--.

<u>COLUMN 58</u>

Line 38,   "lamined" should read --laminated--;
   Line 44,   "plurality" should read --plurality of--;
   Line 66,   "Further in" should read --In--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 59

Line 2,    "sight" should read --slight--;
   Line 12,   "in stead" should read --instead--;
   Line 49,   "in stead" should read --instead--.

COLUMN 60

Line 47,   "a" should read --an--.

COLUMN 61

Line 22,   "1202" should read --802--;
   Line 44,   "a" should read --an--;
   Line 50,   "Junction" should read --junction--.

COLUMN 62

Line 50,   "a" should read --an--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 63

Table 2
  Line 3,    "wave, appli-" should read --wave
             appli- --;

COLUMN 69

Table 13 Middle Cell
           "inner pressure (mTorr) 8  6" should
           read --inner pressure (mTorr) 8  6  5--;
   Table 13 Lower Cell
           "WR1-32" should read --ER1-32--;

Table 13, Middle Cell
           "WR1-32" should read --ER1-32--.

COLUMN 71

Line 62,   "been" should read --between--.

UNITED STATES PATENT AND TRADEMARK OFFICE
CERTIFICATE OF CORRECTION

PATENT NO. : 5,514,217

DATED : May 7, 1996

INVENTORS : HIROAKI NIINO ET AL.

It is certified that error appears in the above-identified patent and that said Letters Patent is hereby corrected as shown below:

COLUMN 72

Line 17, "claim 1" should read --claim 1, wherein--;
Line 25, "side" should be deleted.

COLUMN 73

Line 23, "2x10" should read --$2 \times 10^{-2}$--.

Signed and Sealed this

Third Day of December, 1996

Attest:

BRUCE LEHMAN

Attesting Officer

Commissioner of Patents and Trademarks